(12) United States Patent
Liu et al.

(10) Patent No.: US 11,984,489 B2
(45) Date of Patent: May 14, 2024

(54) AIR SPACER FOR A GATE STRUCTURE OF A TRANSISTOR

(71) Applicant: Taiwan Semiconductor Manufacturing Co., Ltd., Hsin-Chu (TW)

(72) Inventors: Yi-Hsiu Liu, Taipei (TW); Feng-Cheng Yang, Zhudong Township (TW); Tsung-Lin Lee, Hsinchu (TW); Wei-Yang Lee, Taipei (TW); Yen-Ming Chen, Chu-Pei (TW); Yen-Ting Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/991,560

(22) Filed: Nov. 21, 2022

(65) Prior Publication Data
US 2023/0088288 A1 Mar. 23, 2023

Related U.S. Application Data

(62) Division of application No. 16/523,453, filed on Jul. 26, 2019, now Pat. No. 11,508,827.
(Continued)

(51) Int. Cl.
*H01L 29/51* (2006.01)
*H01L 21/311* (2006.01)
(Continued)

(52) U.S. Cl.
CPC .......... *H01L 29/515* (2013.01); *H01L 21/311* (2013.01); *H01L 27/0886* (2013.01); *H01L 29/6653* (2013.01)

(58) Field of Classification Search
CPC . H01L 29/515; H01L 21/311; H01L 27/0886; H01L 29/6653; H01L 21/764; H01L 29/4991; H01L 29/6656; H01L 29/66545; H01L 29/42364; H01L 29/66803; H01L 21/823431; H01L 21/823821; H01L 21/845; H01L 27/0924; H01L 27/10826; H01L 27/10879; H01L 27/1211; H01L 29/41791;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

CN 105719998 A 6/2016
CN 107346739 A 11/2017
(Continued)

*Primary Examiner* — Mohammad A Rahman
(74) *Attorney, Agent, or Firm* — Haynes and Boone, LLP

(57) ABSTRACT

A semiconductor structure includes a first device and a second device. The first device includes: a first gate structure formed over an active region and a first air spacer disposed adjacent to the first gate structure. The second device includes: a second gate structure formed over an isolation structure and a second air spacer disposed adjacent to the second gate structure. The first air spacer and the second air spacer have different sizes.

20 Claims, 69 Drawing Sheets

Related U.S. Application Data

(60) Provisional application No. 62/736,565, filed on Sep. 26, 2018.

(51) Int. Cl.
  *H01L 27/088* (2006.01)
  *H01L 29/66* (2006.01)

(58) Field of Classification Search
  CPC . H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365; H10B 10/12
  See application file for complete search history.

(56) References Cited

U.S. PATENT DOCUMENTS

| | | | |
|---|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,673,293 B1 | 6/2017 | Cheng et al. |
| 9,748,389 B1 | 8/2017 | Lee et al. |
| 9,831,346 B1 | 11/2017 | Zang et al. |
| 10,229,983 B1 | 3/2019 | Bu et al. |
| 10,388,770 B1 | 8/2019 | Xie et al. |
| 2011/0254093 A1 | 11/2011 | Wong et al. |
| 2013/0059422 A1 | 3/2013 | Lee et al. |
| 2014/0024192 A1 | 1/2014 | Kim et al. |
| 2014/0043905 A1 | 2/2014 | Lee |
| 2014/0159194 A1 | 6/2014 | Song et al. |
| 2015/0061154 A1 | 3/2015 | Choi et al. |
| 2015/0214220 A1 | 7/2015 | Seo |
| 2015/0214235 A1 | 7/2015 | Lee et al. |
| 2015/0228754 A1 | 8/2015 | Sung |
| 2016/0074306 A1 | 3/2016 | Isoga et al. |
| 2016/0181143 A1 | 6/2016 | Kwon et al. |
| 2016/0276273 A1 | 9/2016 | Kwon et al. |
| 2017/0323824 A1* | 11/2017 | Chang ............... H01L 21/28247 |
| 2018/0040707 A1 | 2/2018 | Park et al. |
| 2018/0076199 A1 | 3/2018 | Wang et al. |
| 2018/0151706 A1 | 5/2018 | Lin et al. |
| 2018/0166319 A1 | 6/2018 | Park et al. |
| 2018/0277430 A1 | 9/2018 | Xie et al. |
| 2020/0091162 A1 | 3/2020 | Morris et al. |

FOREIGN PATENT DOCUMENTS

| | | |
|---|---|---|
| KR | 20020020507 A | 3/2002 |
| KR | 20150095044 A | 8/2015 |
| KR | 20160012826 A | 2/2016 |
| KR | 20160074306 A | 6/2016 |
| KR | 20170003830 A | 1/2017 |

* cited by examiner

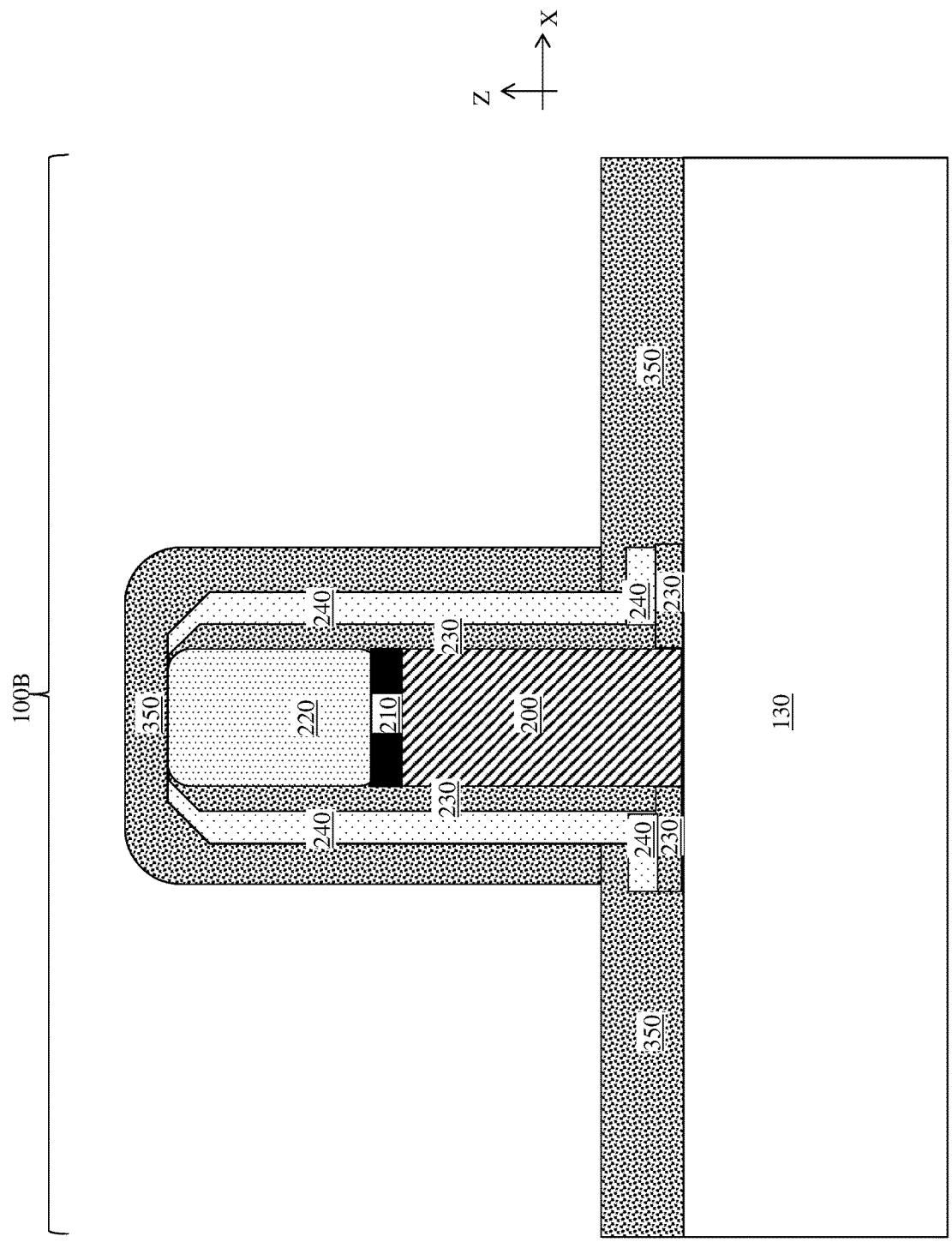

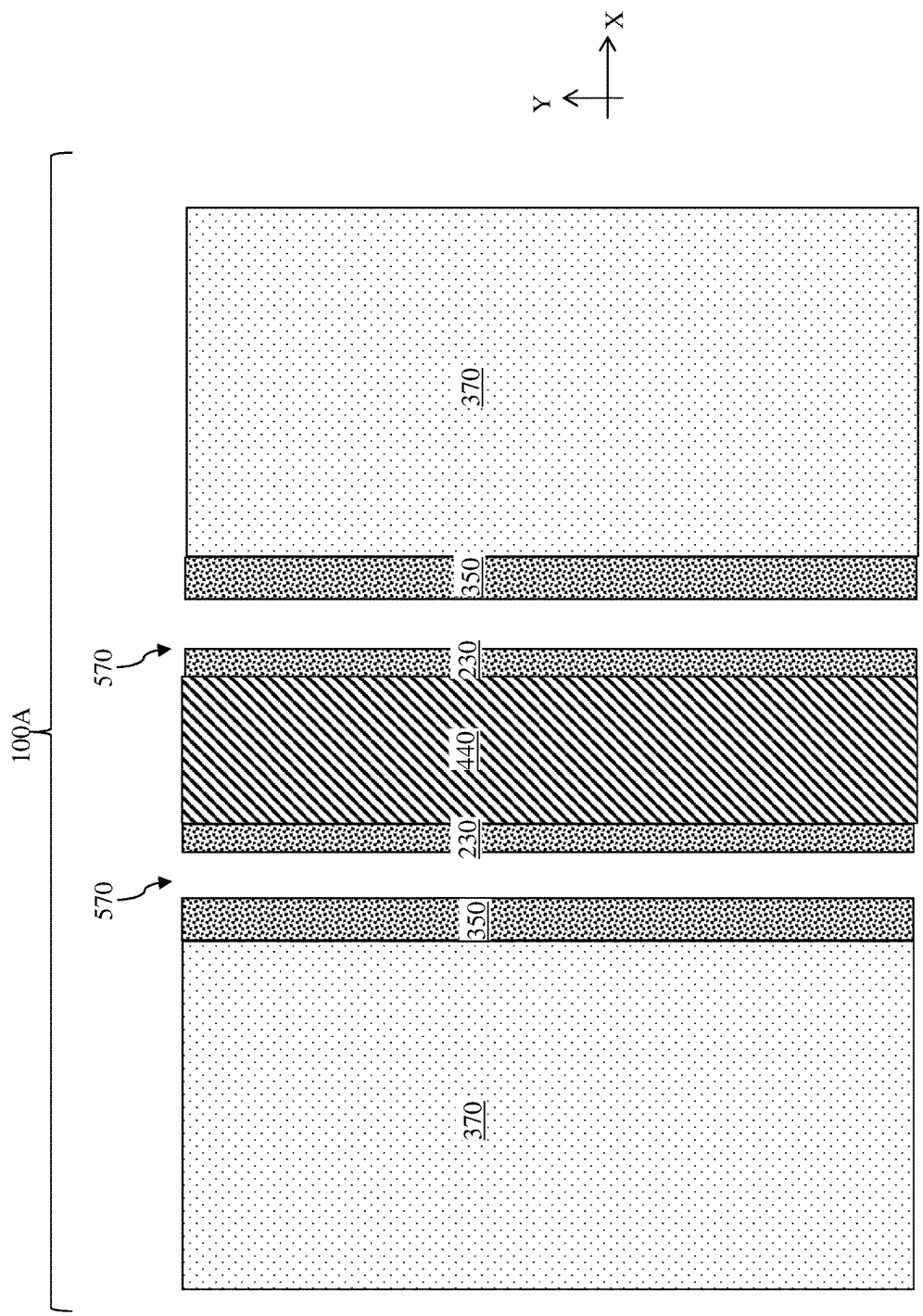

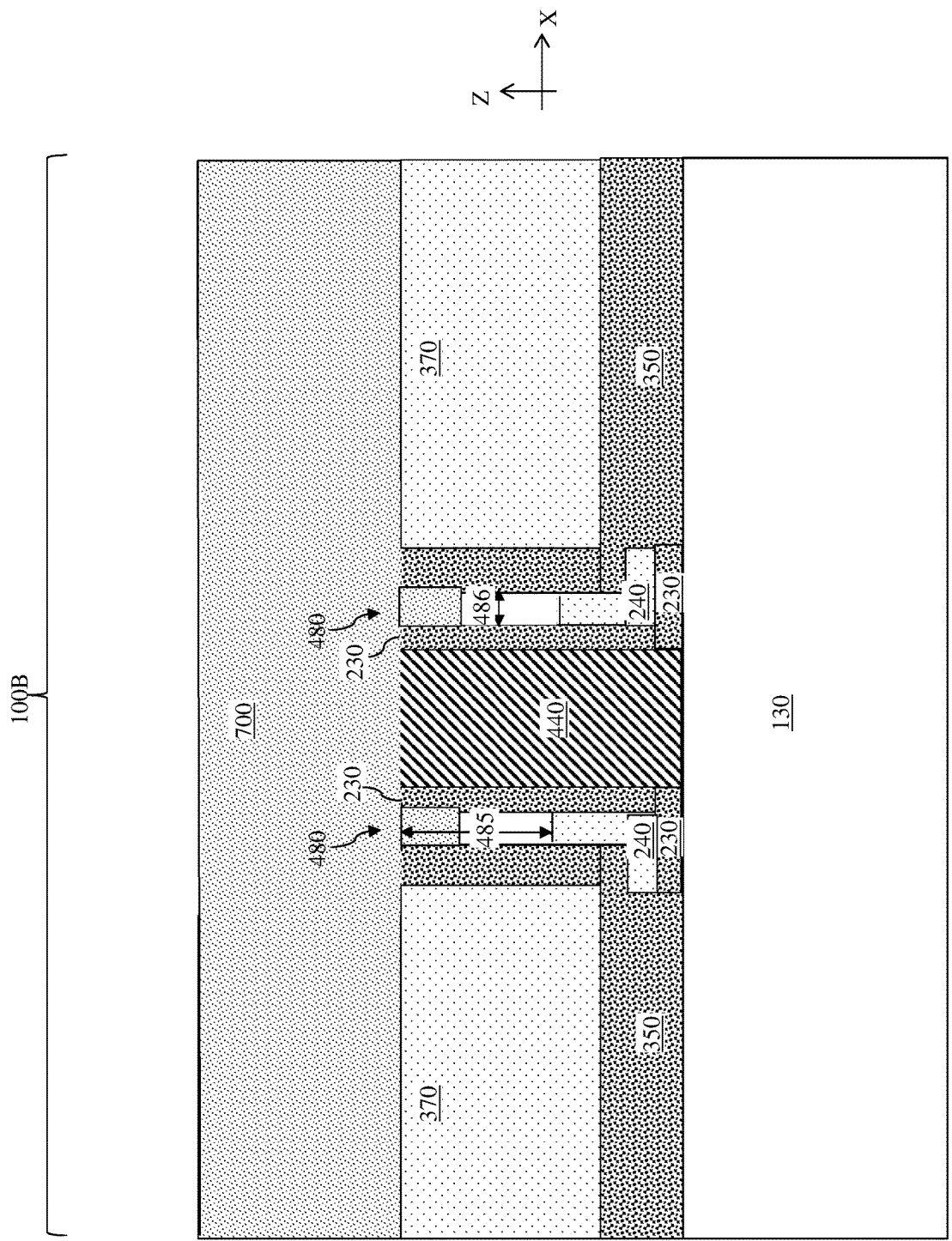

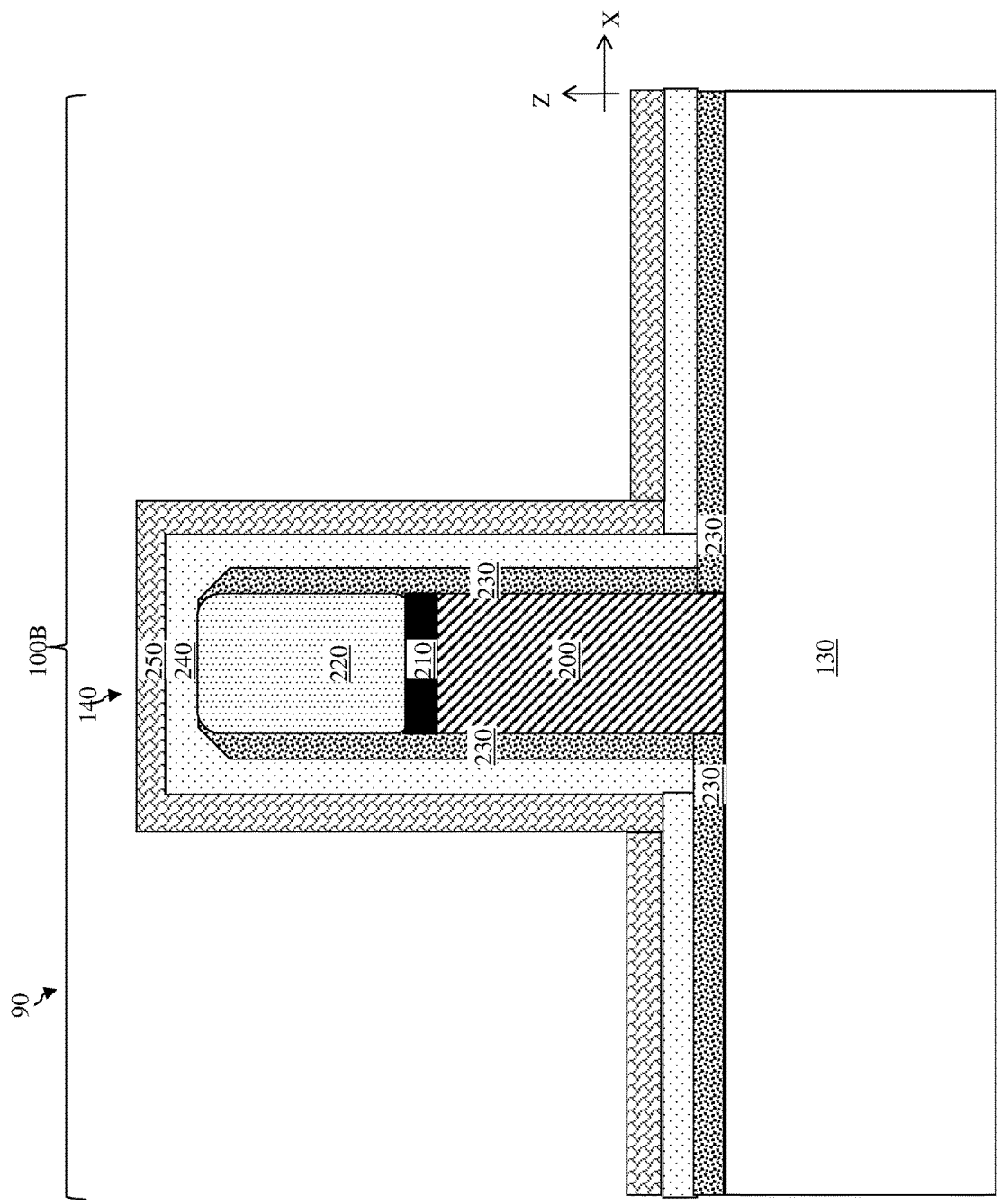

AIR SPACER FOR A GATE STRUCTURE OF A TRANSISTOR

PRIORITY DATA

The present application is a Divisional application of U.S. application Ser. No. 16/523,453, filed Jul. 26, 2019, titled "Air Spacer For A Gate Structure Of A Transistor", now issued as U.S. Pat. No. 11,508,827, which claims priority to U.S. Provisional Patent Application Ser. No. 62/736,565 filed on Sep. 26, 2018, the disclosure of which each of is incorporated herein by reference in their entireties. This application is also related to U.S. patent application Ser. No. 16/218,330, filed on Dec. 12, 2018, entitled "Methods of Forming Metal Gate Spacer", the disclosure of which is also incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, methods have been developed to form gate spacers with a low dielectric constant. However, while conventional methods of forming low-k dielectric gate spacers have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-3, 4A-13A, 4B-13B, 16A-21A, 16B-21B, 23A-28A, 23B-28B, 30A-35A, and 30B-35B are cross-sectional views of an embodiment of a FinFET device of at various stages of fabrication according to various aspects of the present disclosure.

FIGS. 14A-15A, 14B-15B, 22A-22B, and 29A-29B are top views of an embodiment of a FinFET device of at various stages of fabrication according to various aspects of the present disclosure.

DETAILED DESCRIPTION

Figure 1B:
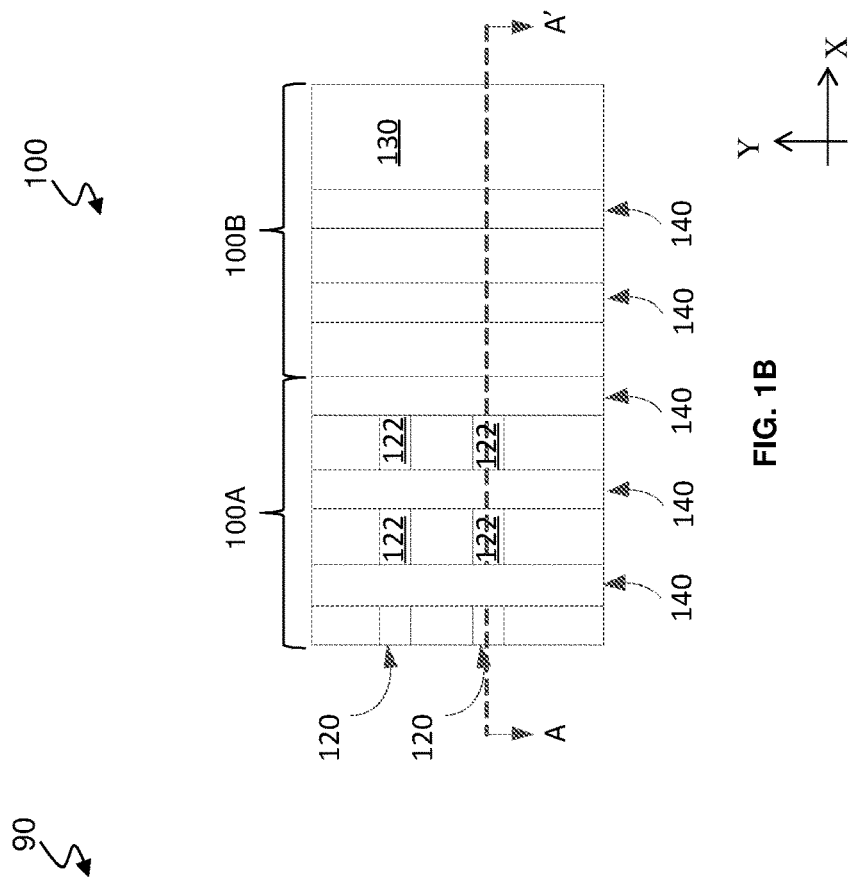
FIG. 1B is a planar top view of a FinFET device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-line FETs (FinFETs). One aspect of the present disclosure involves forming high-k metal gate spacers as a part of semiconductor device fabrication.

During fabrication of a FinFET structure, air gaps (referred to as air spacers) may be formed in place of gate spacer disposed on sidewalls of gate structures (e.g., high-k metal gate structures (HKMGs)). In some embodiments, air spacers formed between gate structures and additional dielectric layers in active device regions lower the capacitance of the gate structures, thereby improving the overall performance (e.g., speed) of the FinFET structure. However, conventional methods of forming air spacers may still need improvement. For example, it may be difficult to form air spacers in high aspect ratio (e.g., a ratio of height and width of a trench) situations. As another example, as a result of the air spacer formation process, the gate structures formed over an isolation region may collapse more easily than the gate structures formed over an active region, which is undesirable.

The present disclosure improves conventional air spacer formation processes at least in part by forming a highly etchable liner next to gate spacers in a first region but not a second region, or by selectively doping dielectric gate spacers in one region but not the other region, as discussed in more detail below.

Figure 1A:
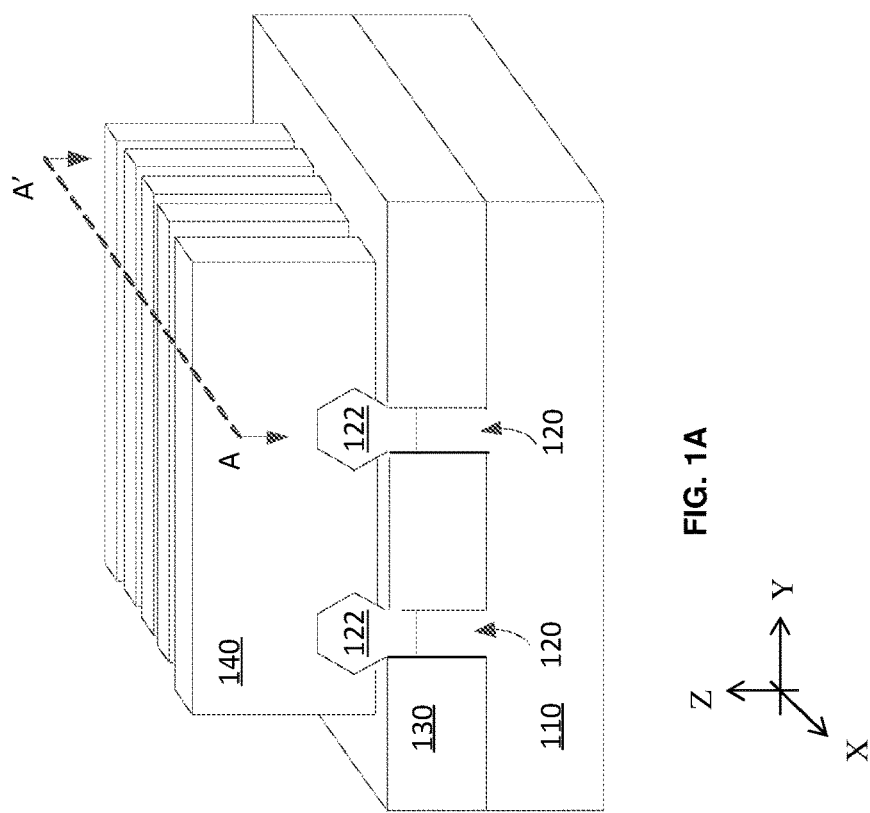
FIG. 1A is a perspective view of a FinFET device according to various aspects of the present disclosure.

FIGS. 1A and 1B illustrate a three-dimensional perspective view and a top view, respectively, of a portion of a semiconductor structure 90. The semiconductor structure 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, though the semiconductor structure 90 as illustrated is a three-dimensional FinFET device, the present disclosure may also apply to planar FET devices.

Referring to FIG. 1A, the semiconductor structure 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be referred to as fins 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a sacrificial layer may be formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures 120.

The semiconductor structure 90 also includes source/drain (S/D) features 122 formed over the fins 120. The source/drain features 122 may include epi-layers that are epitaxially grown on the fin structures 120.

The semiconductor structure 90 further includes isolation structures 130 formed over the substrate 110. The isolation structures 130 electrically separate various components of the semiconductor structure 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The semiconductor structure 90 also includes gate structures 140 formed over and engaging the fins 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fins 120, a capping layer, other suitable layers, or combinations thereof.

Referring to FIG. 1B, the gate structures 140 are oriented lengthwise along the Y direction and separated from each other along a direction of the fin length, i.e., the X direction. Specifically, some gate structures 140 are disposed in a device region 100A, where the gate structures 140 engage the fins 120 in a channel region of each fin 120. Other gate structures 140 are disposed in a device region 100B disposed adjacent to the device region 100A, where the device region 100B includes the isolation structure 130. In many embodiments, the device region 100A provides multiple FinFET devices following formation of metal gate structures.

As depicted herein, the semiconductor structure 90 may include multiple fins 120 oriented lengthwise along the X direction and multiple gate structure 140 oriented lengthwise along the Y direction, i.e., generally perpendicular to the fins 120. In many embodiments, as will be discussed in detail below, the semiconductor structure 90 includes additional features such as gate spacers disposed along sidewalls of the gate structures 140, hard mask layer(s) disposed over the gate structures 140, and numerous other features. For purpose of simplicity, the processing steps of the present disclosure are described with reference to cross-sectional views corresponding to FIGS. 2-3, 4A-13A, 4B-13B, 16A-21A, 16B-21B, 23A-28A, 23B-28B, and 30A-30B, where the cross-section of the semiconductor structure 90 is taken along the dashed line AA' as illustrated in FIGS. 1A-1B.

Figure 2:
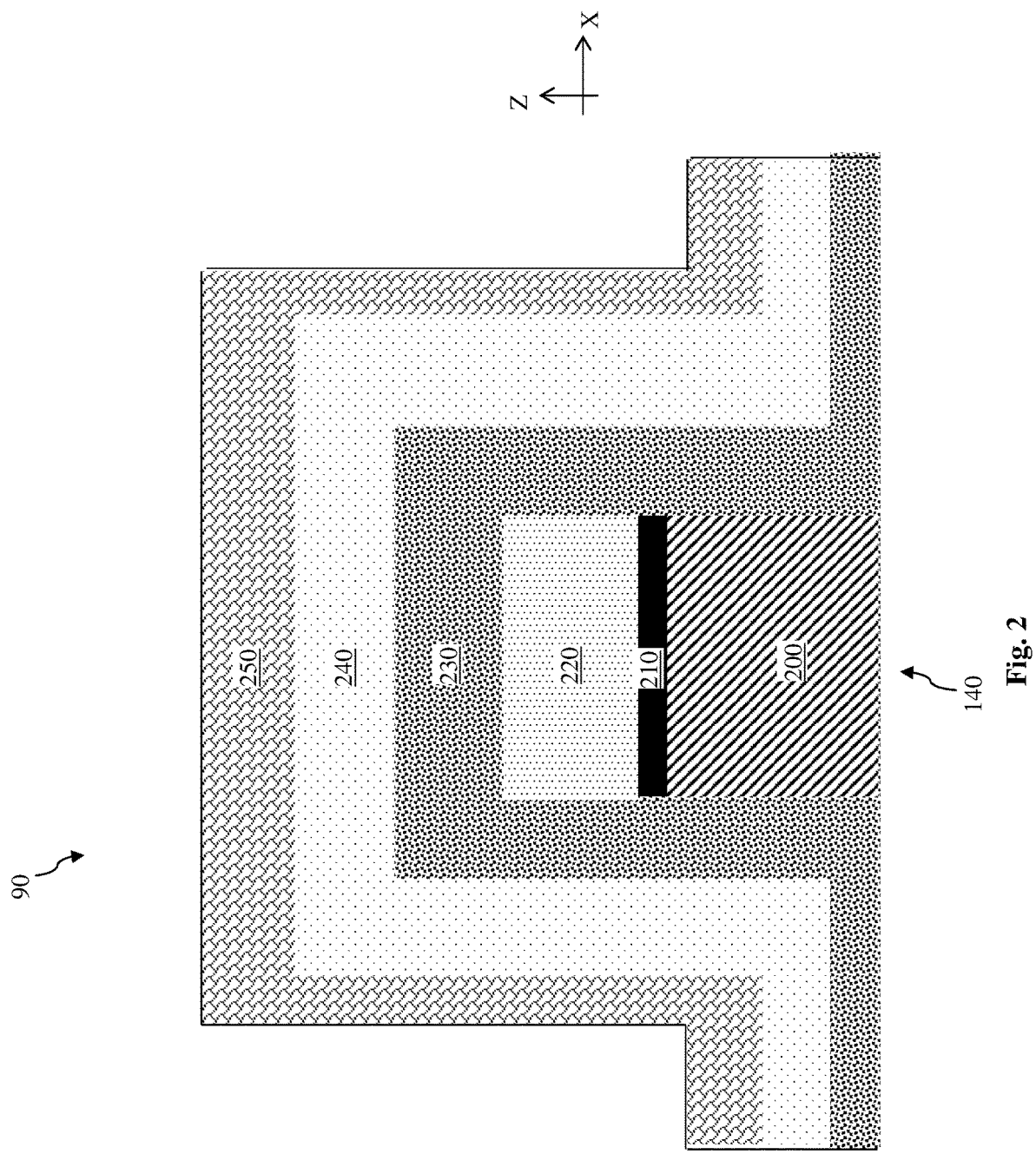

Referring now to FIG. 2, the gate structure 140 may include a dummy gate electrode 200. The dummy gate electrode 200 may include a polysilicon material, which will be removed in a gate replacement process discussed in greater detail below. The gate structure 140 may also include a gate dielectric disposed below the gate electrode 200, which may include a dummy gate dielectric (e.g., a silicon oxide gate dielectric) in some embodiments, or a high-k gate dielectric in other embodiments. The gate dielectric is not specifically illustrated herein for reasons of simplicity.

The gate structure 140 includes hard mask layers 210 and 220 disposed above the dummy gate electrode 200. In some embodiments, the hard mask layers 210 and 220 are configured to protect the dummy gate electrode 200 from subsequent processing steps. The hard mask layers 210 and 220 may each include any suitable dielectric material, such as a nitrogen-containing dielectric material, an oxygen-containing dielectric material, other suitable materials, or combinations thereof. As a non-limiting example, the hard mask layer 210 includes a nitrogen-containing dielectric material, such as silicon nitride or a metal nitride, and the hard mask layer 220 includes an oxygen-containing dielectric material, such as silicon oxide or a metal oxide.

The hard mask layers 210 and 220 and other various material layers included in the gate structure 140 may be formed by any suitable method, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), plasma enhanced CVD (PE-CVD), low-pressure CVD (LP-CVD), atomic layer CVD (AL-CVD), atmospheric pressure CVD (AP-CVD), other suitable methods, or combinations thereof. In one embodiment, the various layers of the gate structure 140 are first deposited as blanket layers. The blanket layers are then patterned through a series of lithography and etching processes, thereby removing portions of the blanket layers and keeping the remaining portions over the isolation structures 130 and the fins 120 as the gate structure 140.

A spacer layer 230 is formed along sidewalls of the gate structures 140, and a spacer layer 240 disposed over the spacer layer 230. The spacer layers 230 and 240 each include a material different from the material(s) included in the gate structure 140. In some embodiments, the spacer layers 230 and 240 may silicon, oxygen, nitrogen, and/or carbon. The spacer layers 230 and 240 may also differ from each other in material composition. For example, the spacer layer 230 may include a greater amount of carbon than the spacer layer 240. In one non-limiting example, the spacer layer 230 may include silicon carbon nitride (SiCN) and has a thickness in a range between about 2 nanometer (nm) and about 5 nm, and the spacer layer 240 may include silicon carbon oxynitride (SiCON) and has a thickness in a range between about 2 nanometer (nm) and about 5 nm. These material compositions are configured to optimize etching selectivity in later etching processes, and the thickness ranges are configured to tune the dimensions of the gate spacers to be formed later. However, other materials (or other thicknesses) may be used to implement the spacer layers 230 and 240 in other embodiments.

The spacer layers 230 and 240 may each be formed by first depositing a blanket of spacer material over the semiconductor structure 90 by a method such as CVD, PVD, ALD, other suitable methods, or combinations thereof, and then performing an anisotropic etching process to remove portions of the spacer material to form the spacer layers 230 and 240. In some embodiments, additional spacer layer(s) may be included between the gate structures 140 and the spacer layers 230-240.

A dummy layer 250 is formed over the spacer layer 240. The dummy layer 250 has a different material composition than the spacer layer 240. As a non-limiting example, the dummy layer 250 includes silicon nitride (SiN). The dummy layer 250 may be used as a mask in subsequent N region and P region epi-layer growth processes.

Figure 3:
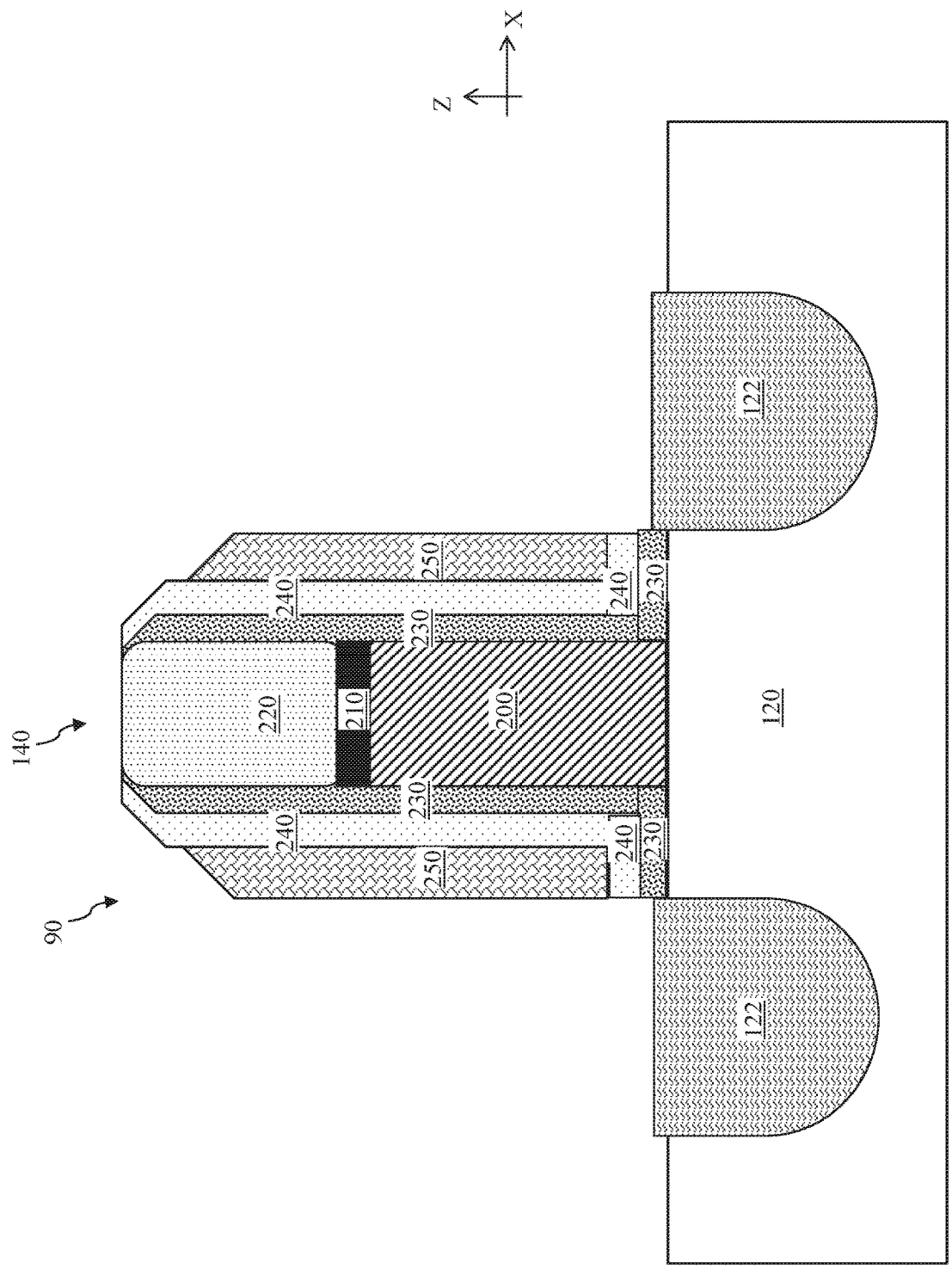

Referring now to FIG. 3, the spacer layers 230 and 240 and the dummy layer 250 are patterned into gate spacers 230 and 240 that are disposed on sidewalls of the gate structure 140. The S/D features 122 may then be formed by any suitable techniques, such as etching processes followed by one or more epitaxy processes. In one example, one or more etching processes are performed (with the patterned dummy layer 250 serving as a mask) to remove portions of the fin structures 120 to form recesses (not shown) therein. A cleaning process may be performed to clean the recesses with a hydrofluoric acid (HF) solution or other suitable solution. Subsequently, one or more epitaxial growth processes are performed to grow epitaxial features in the recesses. Each of the S/D features 122 may be suitable for a p-type FinFET (e.g., a p-type epitaxial material), or alternatively, an n-type FinFET (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants.

Figure 4A:
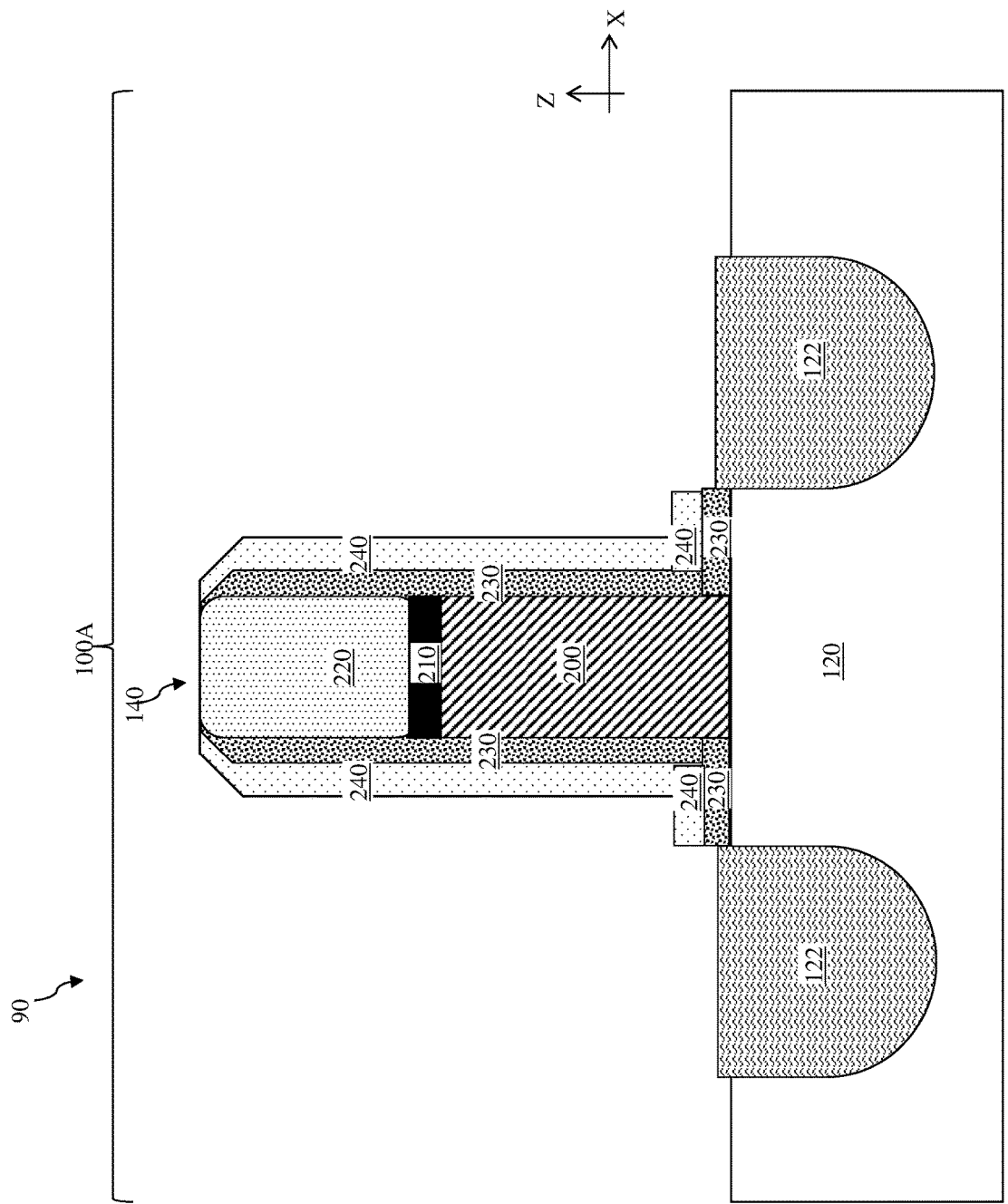
Figure 4B:
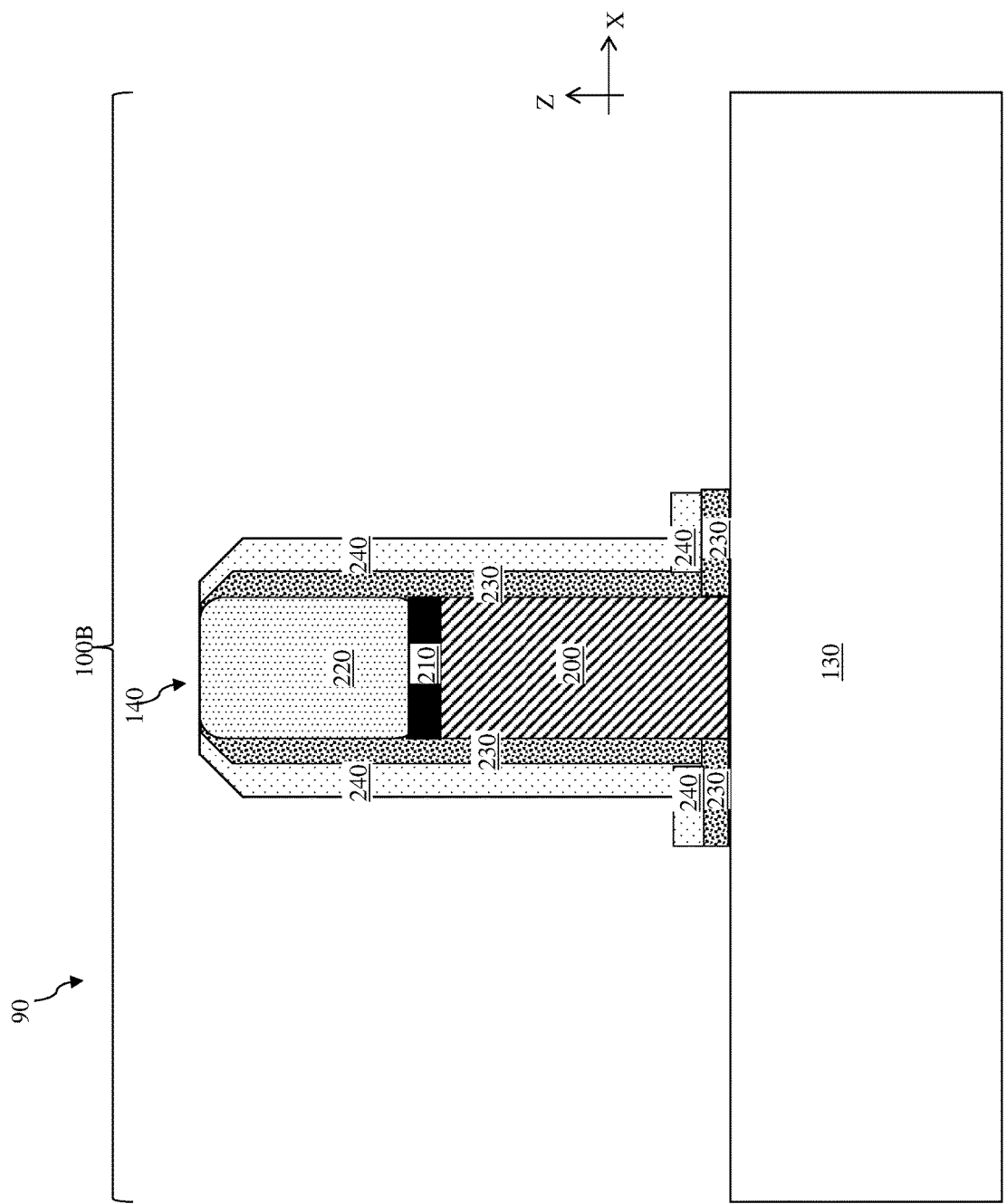

FIGS. 4A and 4B illustrate the cross-sectional views for the device region 100A and the device region 100B, respectively. The device regions 100A and 100B correspond to different types of devices. For example, in some embodiments, the device region 100A includes a functional device (e.g., a functional transistor), while the device region 100B includes a dummy device (e.g., a dummy transistor). In some embodiments, the dummy device does not conduct electricity or is not a part of an electrical circuit, but it is a component configured to turn an overall pattern density of the semiconductor structure 90. In some other embodiments, one of the device regions 100A and 100B includes a memory device (e.g., an SRAM device), while the other one of the device regions 100A and 100B includes a logic device (e.g., a ring oscillator device).

As shown in FIGS. 4A-4B, the portion of the semiconductor structure in both the device regions 100A and 100B includes the gate structure 140 (including the gate electrode 200 and the hard mask layers 210-220), the gate spacers 230-240, and the dummy layer 250. However, the device region 100A includes the S/D features 122 and the active region 120 over which the gate structure 140 is disposed, while the device region 100B includes the isolation structure 130 (e.g., an STI) over which the gate structure 140 is disposed. Note that the dummy layer 250 has been removed in both the device regions 100A and 100B at this stage of fabrication.

Figure 5A:
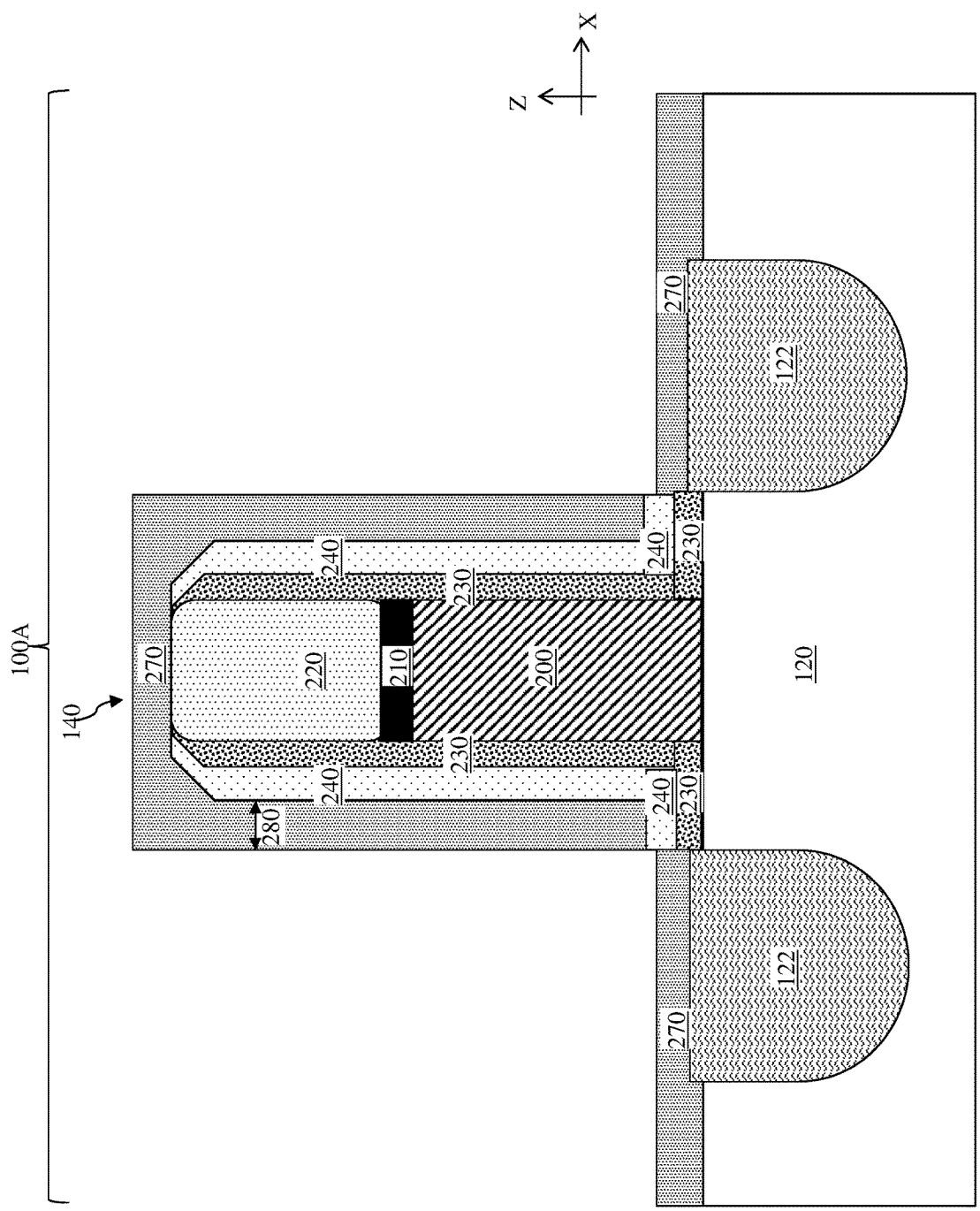
Figure 5B:
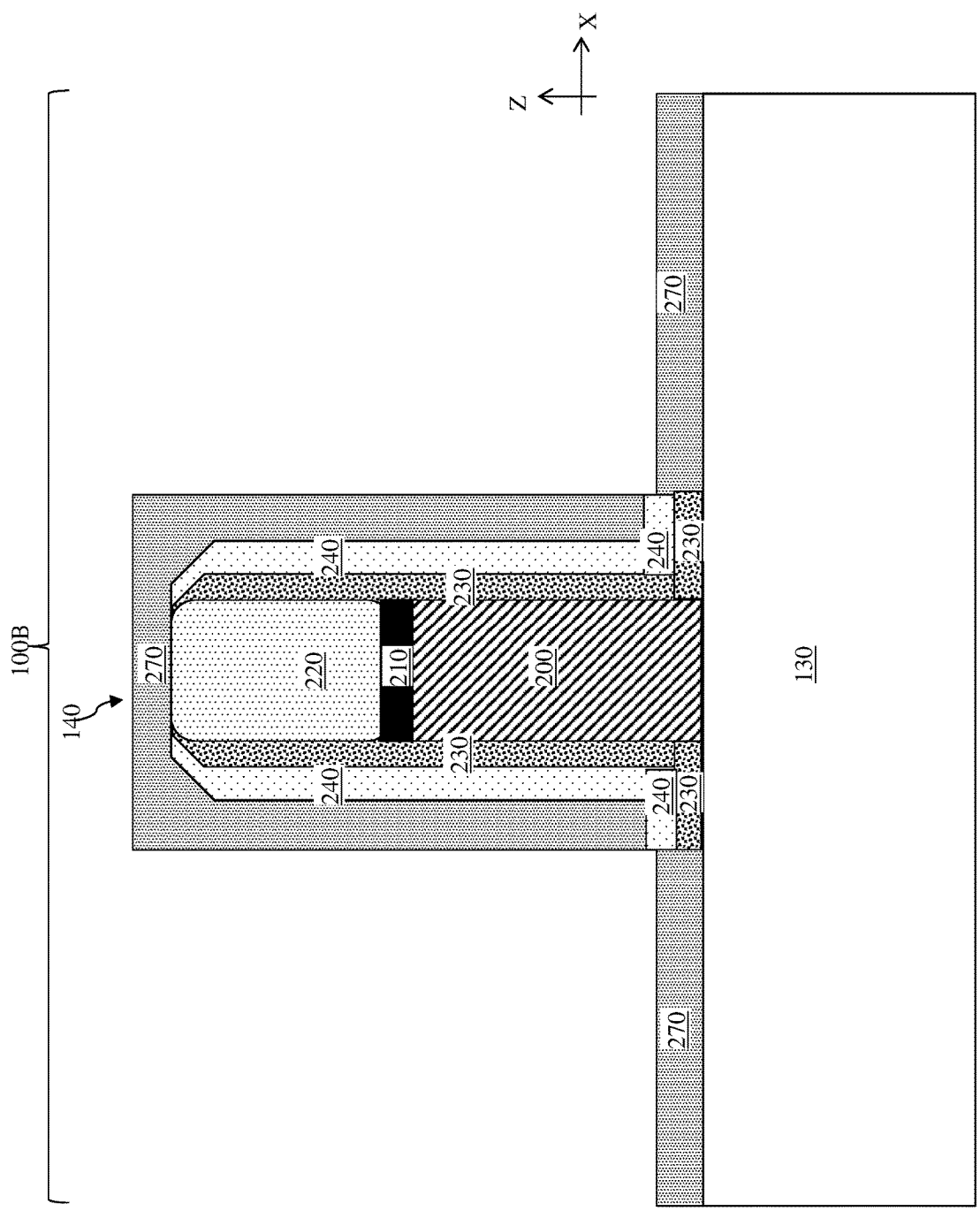

Referring to FIGS. 5A and 5B, a liner 270 is formed over the gate structure 140 in both the device regions 100A and 100B. The liner 270 is configured to have a material composition that is different from the gate spacers 230 and 240, such that an etching selectivity exists between the liner 270 and the gate spacers 230 and 240 in an etching process performed later. Due to the etching selectivity, the liner 270 may be removed without removing the gate spacers 230-240. The removal of the liner 270 will form a part of an air spacer, as discussed in more detail below.

In some embodiments, the liner 270 contains $SiO_2$. In some embodiments, the liner 270 has a thickness 280 between about 0.3 nm and about 5 nm. The material compositions of the liner 270 is selected to allow it to have a sufficient etching selectivity with the gate spacers 230 and 240, while the thickness range of the liner 270 is configured to control a size of the air spacer to be formed later (since the removal of the liner 270 facilitates the formation of the air spacer). In other words, the thickness of the liner 270 may be positively correlated with a lateral dimension of the air spacer to be formed later.

Figure 6A:
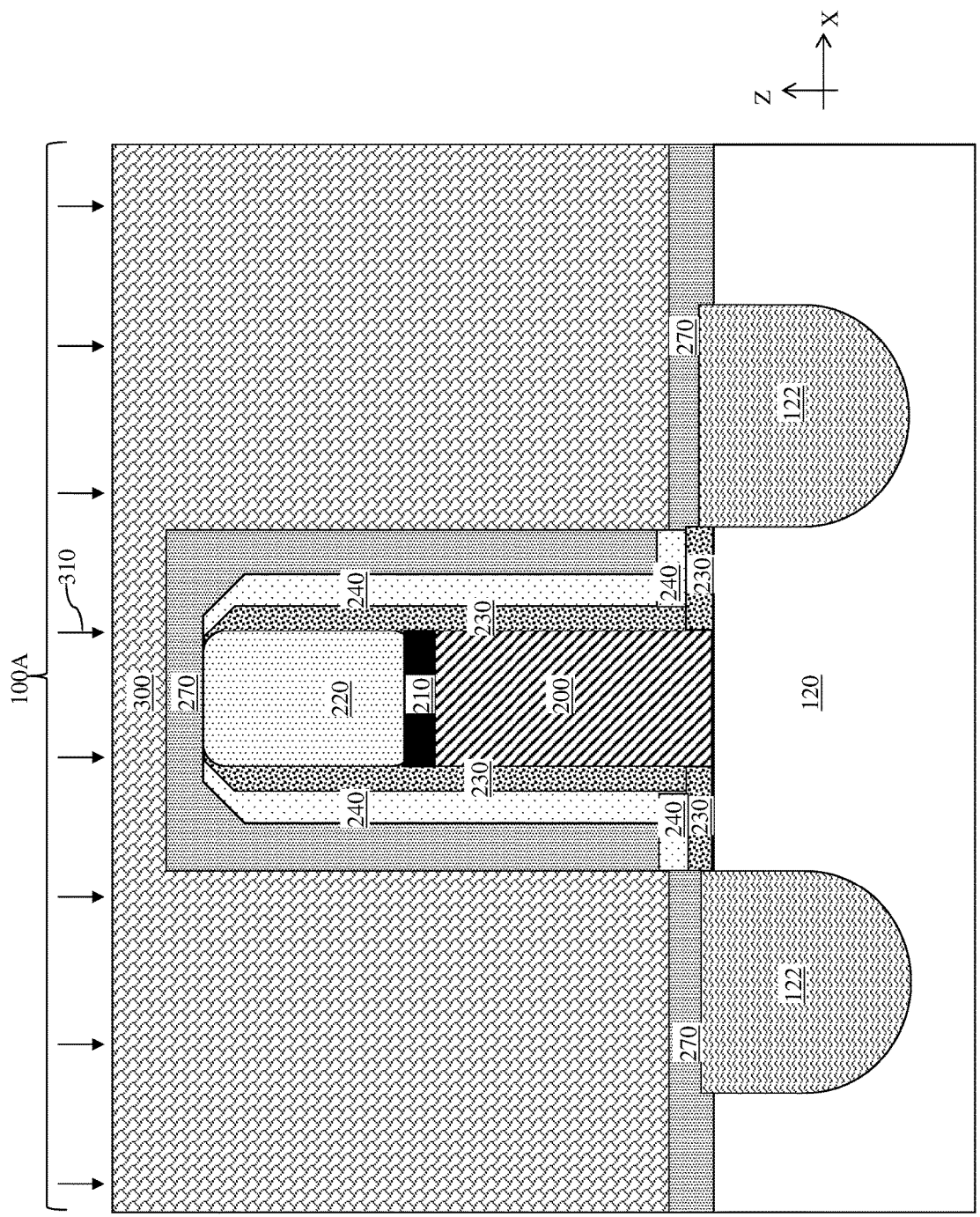
Figure 6B:
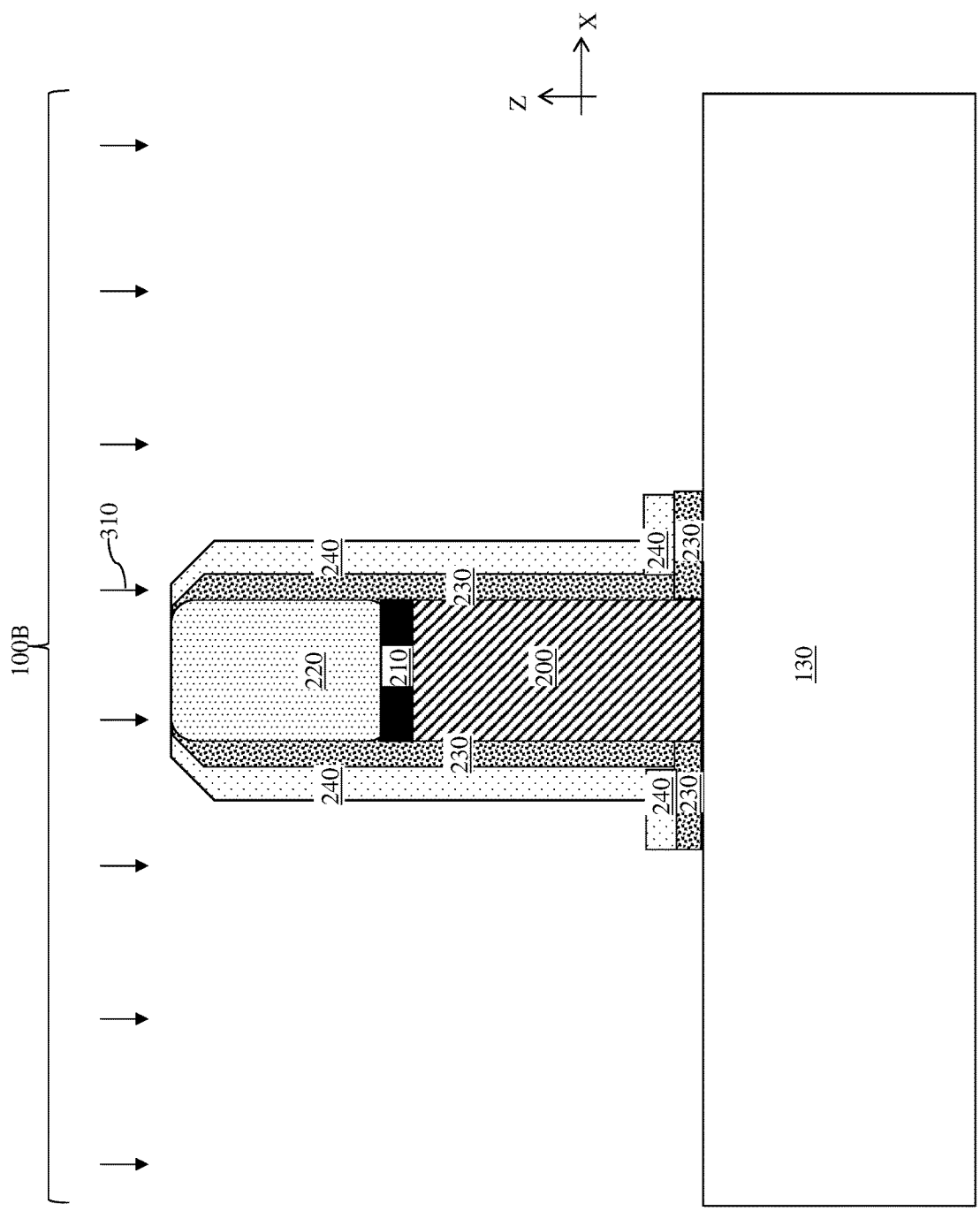

Referring now to FIGS. 6A and 6B, a patterned photoresist mask 300 is formed in the device region 100A, but not in the device region 100B. In some embodiments, forming the patterned photoresist mask 300 may include forming a bottom layer, such as a bottom anti-reflective coating (BARC), over the semiconductor structure 90, and subsequently forming a resist layer over the bottom layer. The resist layer may be patterned using any suitable method to form the patterned photoresist mask 300 that exposes the device region 100B. After the patterning process, the bottom layer may then be removed from the device region 100B by any suitable method, such as a wet cleaning process utilizing any suitable solvent (e.g., high-temperature sulfuric peroxide mix (HTSPM), dilute hydrofluoric acid (DHF), other suitable solvents, or combinations thereof).

An etching process 310 is then performed. The patterned photoresist mask 300 serves as an etching mask during the etching process 310 and protects the various layers disposed therebelow from being etched. The etching process 310 is also configured to have an etching selectivity between the liner 270 and the gate spacers 240 and the isolation structure 130. As a result, the liner 270 disposed in the device region 100B is substantially removed without damaging the gate spacers 240 or the isolation structure 130 located in the device region 100B.

Figure 7A:
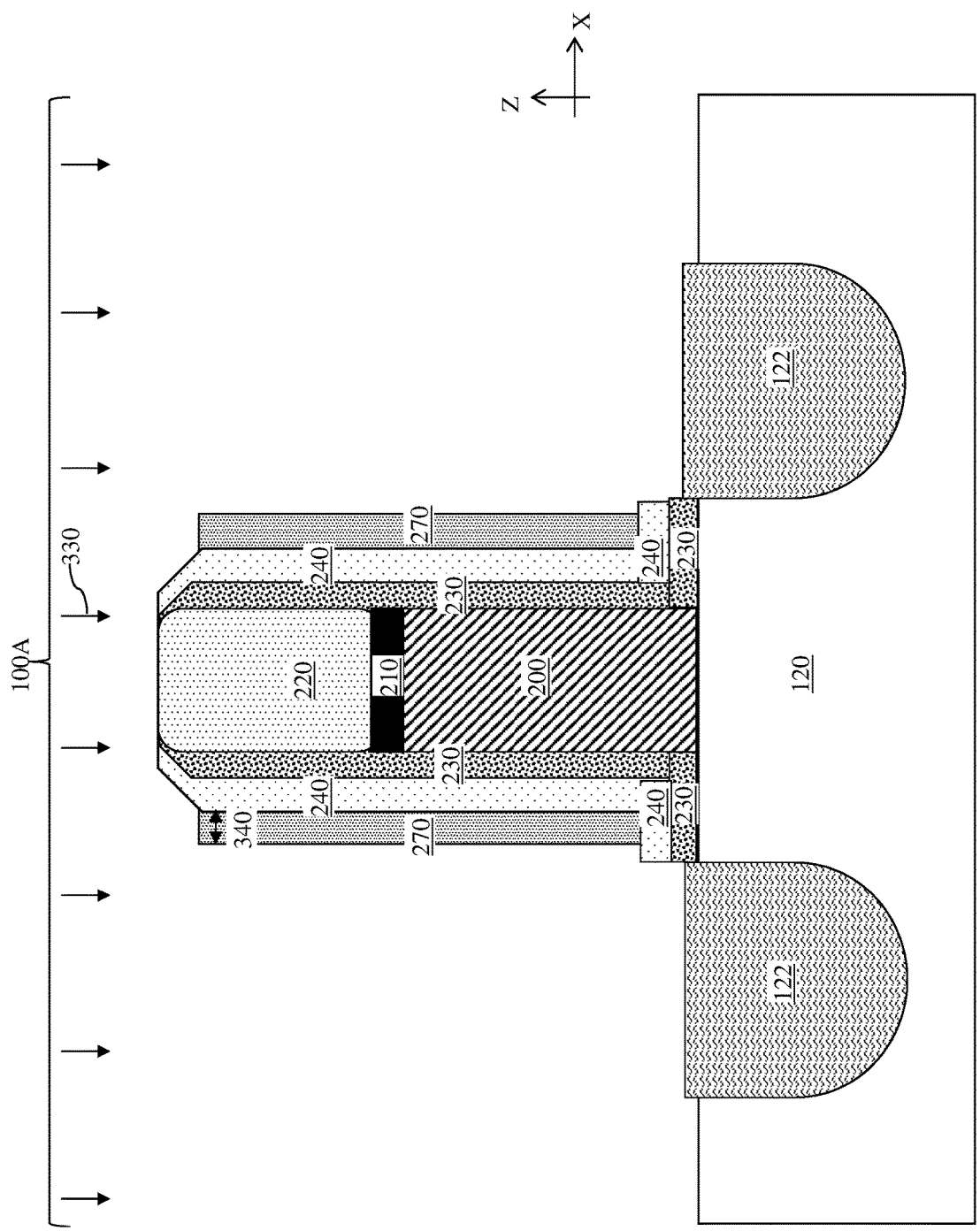
Figure 7B:
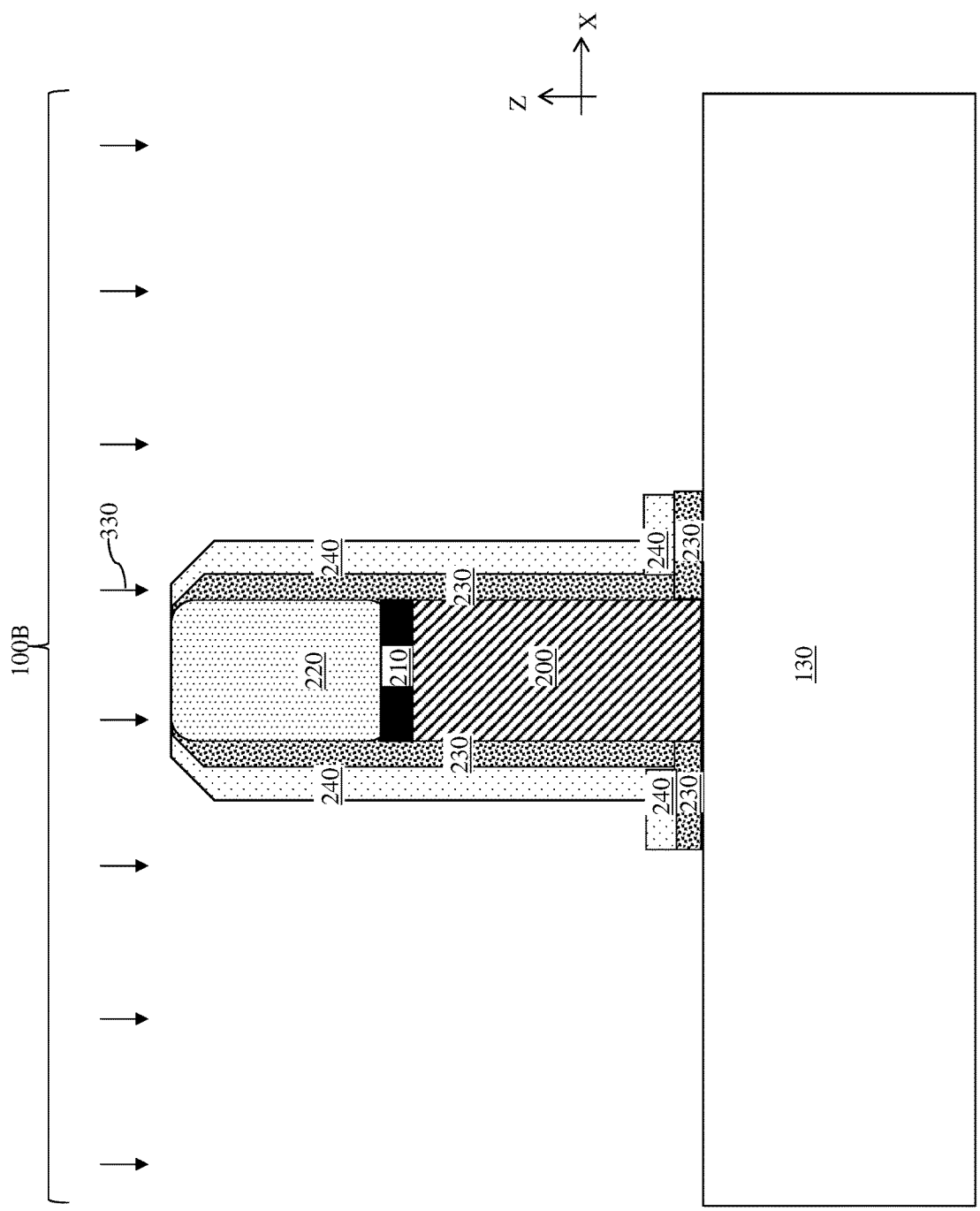

Referring now to FIGS. 7A and 7B, the patterned photoresist mask 300 is removed, for example using a photoresist ashing or photoresist stripping process. Thereafter, an etching process 330 is performed. The etching process 330 includes a dry etching process or a wet etching process and is configured to partially remove the liner 270 in the device region 100A, such that portions of the liner 270 disposed over the S/D features 122 are removed, but portions of the liner 270 disposed on the sidewalls of the gate spacers 240 still remain after the performance of the etching process 330. The etching process 330 may also reduce a thickness of the liner 270. As such, the remaining portion of the liner 270 may have a thickness 340 (measured in the X-direction) that is smaller than the thickness 280 of the liner 270 before the etching process 330 is performed. In some embodiments, the thickness 340 is in a range between about 0.3 nm and about 3 nm. This thickness range partially accounts for the lateral dimension of the air spacers that are to be formed (e.g., by the removal of the liner 270). In other words, controlling the thickness 340 will partially adjust the lateral dimension of the air spacers as well. Note that the etching process 330 may also substantially remove the remnants of the liner 270 in the device region 100B, if any exists before the performance of the etching process 330.

Figure 8A:
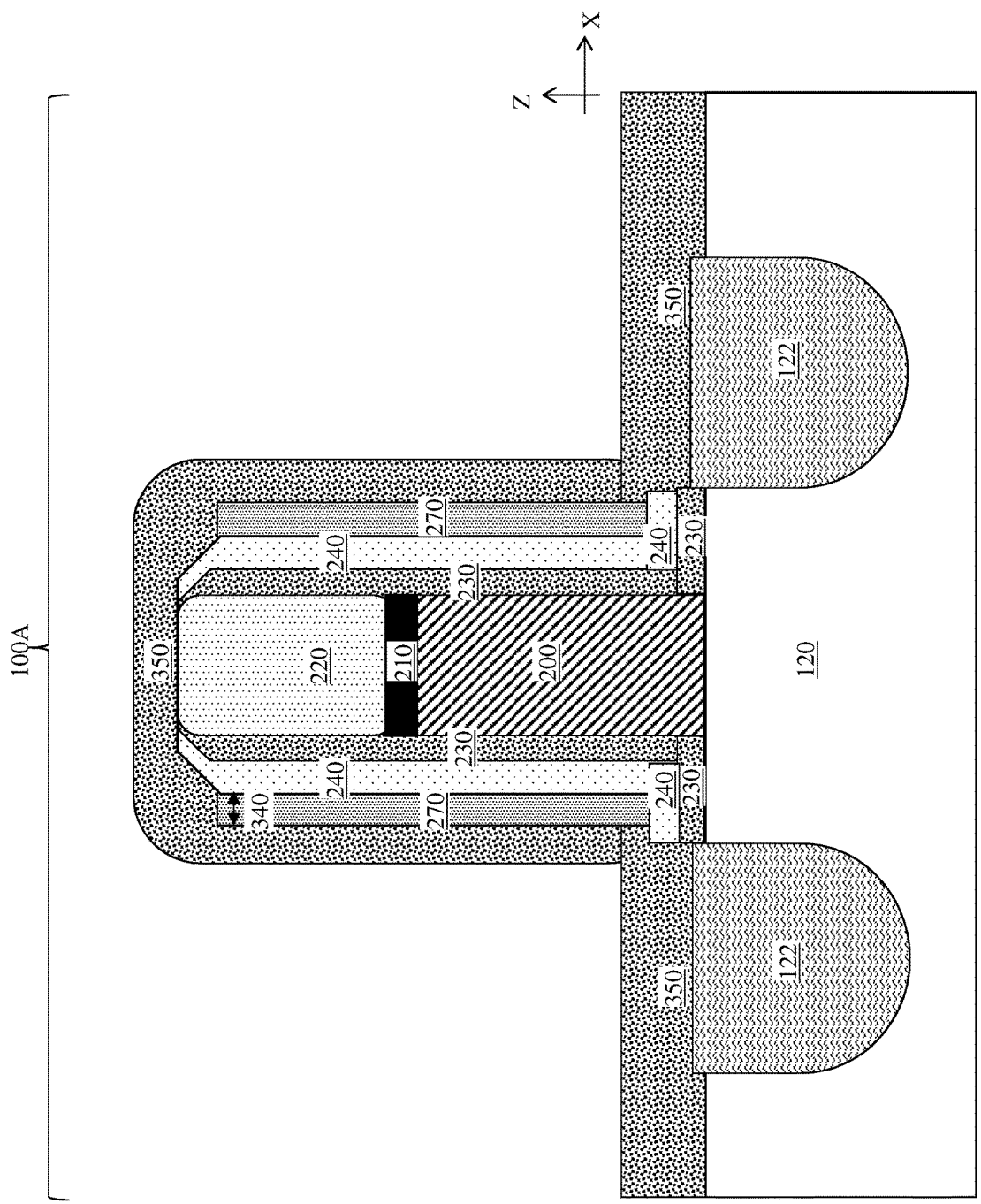

Referring now to FIGS. 8A and 8B, another spacer layer 350 is deposited in both the device region 100A and the device region 100B. The spacer layer 350 may be deposited via a suitable deposition process such as CVD, PVD, ALD, or combinations thereof. The spacer layer 350 is deposited over the gate structure 140, the S/D features 122, and the isolation structure 130. The spacer layer 350 is also deposited on sidewalls of the liner layer 270 in the device region 100A and on sidewalls of the gate spacers 240 in the device region 100B. The spacer layer 350 includes a dielectric material that is different from the dielectric material of the gate spacers 240, such that an etching selectivity exists between them in a subsequent etching process. The spacer layer 350 may also serve as an etching-stop layer. In some embodiments, the spacer layer 350 has a thickness in a range between about 2 nm and about 5 nm. The thickness range is configured such that the spacer layer 350 can adequately serve its role as an etching stop layer as well as a gate spacer.

Figure 9A:
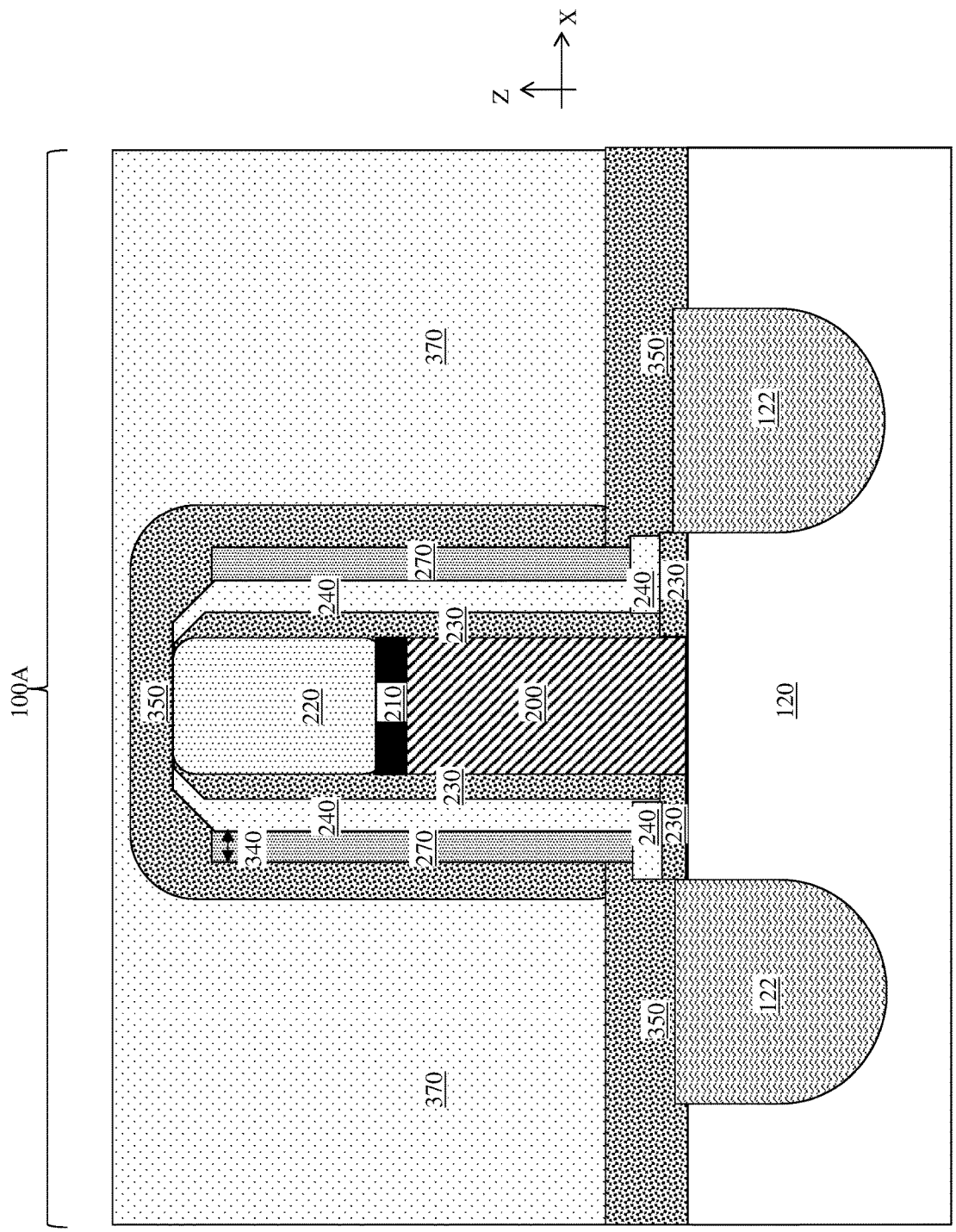
Figure 9B:
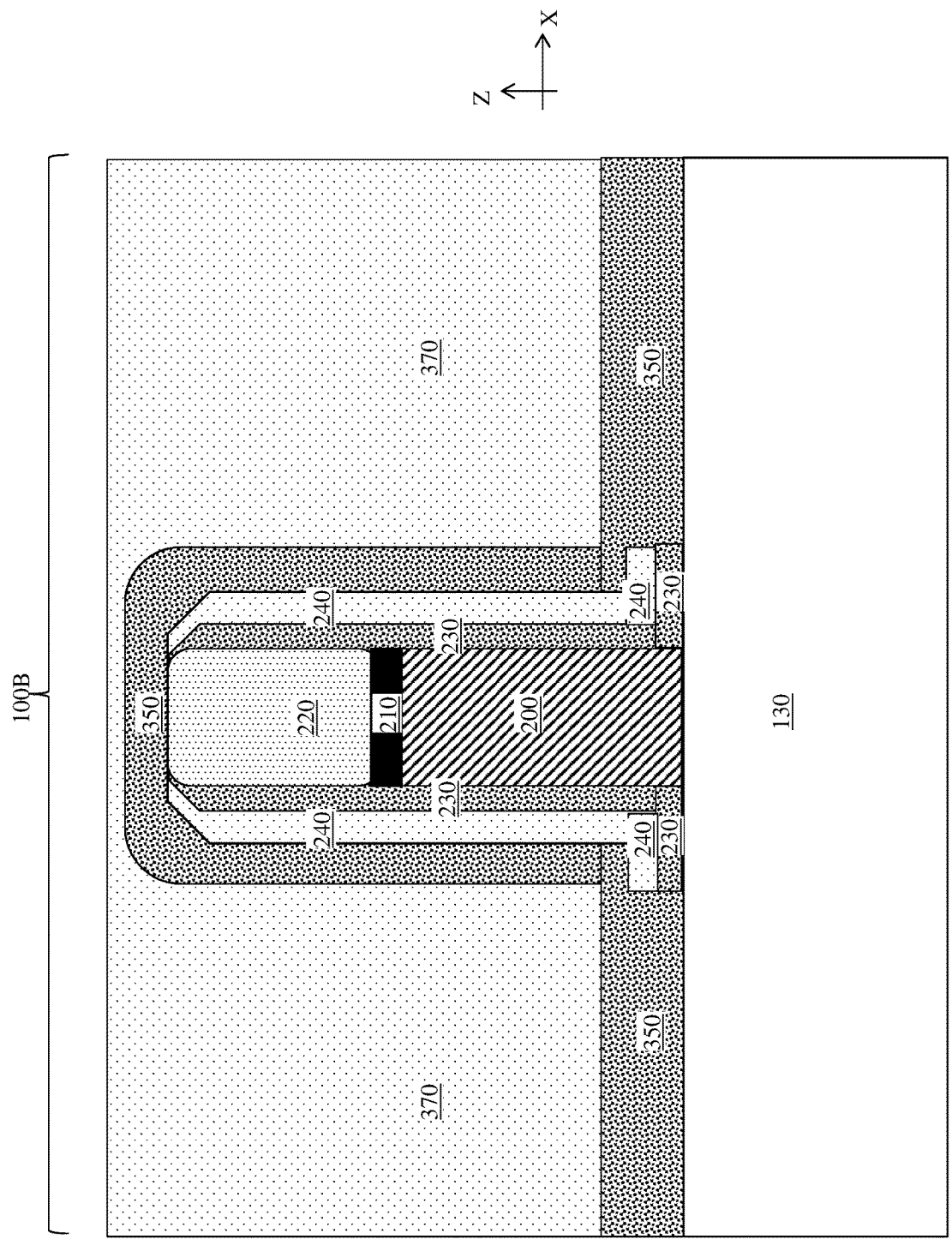

Referring now to FIGS. 9A and 9B, a dielectric layer 370 is formed over the spacer layer 350 in both the device region 100A and the device region 100B. In some embodiments, the dielectric layer 370 includes silicon oxide. In some embodiments, the dielectric layer 370 is formed using a deposition process, for example a flowable chemical vapor deposition (FCVD) process.

Figure 10A:
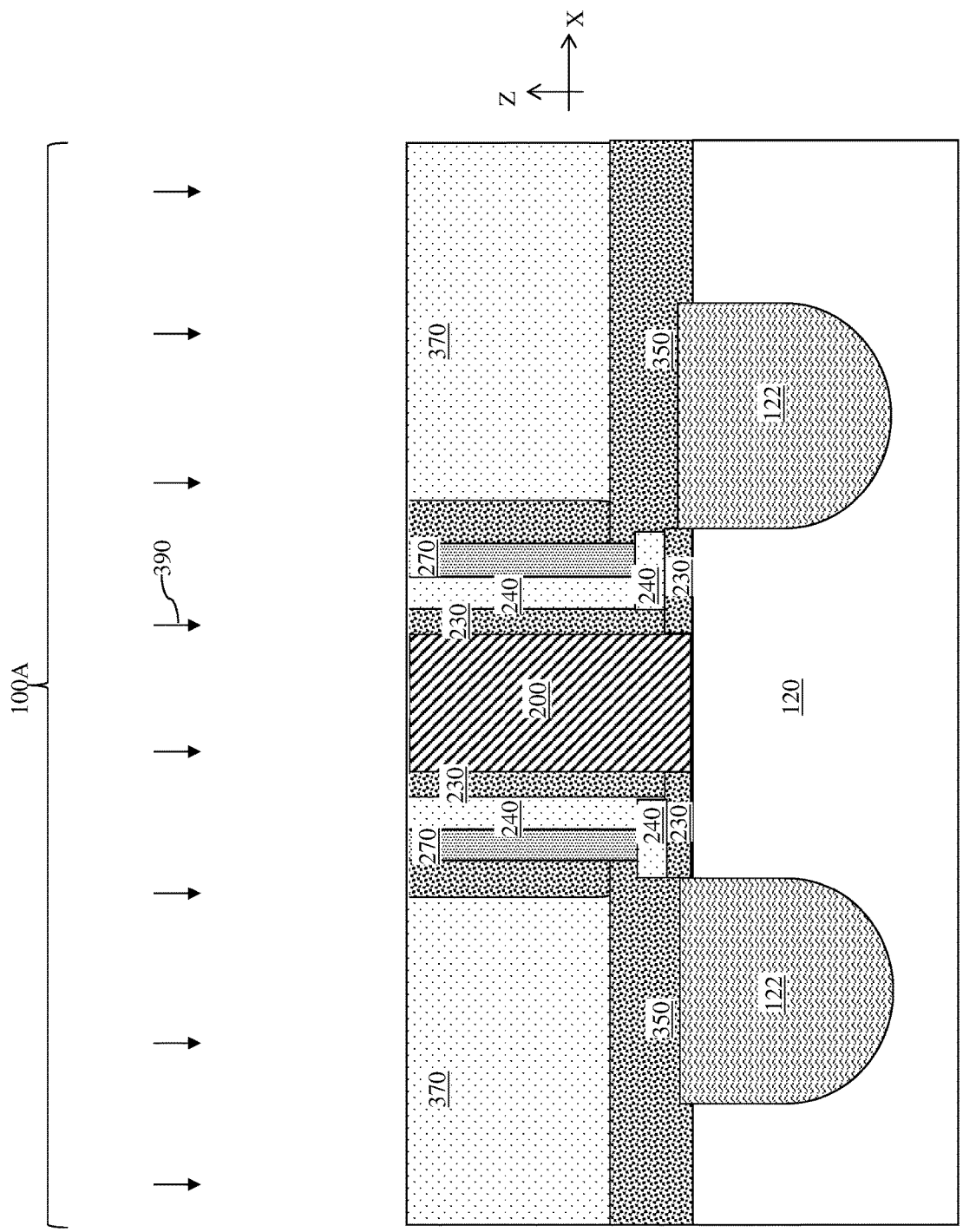
Figure 10B:
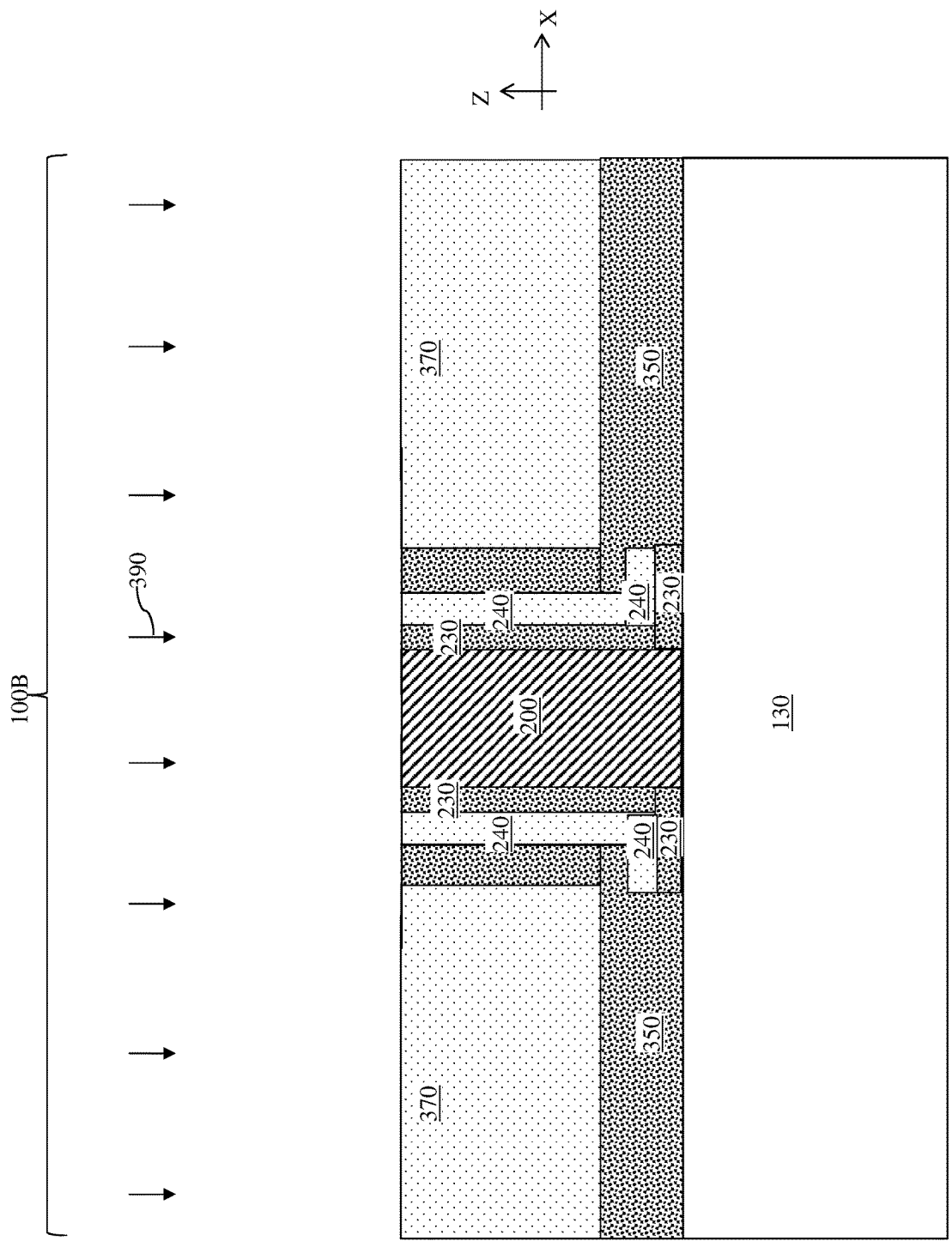

Referring now to FIGS. 10A and 10B, a chemical mechanical polishing (CMP) process 390 is performed to planarize the upper surfaces of the various layers in the device region 100A and in the device region 100B. The CMP process 390 removes the hard mask layers 210 and 220 and partially removes the gate spacers 230-240, the liner 270, the spacer layer 350, and the dielectric layer 370. The spacer layer 350 is now broken up into gate spacers 350. After the performance of the CMP process 390, the gate spacers 230-240, the liner 270, the gate spacers 350, and the dielectric layer 370 all have substantially co-planar upper surfaces.

Figure 11A:
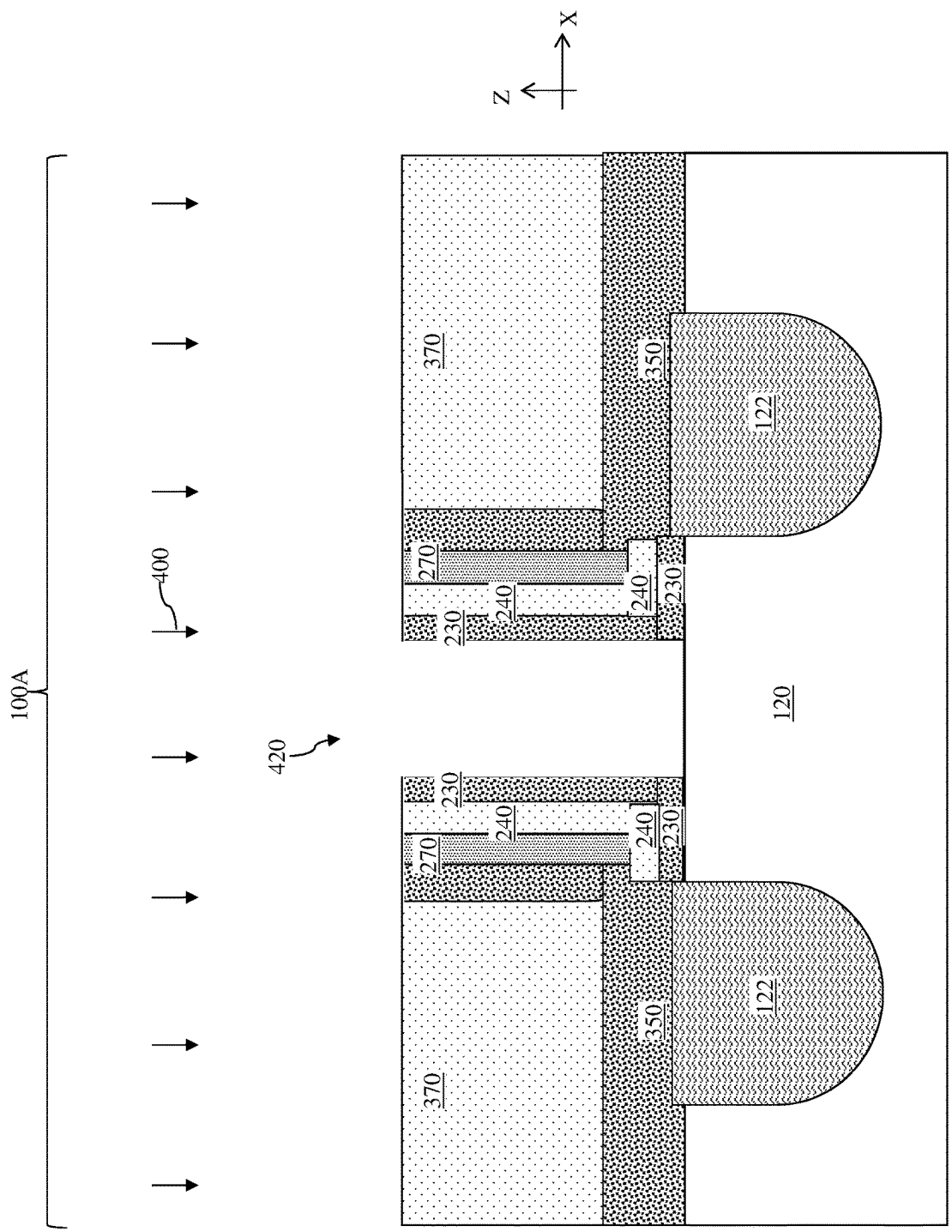
Figure 11B:
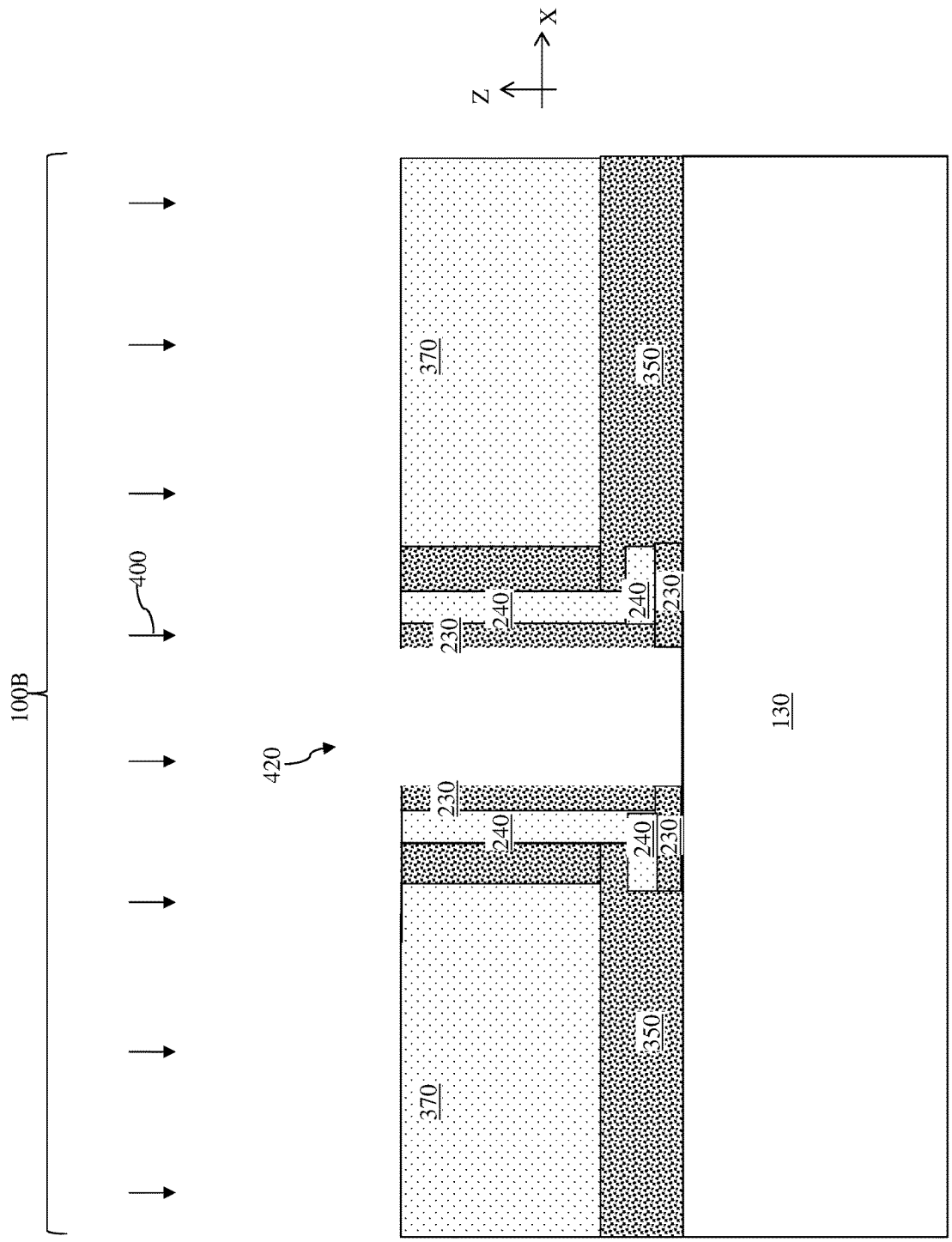

Referring now to FIGS. 11A and 11B, one or more etching processes 400 may be performed to remove the gate electrode 200 in both the device region 100A and the device region 100B. The etching processes 400 may be configured to have an etching selectivity between the gate electrode 200 and the other layers, such that the gate electrode 200 is etched away without substantially affecting the other layers. As a result, openings 420 are formed in both the device region 100A and the device region 100B.

Figure 12A:
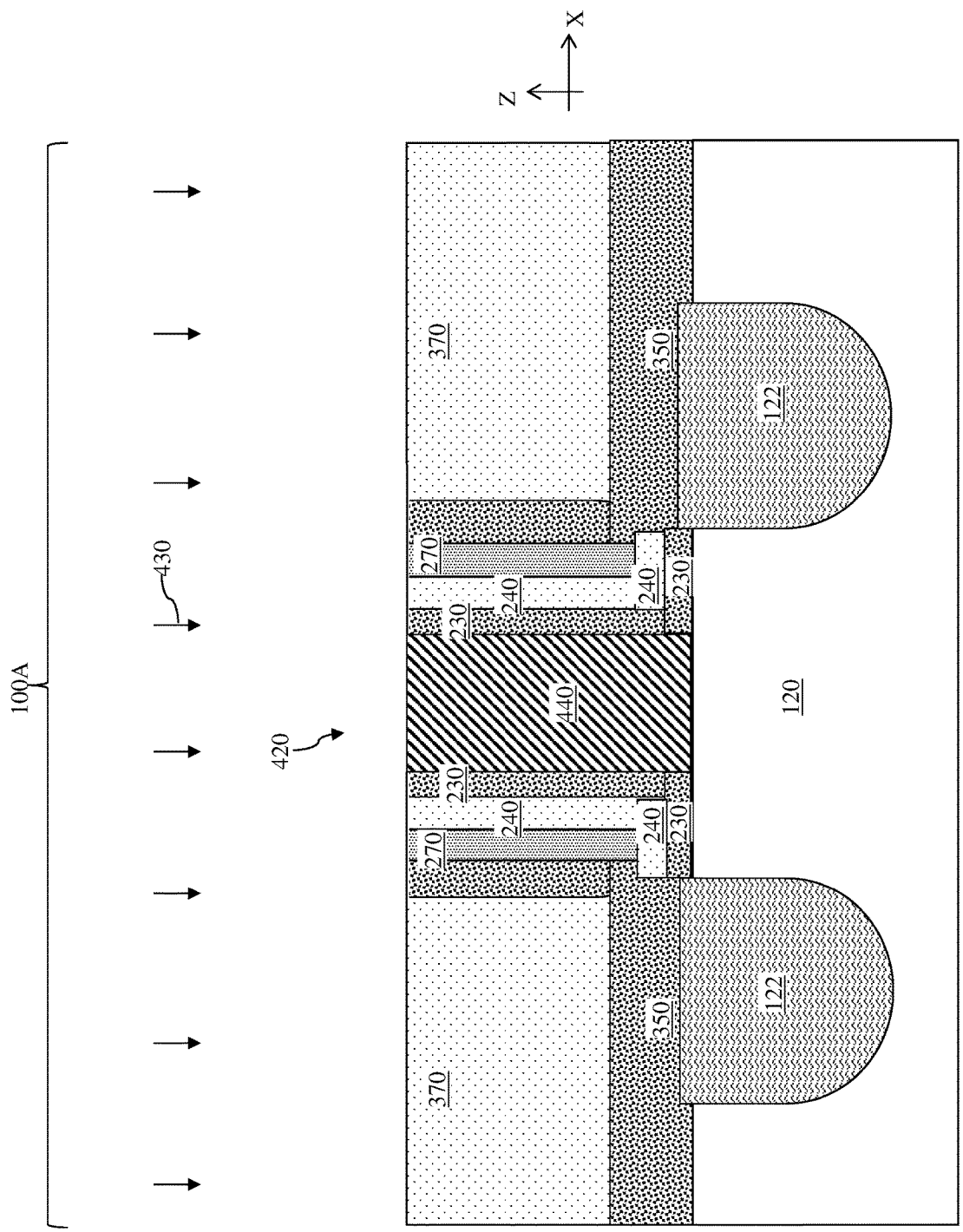
Figure 12B:
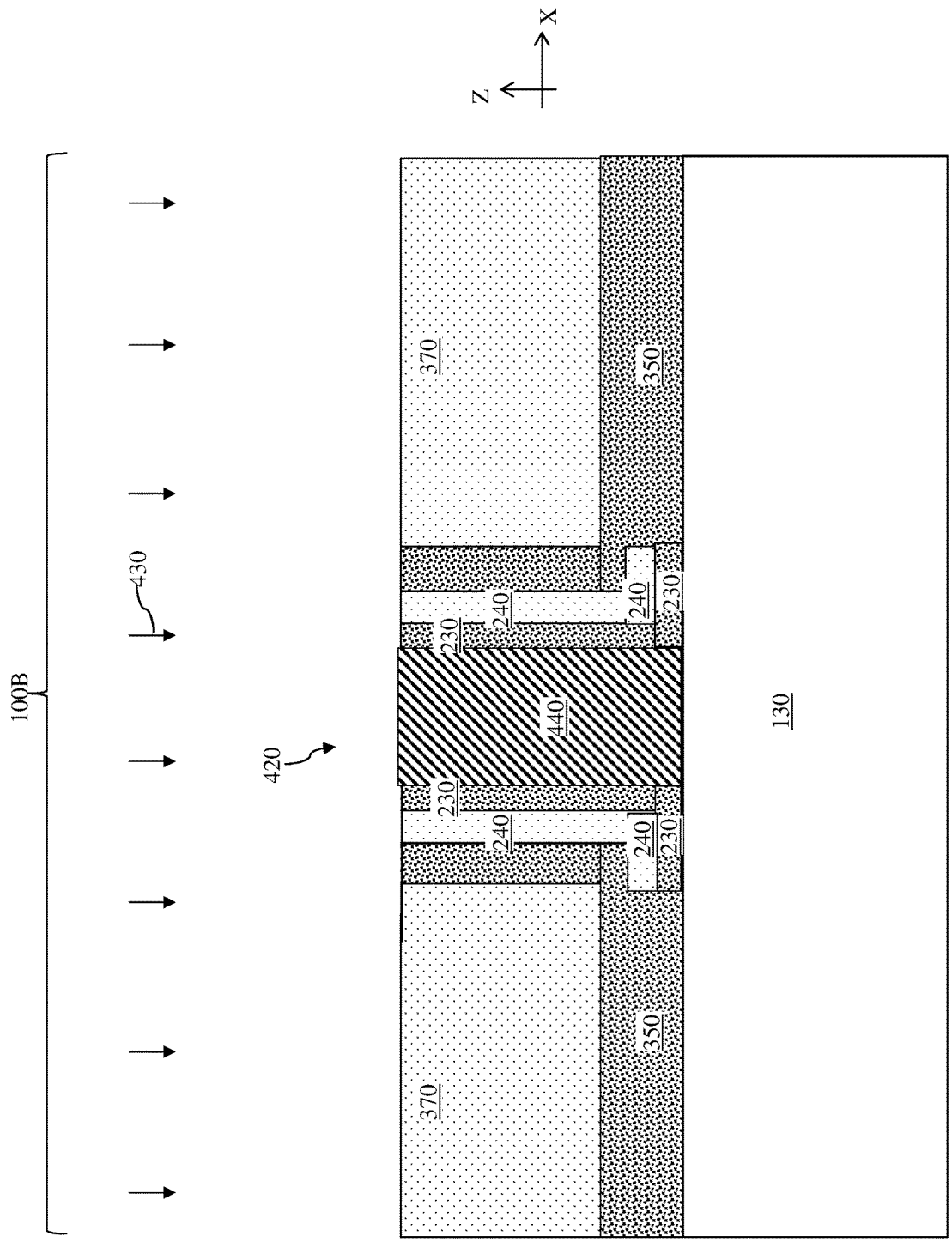

Referring now to FIGS. 12A and 12B, a gate replacement process 430 is performed to form a metal gate electrode 440 in each of the openings 420. The metal gate electrode 440 may include a work function metal layer and a bulk conductive layer (also referred to as a fill metal). In some embodiments, the work function metal layer may include a p-type or an n-type work function material, such as TiN, TaN, Ru, Mo, Al, WN, $ZrSi_2$, $MoSi_2$, $TaSi_2$, $NiSi_2$, WN, Ti, Ag, TaAl, TaAlC, TiAlN, TaC, TaCN, TaSiN, Mn, Zr, or combinations thereof. In some embodiments, the bulk conductive layer may include Cu, W, Al, Ru, Co, or combinations thereof.

Although not specifically shown herein for reasons of simplicity, a high-k dielectric layer may be formed below the metal gate electrode 440 either before, or during, the gate replacement process 430. The high-k dielectric layer includes a dielectric material having a dielectric constant greater than that of silicon oxide. In some embodiments, the high-k dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), or combinations thereof. Furthermore, additional layer such as interfacial layers, barrier layers, hard mask layers, or combinations thereof may be formed. It is also understood that the gate replacement process may include a CMP process performed to remove excess materials from the metal gate electrode 440 (or other materials), so as to planarize a top surface of the semiconductor structure 90.

Figure 13A:
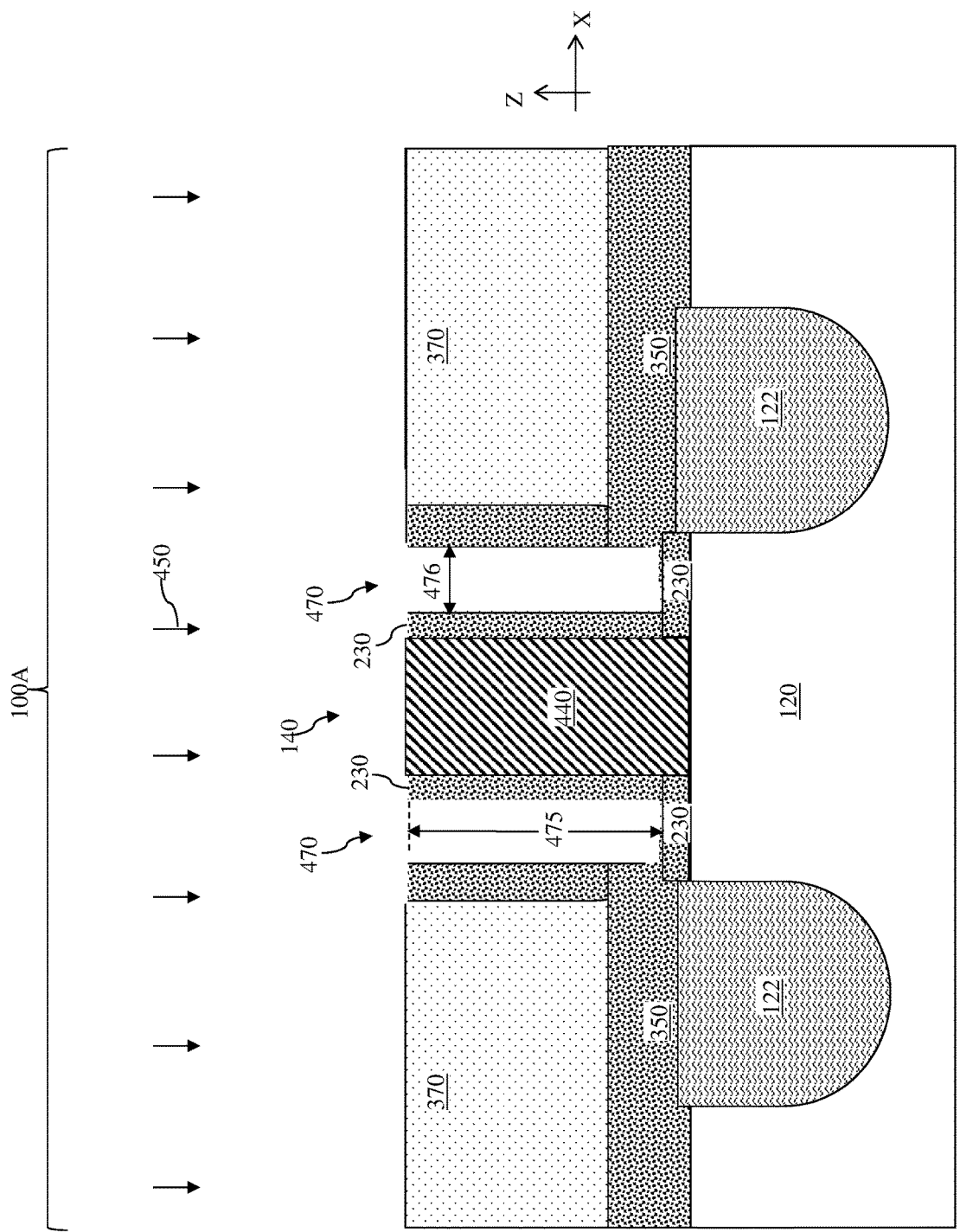
Figure 13B:
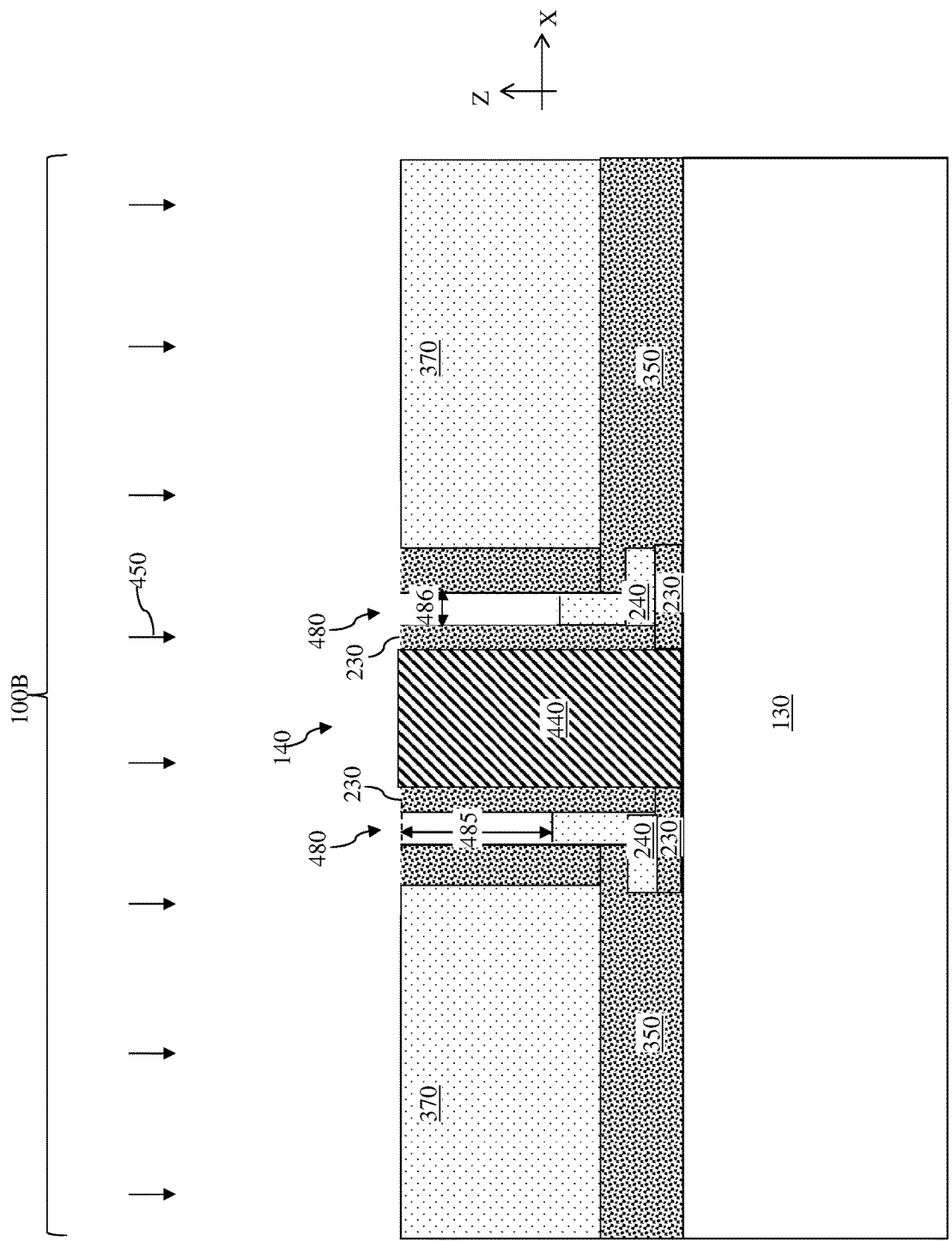

Referring now to FIGS. 13A and 13B, one or more etching processes 450 may be performed. The etching processes may use HF, $H_2O$, He, and/or $N_2$ as etchants. The liner 270 is configured to have a high etching rate in the etching processes 450, for example an etching rate greater than the dielectric layer 370, the gate spacers 350 and 230, and the metal gate electrode 440. As such, the liner 270 in the device region 100A can be removed very quickly. The removal of the liner 270 therefore forms trenches alongside the gate spacers 240 in the device region 100A, which allows the gate spacers 240 to be etched not just from the top but also from the side too. In other words, the gate spacers 240 are etched in a two-dimensional manner: from a top to bottom direction, as well as from a sideways direction. Consequently, the gate spacers 240 can also be removed quickly in the device region 100A. In some embodiments, the gate spacers 240 in the device region 100A are completely removed. Therefore, air spacers (air gaps) 470 are formed adjacent to the gate structure 140 in the device region 100A.

Meanwhile, the device region 100B lacks the liner 270. As a result, the gate spacers 240 in the device region 100B is etched from the top (but not from the side) during the etching processes 450. Consequently, the gate spacers 240 are partially etched in the device region 100B, even after the gate spacers 240 in the device region 100A may be completely etched away. As shown in FIGS. 13B, the partial removal of the gate spacers 240 lead to the formation of shallower (compared to the air spacers 470) air spacers 480 adjacent to the gate structure 140 in the device region 100B. Alternatively stated, the air spacers 470 in the device region 100A is formed to be deeper and wider than the air spacers 480 in the device region 100B. For example, the air spacers 470 may each have a vertical dimension (e.g., depth) 475 and a lateral dimension (e.g., width) 476, and the air spacers 480 may each have a vertical dimension (e.g., depth) 485 and a lateral dimension (e.g., width) 486. According to the various aspects of the present disclosure, the vertical dimension 475 is greater than the vertical dimension 485, and the lateral dimension 476 is greater than the lateral dimension 486 in some embodiments but less than the lateral dimension 486 in other embodiments. In some embodiments, a ratio between the dimensions 485 and 475 (e.g., the dimension 485 divided by the dimension 475) is in a range between about 0:1 and about 3:10. In some embodiments, a ratio between the dimensions 486 and 476 (e.g., the dimension 486 divided by the dimension 476) is in a range between about 1:10 and about 4:1. These ranges are tuned so as to optimize the dielectric values of the air spacers 470 and 480.

The vertical dimensions 475 and 485 may be tuned at least in part by adjusting the parameters of the etching processes 450, and the lateral dimensions 476 and 486 may be tuned at least in part by configuring the thicknesses of the liner 270 and the gate spacers 240. The different (and tunable) depths and widths of the air spacers 470 and 480 allow the dielectric value of the air spacers 470 and 480 to be configured differently for the different types of devices in the device regions 100A and 100B, respectively, in order to optimize device performance in the different device regions 100A and 100B.

The implementation of the liner 270 to facilitate the formation of the air spacer 470 is especially helpful in embodiments when the aspect ratio of the air spacer 470 is high. In that regard, the aspect ratio may be defined as the vertical dimension 475 divided by the lateral dimension 476. When the aspect ratio is high, for example greater than or equal to about 10:1, it may be difficult to completely etch away the gate spacers 240 in the device region 100A (where the complete removal of the gate spacers 240 may be desired). As discussed above, the liner 270 is configured to be easily etchable, and its removal before the gate spacers 240 allows the etching of the spacers 240 to be performed more efficiently and more effectively. Furthermore, the presence of the liner 270 besides the gate spacers 240 lowers the aspect ratio (since it effectively increases the lateral dimension 476 of the air spacer), which makes the etching easier as well. For these reasons, the formation of the air spacers 470 is easier according to the present disclosure. In addition, the selective implementation of the liner 270 in the device region 100A but not in the device region 100B allows the depths or vertical dimensions of the air spacers 470 and 480 to be tuned individually or separately. For example, the air spacer 470 may be formed to have one size, while the air spacer 480 may be formed to have another size, due to the incomplete removal of the gate spacer 240 in the device region 100B.

In addition to achieving high aspect ratio air spacers and tunable air spacer sizes in different device regions, the present disclosure also reduces the potential collapse of the gate structure 140. In that regard, the gate structure 140 may need to be formed with a high aspect ratio (height of the gate structure over the width of the gate structure) too, particularly the gate structure in the device region 100B in some embodiments. The high aspect ratio translates into a high center of gravity of the gate structure 140, and the gate structure 140 may also be more susceptible to various forces during semiconductor fabrication such as capillary forces or other movements, which could lead to a collapse of the gate structure 140. In some cases, the etching process 450 may also contribute to the potential collapse of the gate structure 140, particularly in conventional processes where the etching process would have to be performed for a much longer duration in order to form a desired air spacer. The present disclosure alleviates these problems since the etching process 450 does not need to be performed very long for the desired air spacers 470 and 480 to be formed. In addition, the fact that the air spacers 480 are formed to not have such a deep vertical dimension 485 (due to the incomplete removal of the gate spacers 240) also reduces the likelihood of the gate structure 140 collapsing in the device region 100B, since the lower portion of the gate structure 140 is effectively "held" in place at least in part by the remaining portions of the gate spacers 240 in the device region 100B.

Figure 14A:
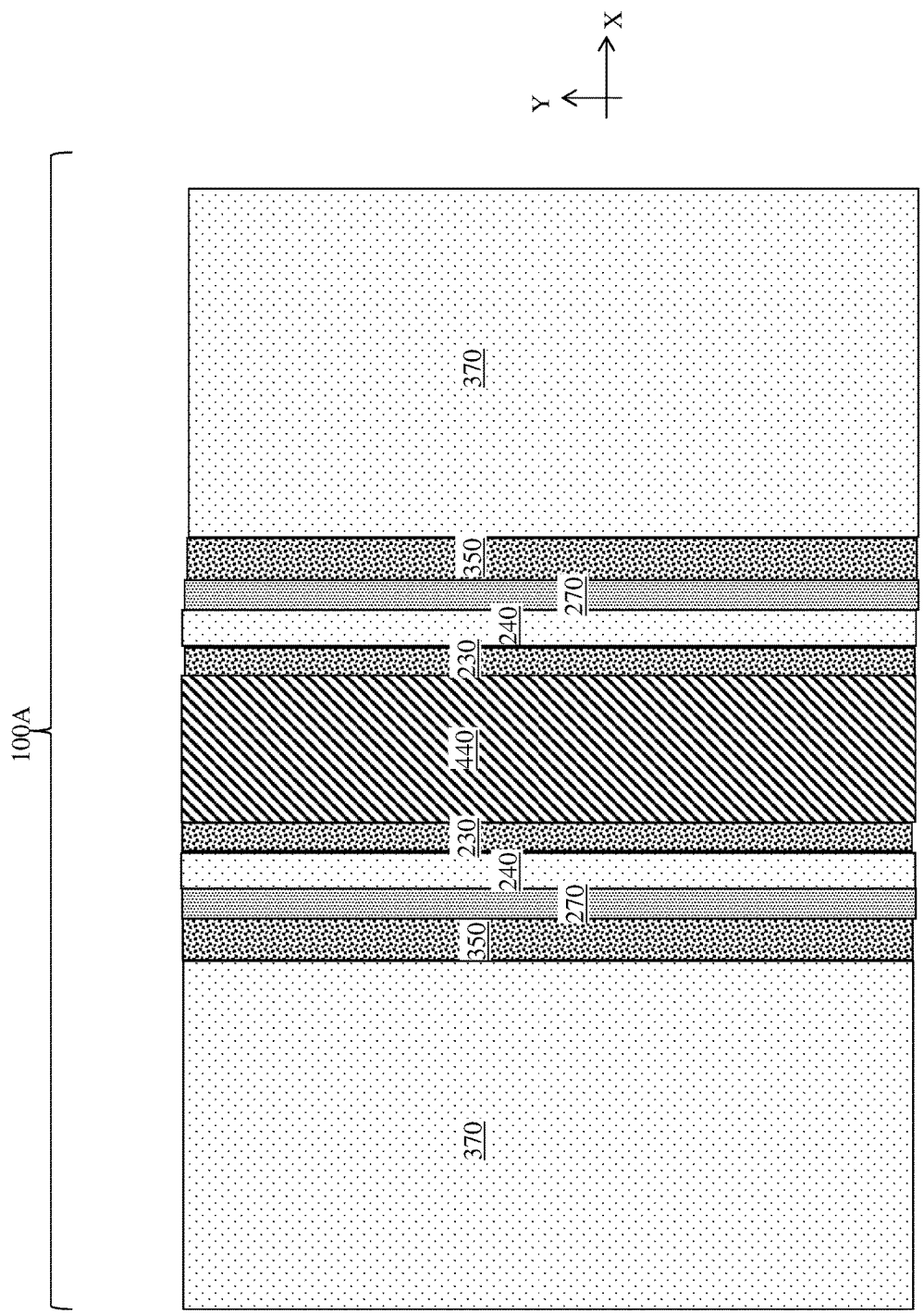
Figure 14B:
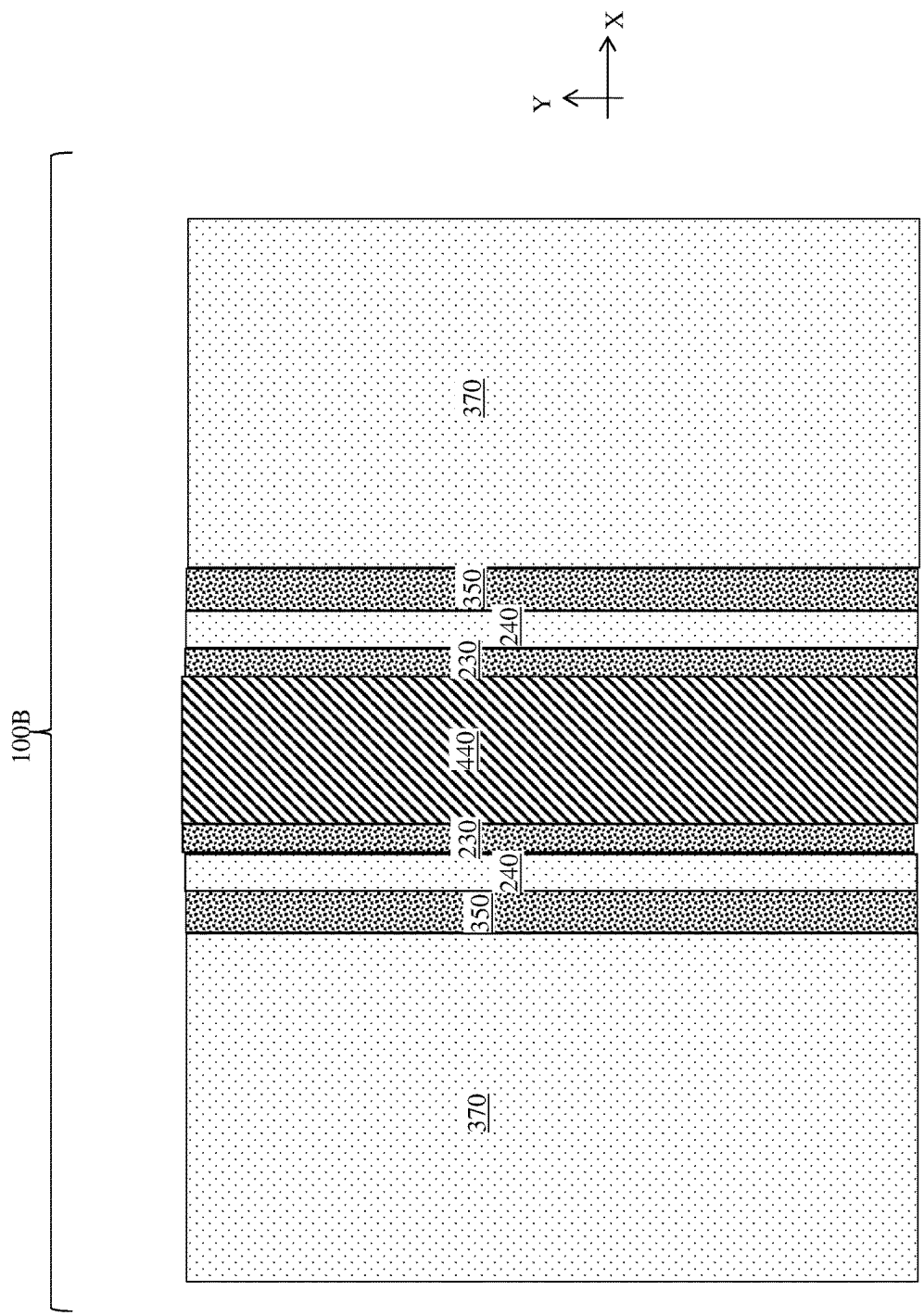

FIGS. 14A-14B and 15A-15B illustrate top views of the semiconductor structure 90 corresponding to FIGS. 12A-12B and 13A-13B, respectively. As shown in FIG. 14A, the liner 270 is disposed between the gate spacers 240 and 350 in the device region 100A. As shown in FIG. 14B, the device region 100B lacks the liner 270 (because it had already been removed in an earlier etching process 310 discussed above with reference to FIG. 6B). Thus, the gate spacers 240 are disposed between the gate spacers 230 and 350.

Figure 15A:
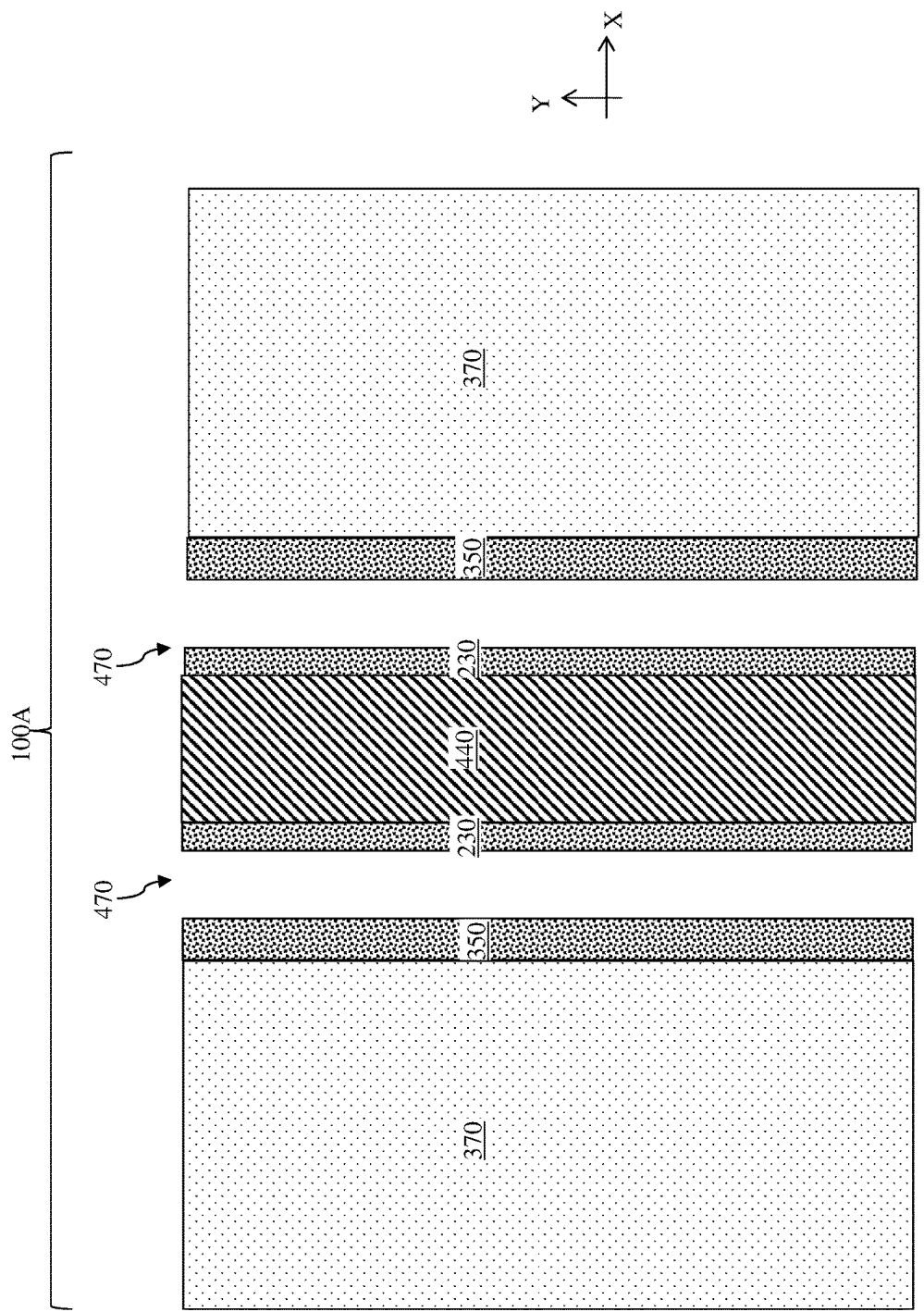
Figure 15B:
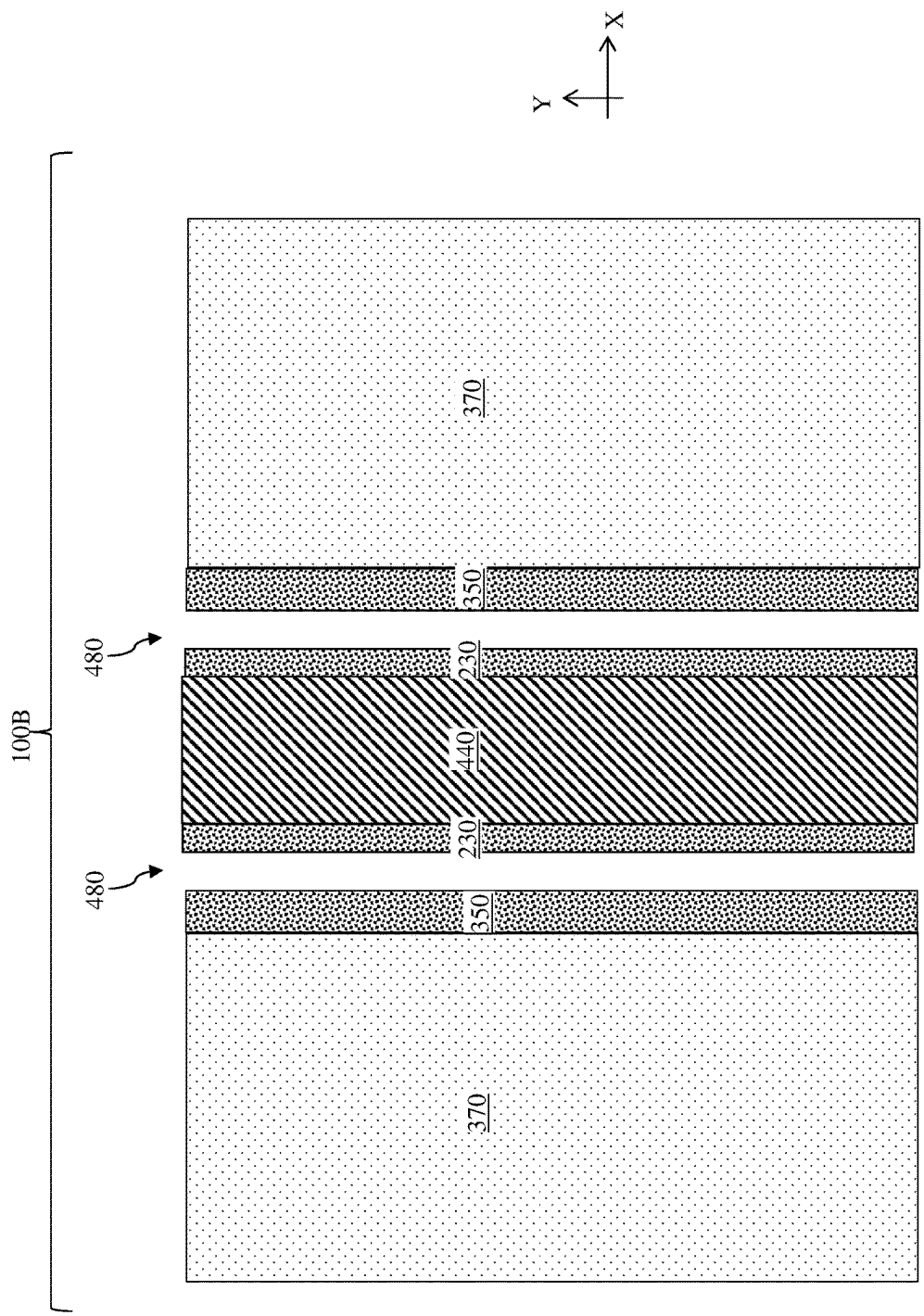
Figure 16A:
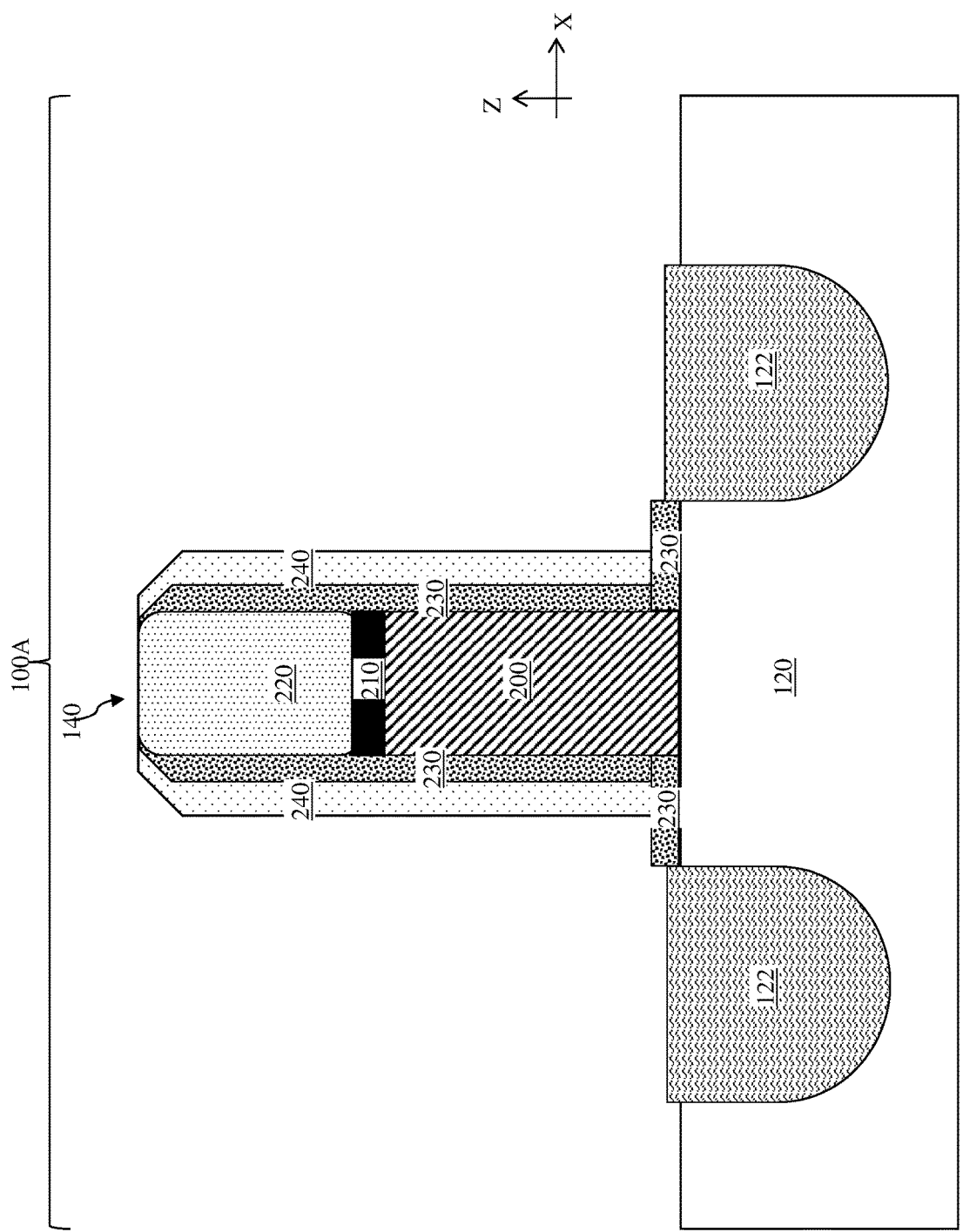
Figure 16B:
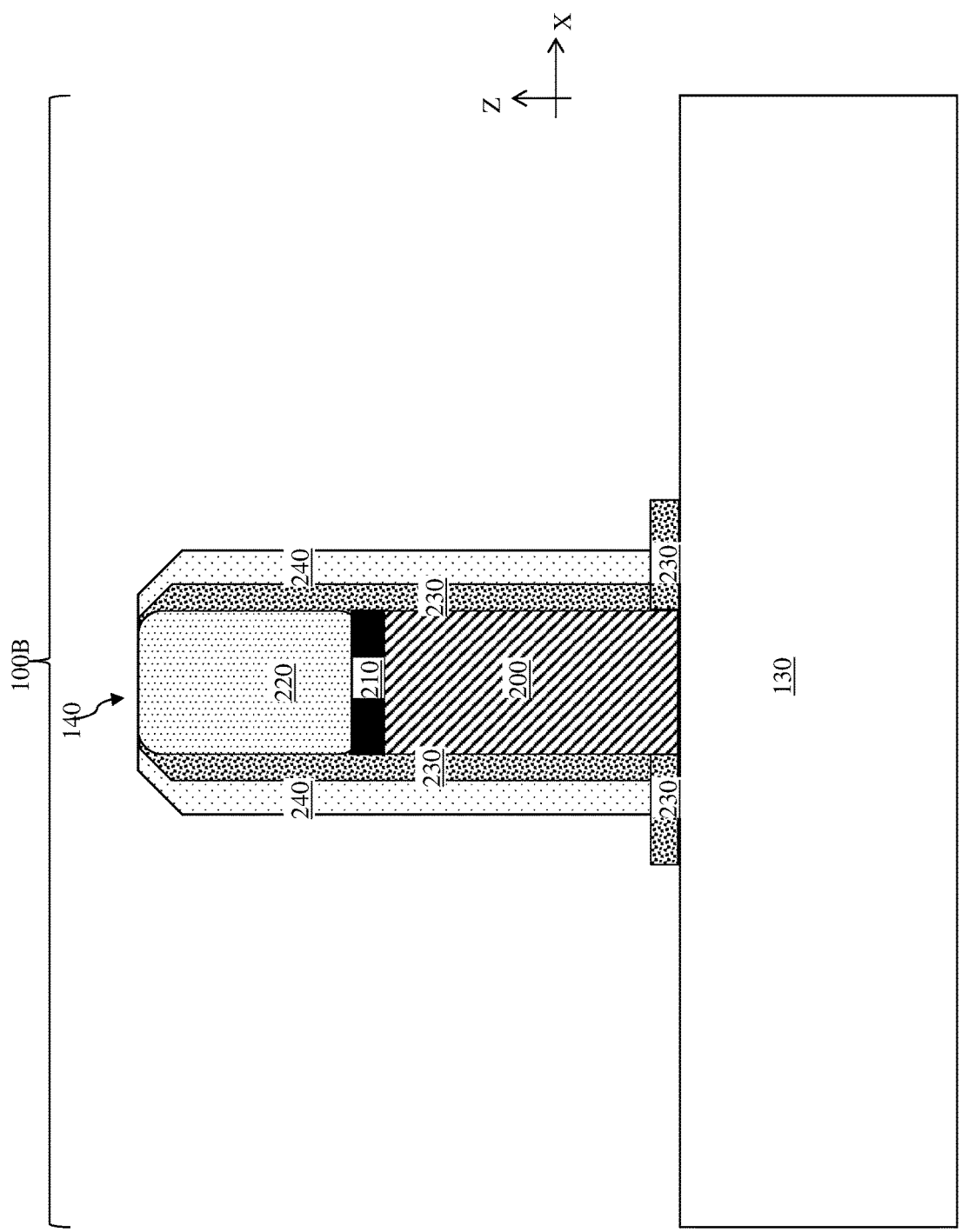

As shown in FIG. 15A, the removal of the liner 270 facilitates the etching of the gate spacers 240 (e.g., from a top direction and from a side direction), which forms air spacers 470 between the gate spacers 230 and 350 in the device region 100A. Meanwhile, as shown in FIG. 15B, the lack of the liner 270 in the device region 100B means that the gate spacers 240 are etched more slowly compared to the device region 100A. Consequently, the air spacers 480 are formed between the gate spacers 230 and 350 in the device region 100B. As discussed above with reference to FIGS. 13A-13B, the air spacers 480 are shallower and narrower than the air spacers 470.

It is understood that although the discussions above show the liner 270 as being formed between the gate spacers 240 and the gate spacers 350, it is not required. In other embodiments, the liner 270 can be formed between the gate spacers 230 and the gate spacers 240 as well. For example, the liner 270 may be formed on the gate spacers 230, and then the gate spacers 240 may be formed on the liner 270. This will not affect the intended functionality of the liner 270, because the removal of the liner 270 will still facilitate the sideways etching of the gate spacers 240, albeit from a different sideways direction. This embodiment of the present disclosure is discussed in more detail below with reference to FIGS. 31A-35A and 31B-35B.

FIGS. 16A-16B through 22A-22B illustrate an alternative embodiment of the present disclosure. For reasons of consistency and clarity, similar elements appearing in all embodiments are labeled the same. In this alternative embodiment, the processing is substantially the same as the embodiment corresponding to FIGS. 3A-3B through 15A-15B, except that no liner 270 is formed. In more detail, the semiconductor structure show in FIGS. 16A and 16B corresponds to the semiconductor structure shown in FIGS. 4A and 4B. For example, the gate spacers 230 and 240 have been formed in both the device region 100A and the device region 100B.

Figure 17A:
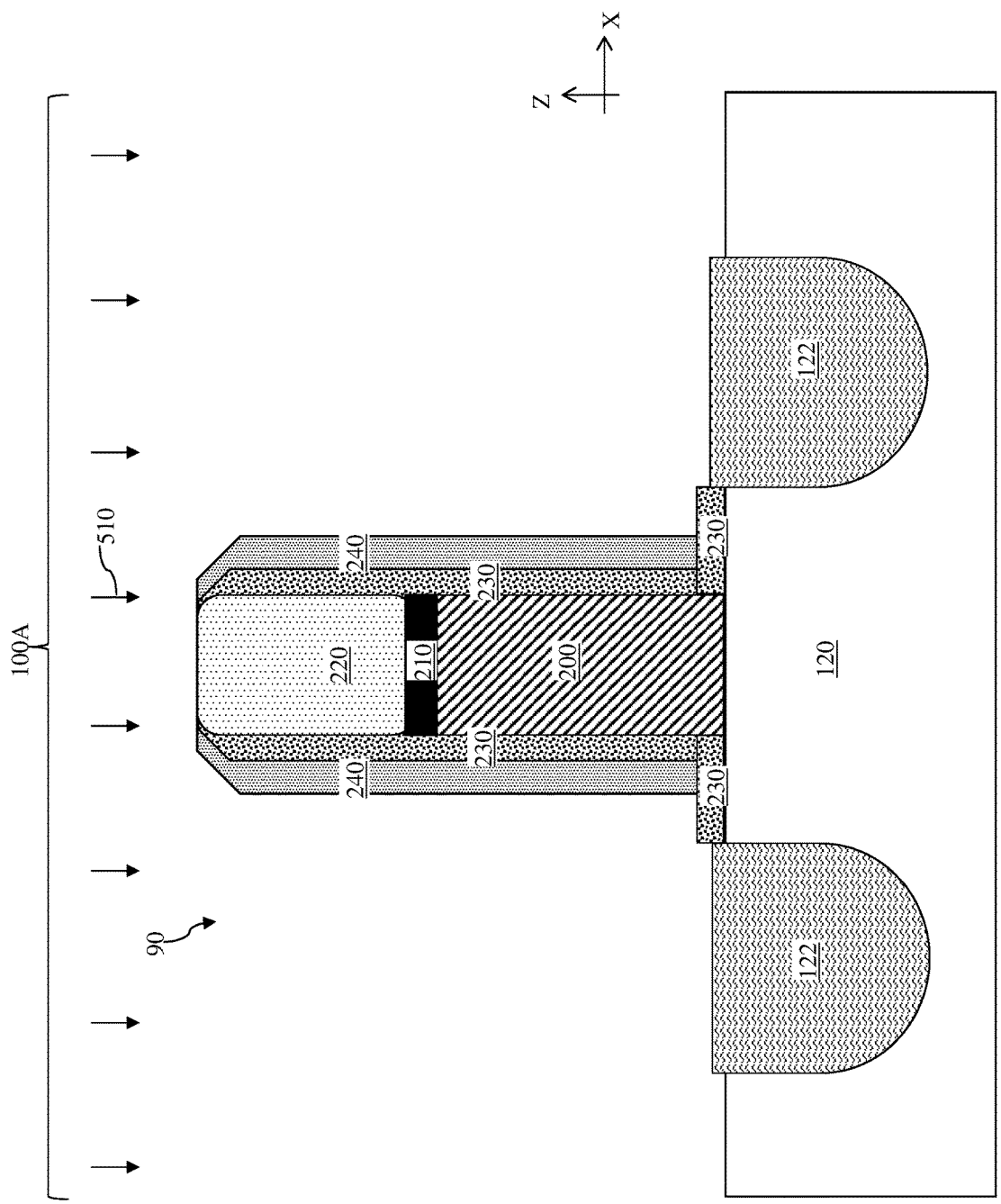
Figure 17B:
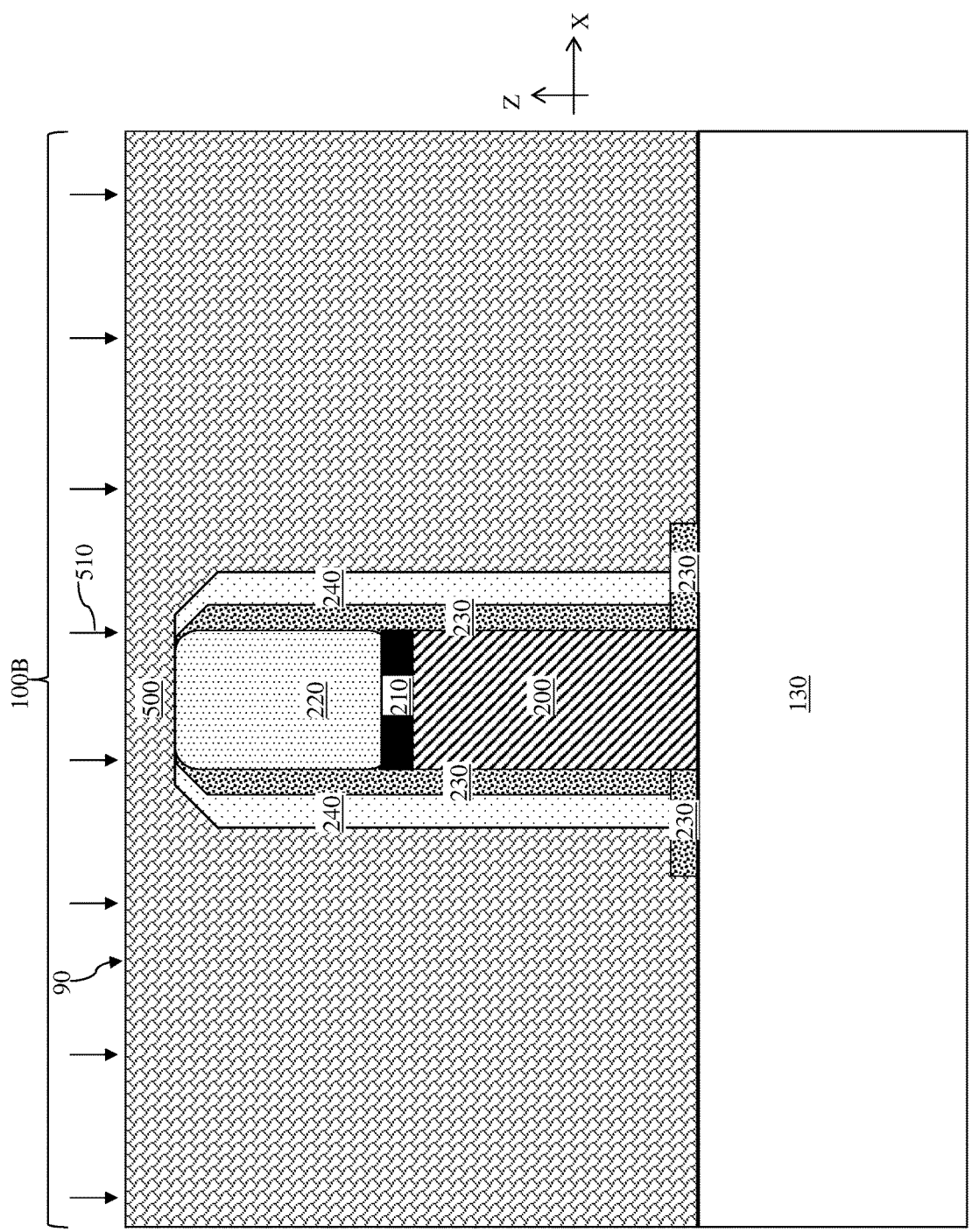

Referring now to FIGS. 17A and 17B, a patterned photoresist mask 500 is formed to cover up the device region 100B but not the device region 100A. A doping process 510 is then applied to the semiconductor structure 90 exposed in the device region 100A. The doping process 510 implants dopants into the gate spacers 240 to transform the gate spacers 240 in the device region 100A into a material that is also easily etchable in the later etching process. In other words, the transformed gate spacers 240 function similarly to the liner layer 270 discussed above, in that they have a higher etching rate than the other components such as the gate spacers 230 or 350, which facilitates the formation of the air spacers.

In some embodiments, the doping process 510 implants oxygen or phosphorous as the dopants into the gate spacers 240. In some embodiments, 20%-100% of the total thickness of the gate spacers 240 in the device region 100A is transformed. Meanwhile, since the gate spacers 240 in the device region 100B is protected by the patterned photoresist mask 500, they are not implanted with the dopants. Hence, the gate spacers 240 in the device region 100A have different properties (e.g., with respect to etching rate) than the gate spacers 240 in the device region 100B.

Figure 18A:
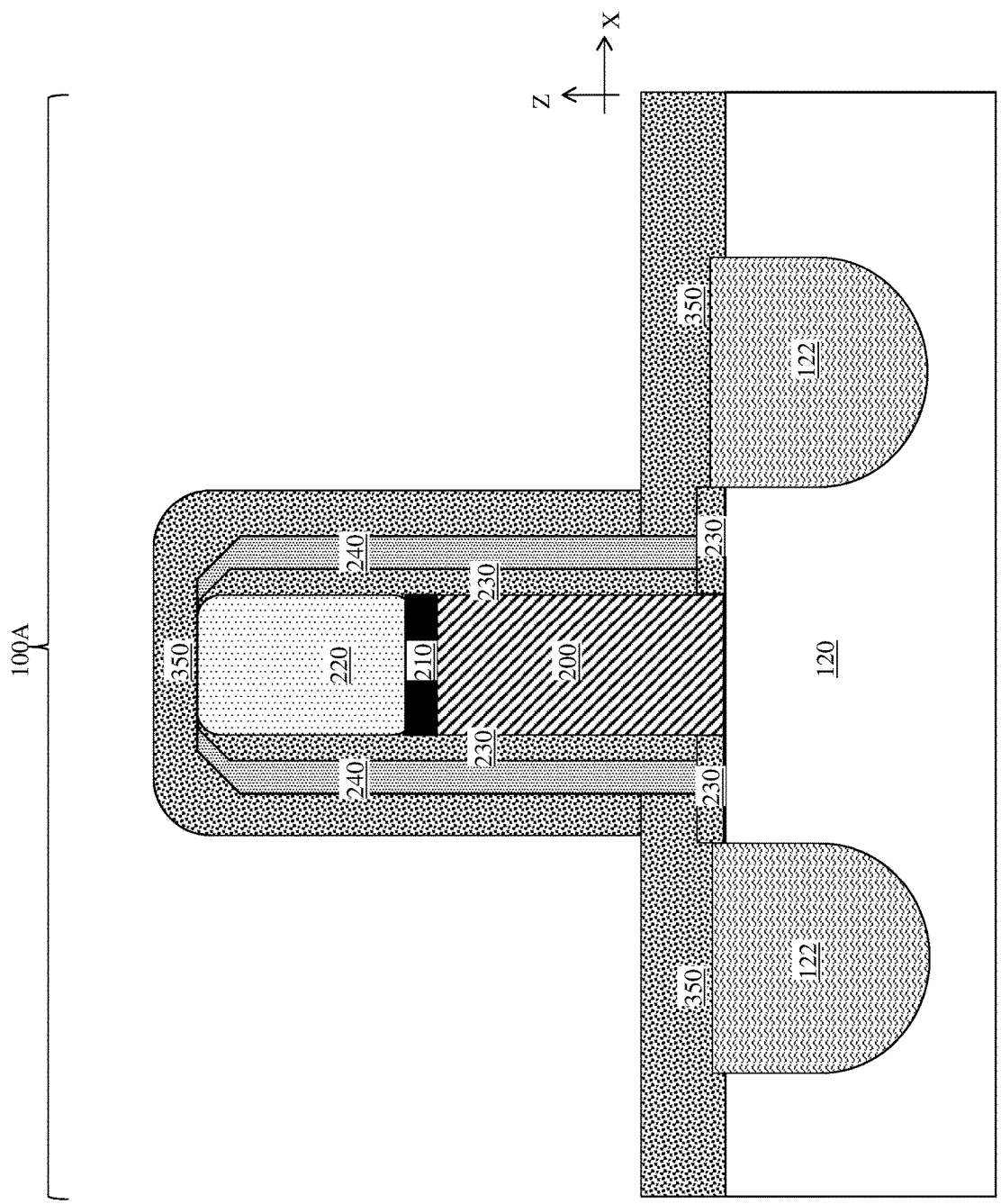
Figure 18B:
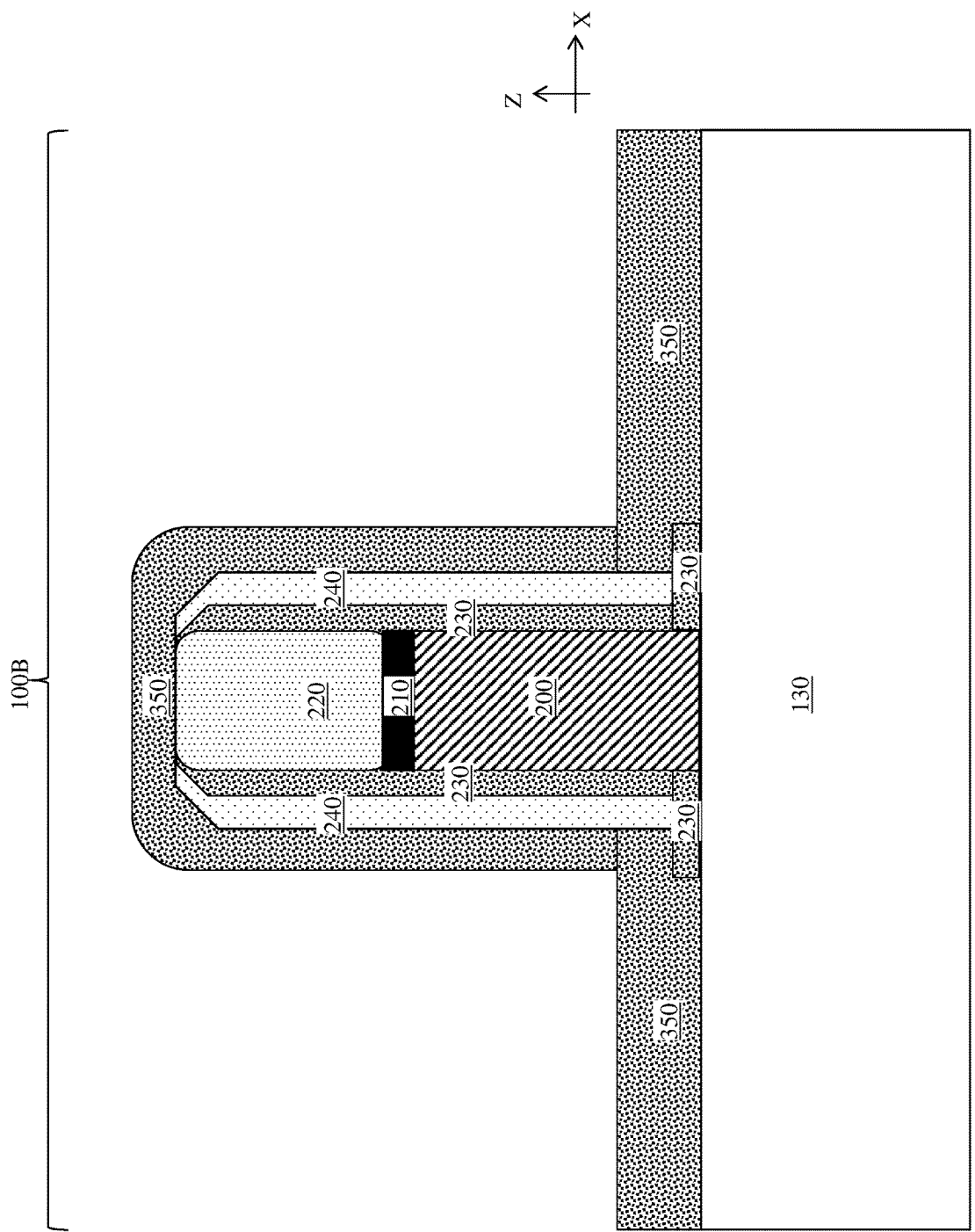

Referring now to FIGS. 18A and 18B, the patterned photoresist mask 500 is removed, for example via an ashing or stripping process. Thereafter, the spacer layer 350 (discussed above with reference to FIGS. 8A-8B) is formed in both the device region 100A and the device region 100B. Since no liner 270 was formed in the device region 100A, the spacer layer 350 is formed on the spacer layer 240 instead.

Figure 19A:
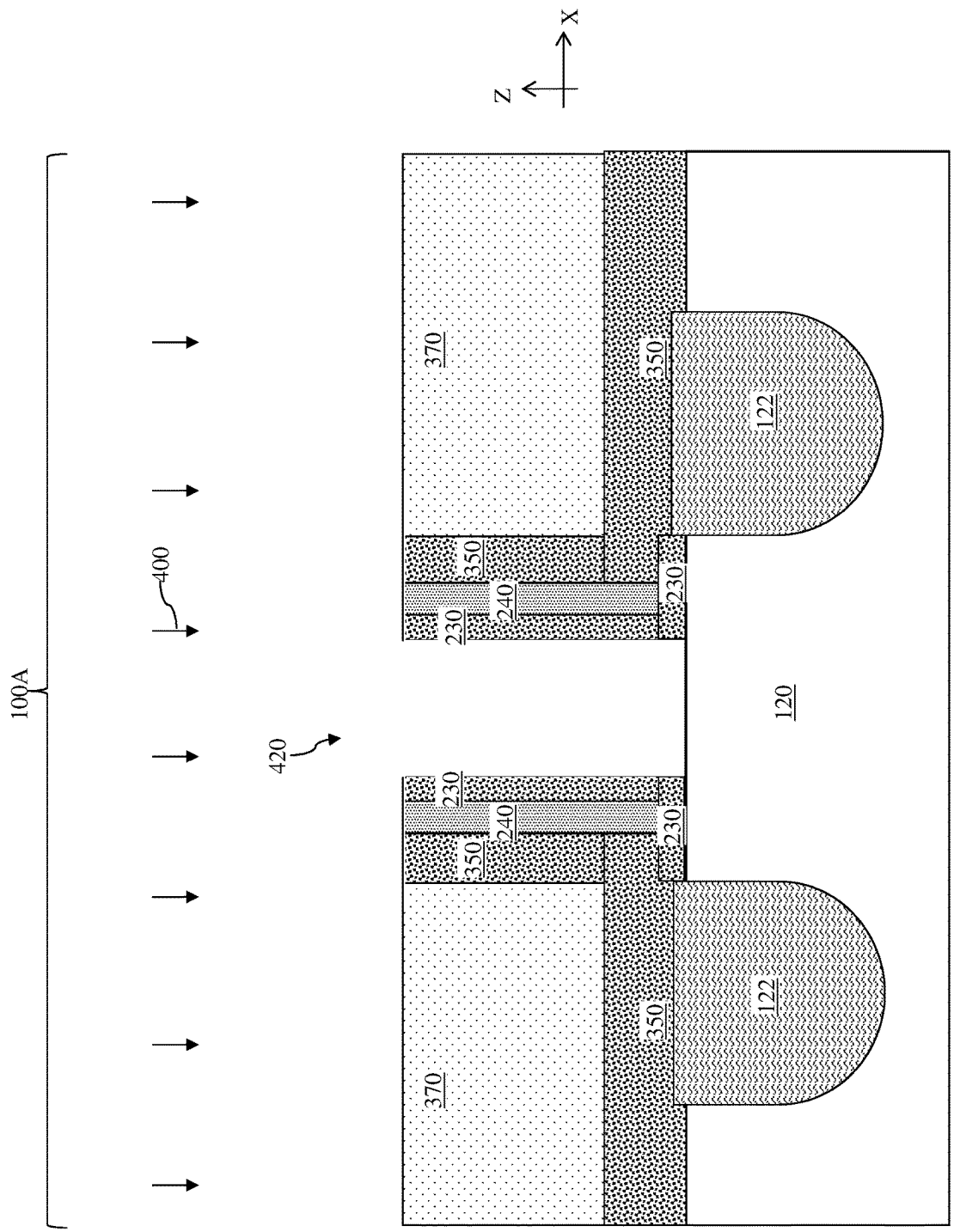
Figure 19B:
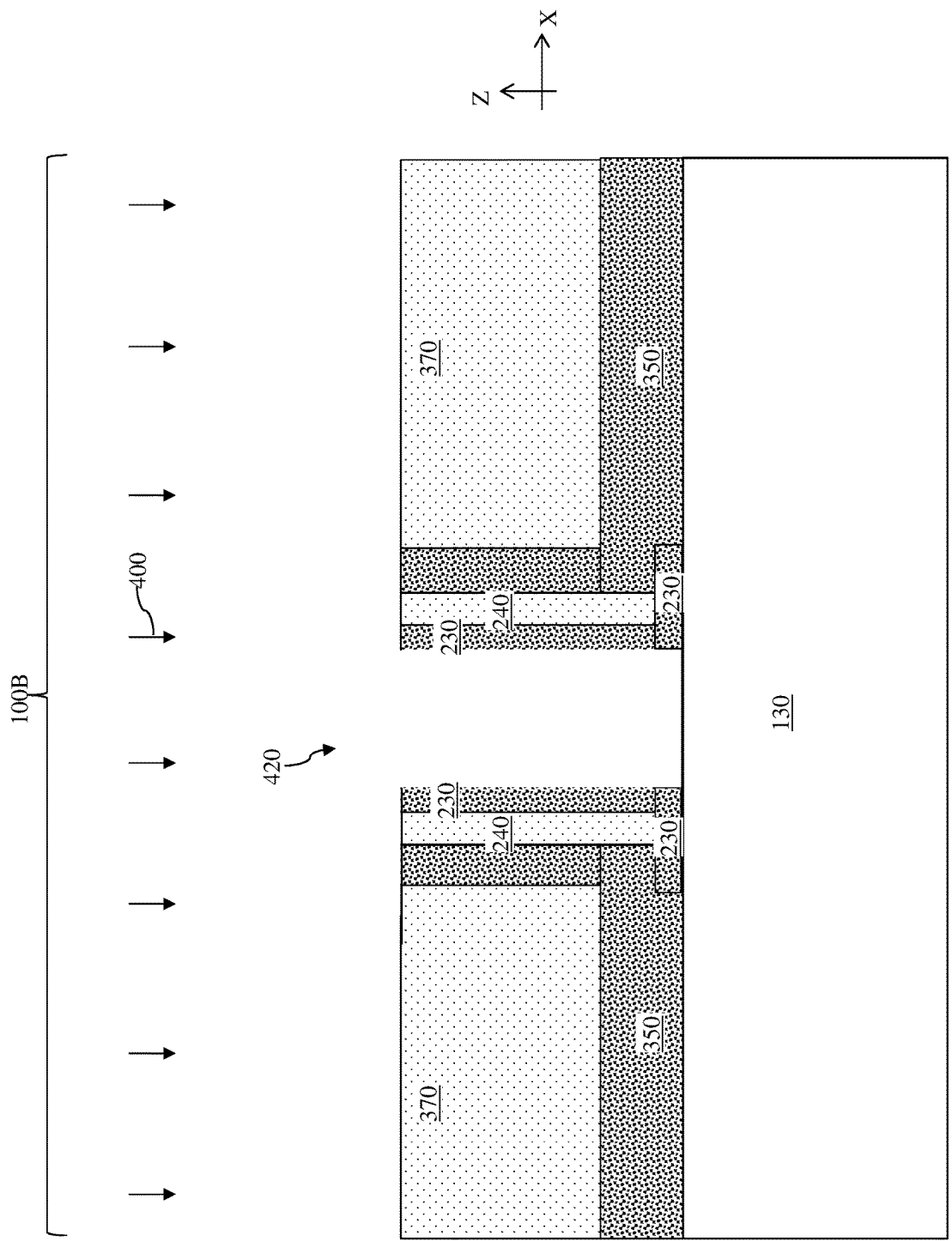

Referring now to FIGS. 19A and 19B, the dielectric layer 370 is formed over the spacer layer 350 in both the device region 100A and the device region 100B. A CMP process is performed to planarize the upper surfaces of the various layers in the device region 100A and in the device region 100B. The spacer layer 350 is now broken up into gate spacers 350, which have substantially co-planar upper surfaces with the gate spacers 230-240 and the dielectric layer 370. Thereafter, the one or more etching processes 400 are performed to remove the gate electrode 200 in both the device region 100A and the device region 100B, which forms openings 420 in both the device region 100A and the device region 100B.

Figure 20A:
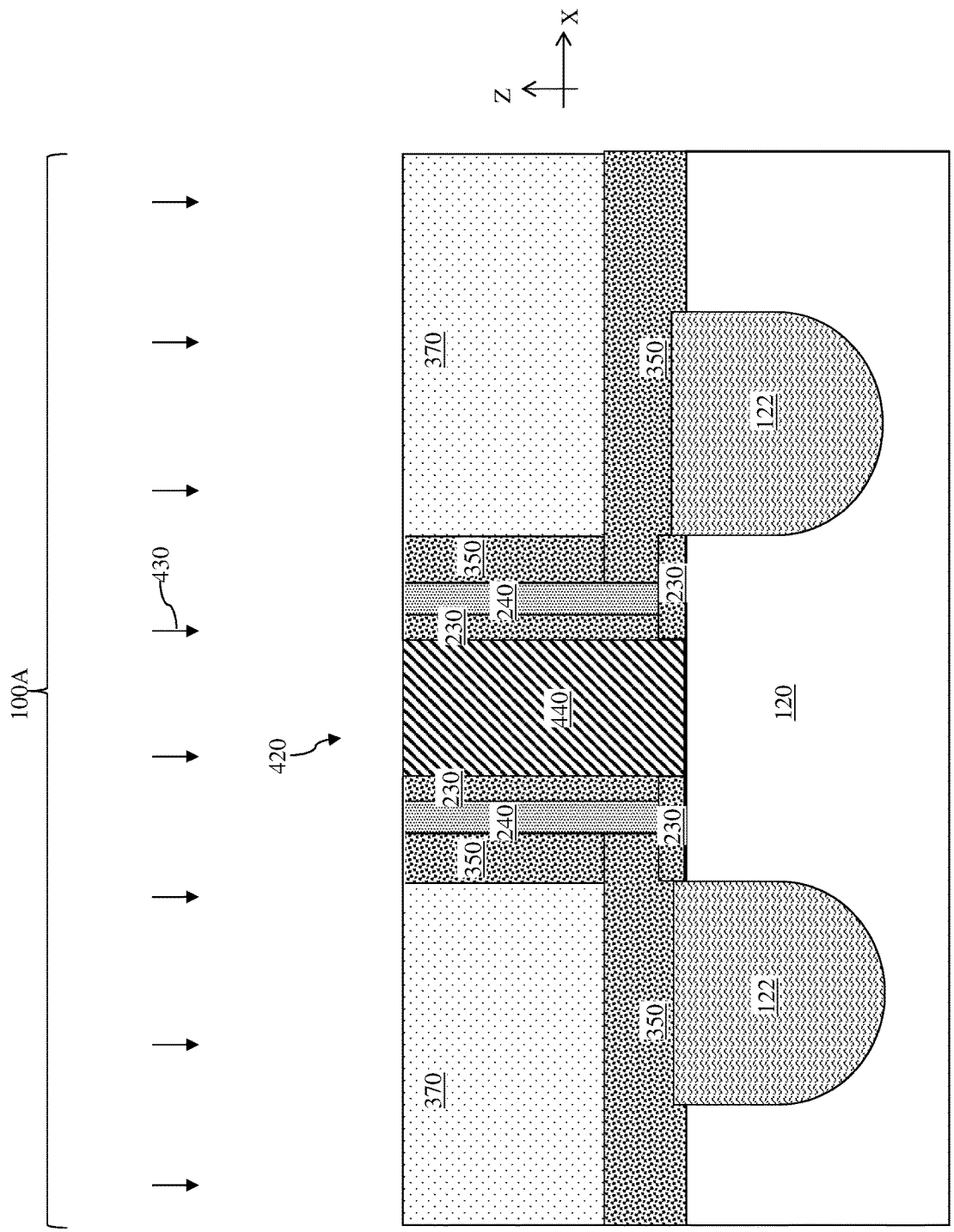
Figure 20B:
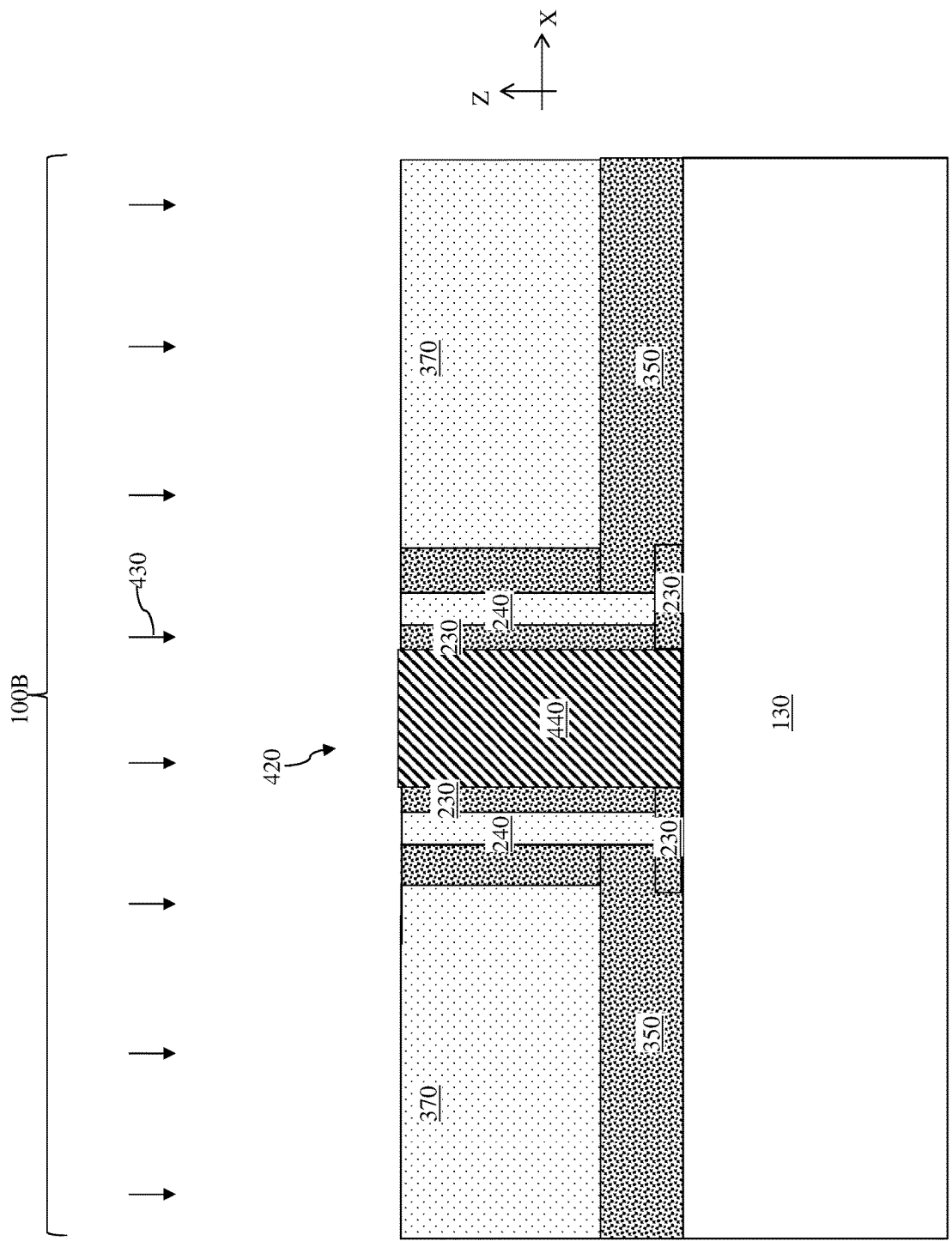

Referring now to FIGS. 20A and 20B, the gate replacement process 430 is performed to form the metal gate electrode 440 in each of the openings 420. The metal gate electrode 440 may include a work function metal layer and a bulk conductive layer (also referred to as a fill metal).

Figure 21A:
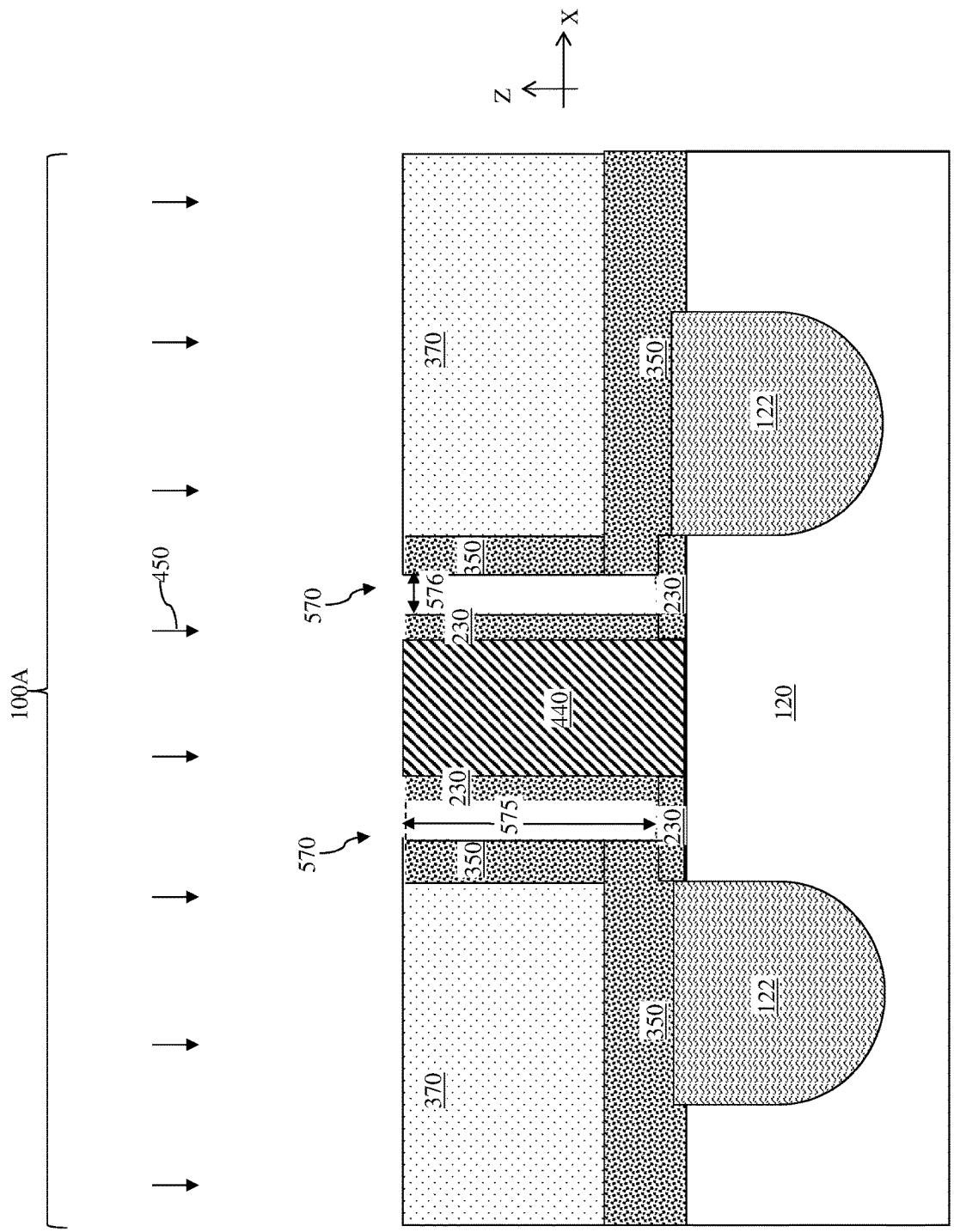
Figure 21B:
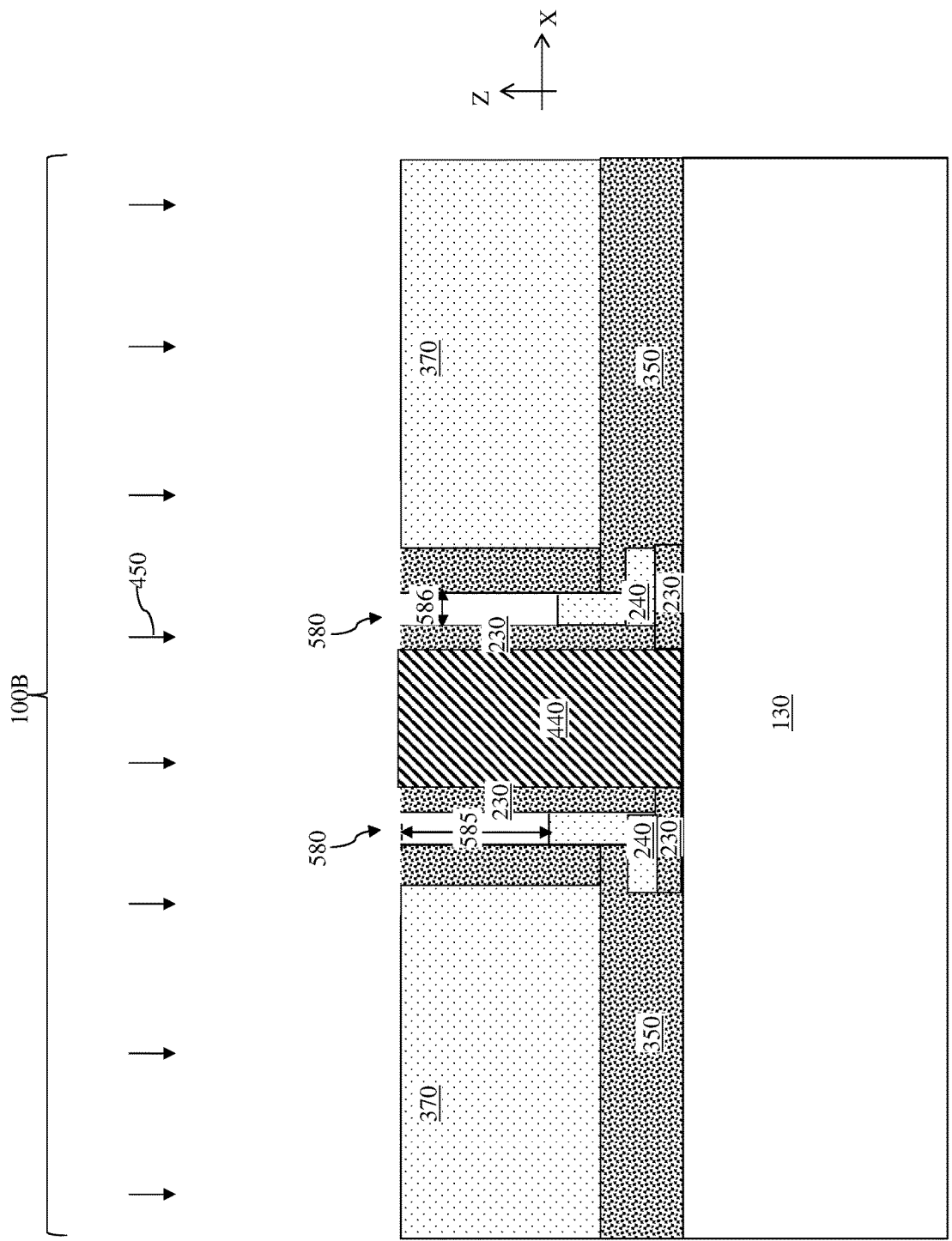

Referring now to FIGS. 21A and 21B, the one or more etching processes 450 may be performed. The etching processes may use HF, $H_2O$, He, and/or $N_2$ as etchants. As discussed above, after being treated with the dopants, the gate spacers 240 in the device region 100A have a high etching rate in the etching processes 450, for example an etching rate greater than the gate spacers 240 in the device region 100B, the dielectric layer 370, the gate spacers 230, and the metal gate electrode 440. As such, the gate spacers 240 in the device region 100A can be removed very quickly.

The removal of the gate spacers 240 forms air spacers (air gaps) 570 in the device region 100A. The air spacers 570 each have a vertical dimension 575 and a lateral dimension 576. Compared to the air spacers 470 formed in the previous embodiment (shown in FIG. 13A), the air spacers 570 may have a substantially similar vertical dimension but a smaller lateral dimension, which is due to the lack of the liner 270. In other words, the vertical dimension 575 may be approximately equal to the vertical dimension 475 (see FIG. 13A), while the lateral dimension 576 may be less than the lateral dimension 476 (see FIG. 13A). Of course, this is just a non-limiting example. In other embodiments, the lateral dimension 576 of the air spacers 570 may be increased by initially depositing a thicker spacer layer 240.

Meanwhile, the gate spacers 240 in the device region 100B were not treated with the dopants. As a result, the gate spacers 240 in the device region 100B is etched at a slower etching rate (compared to the gate spacers 240 in the device region 100A) during the etching processes 450. Consequently, the gate spacers 240 are only partially etched in the device region 100B, even after the gate spacers 240 in the device region 100A are completely etched away.

As shown in FIG. 21B, the partial removal of the gate spacers 240 in the device region 100B leads to the formation of shallower air spacers 580 in the device region 100B, as opposed to the deeper air spacers 570 in the device region 100A. Alternatively stated, the air spacers 570 in the device region 100A is formed to be deeper (but not necessarily wider) than the air spacers 580 in the device region 100B. For example, the air spacers 580 may each have a vertical dimension 585 and a lateral dimension 586. According to the various aspects of the present disclosure, the vertical dimension 575 is greater than the vertical dimension 585, but the lateral dimension 576 may be approximately the same as the lateral dimension 586. In some embodiments, the ratio between the vertical dimension 585 and the vertical dimension 575 may be in a range between about 0:1 and about 3:10.

Again, the vertical dimensions 575 and 585 may be tuned at least in part by adjusting the parameters of the etching processes 450, and the lateral dimensions 576 and 586 may be tuned at least in part by configuring the thickness of the initially deposited spacer layer 240. The different (and tunable) depths and widths of the air spacers 570 and 580 allow the dielectric value of the air spacers 570 and 580 to be configured differently for the different types of devices in the device regions 100A and 100B, respectively, in order to optimize device performance in the different device regions 100A and 100B. In addition, the alternative embodiment also reduces the likelihood of the gate structure 140 collapsing for reasons similar to those discussed above in association with the embodiment of FIGS. 3A-15A and 3B-15B.

Figure 22B:
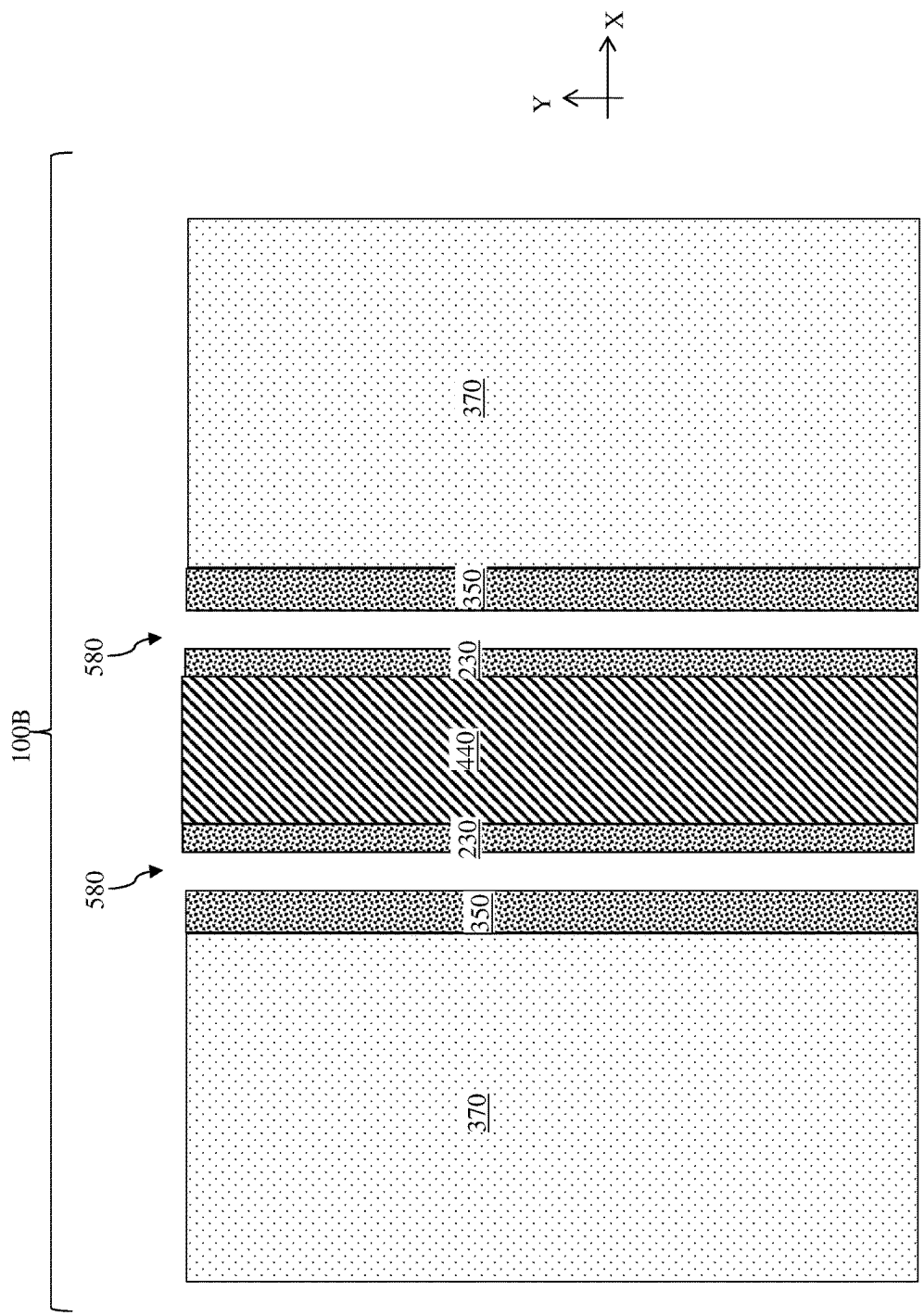
Figure 23A:
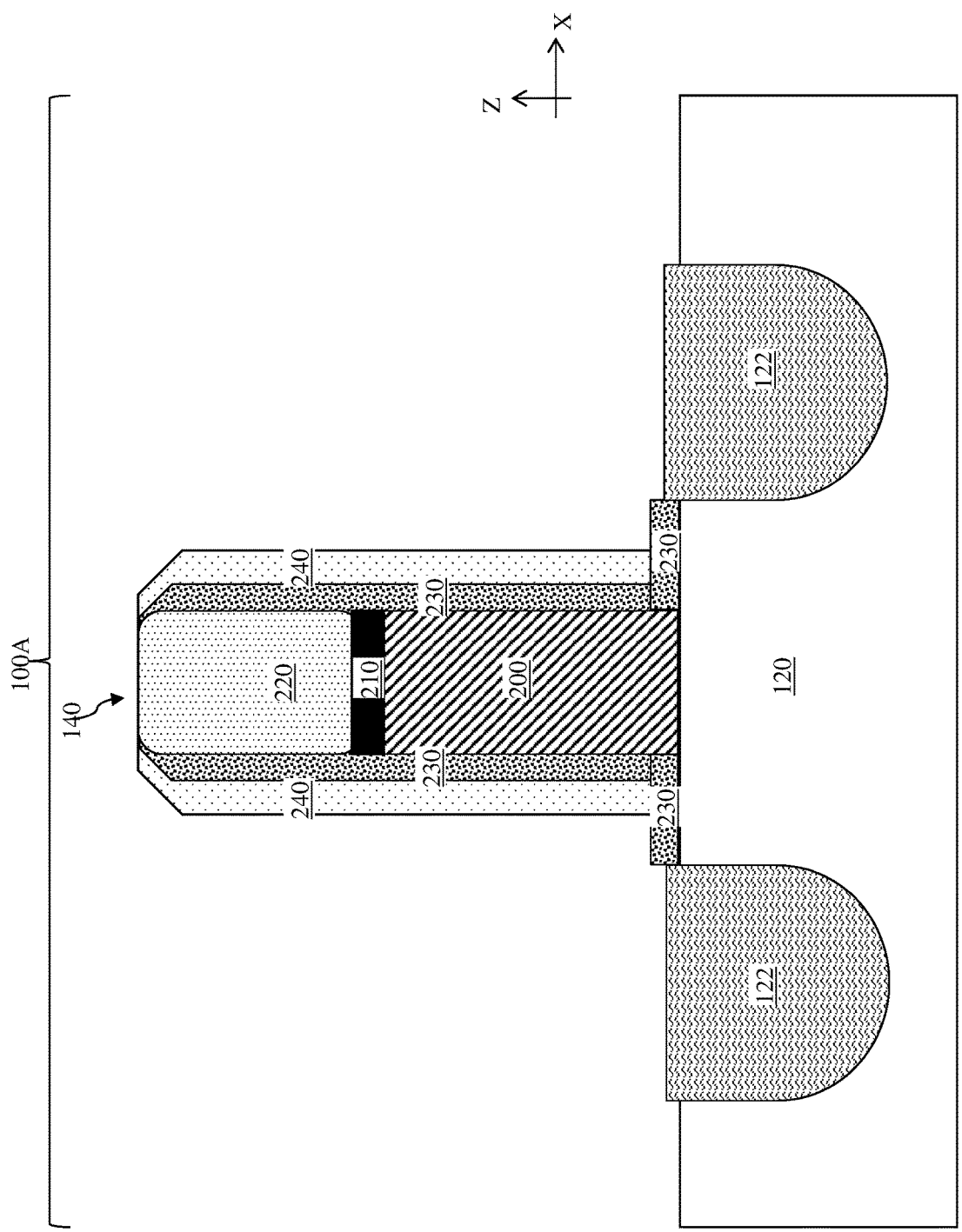
Figure 23B:
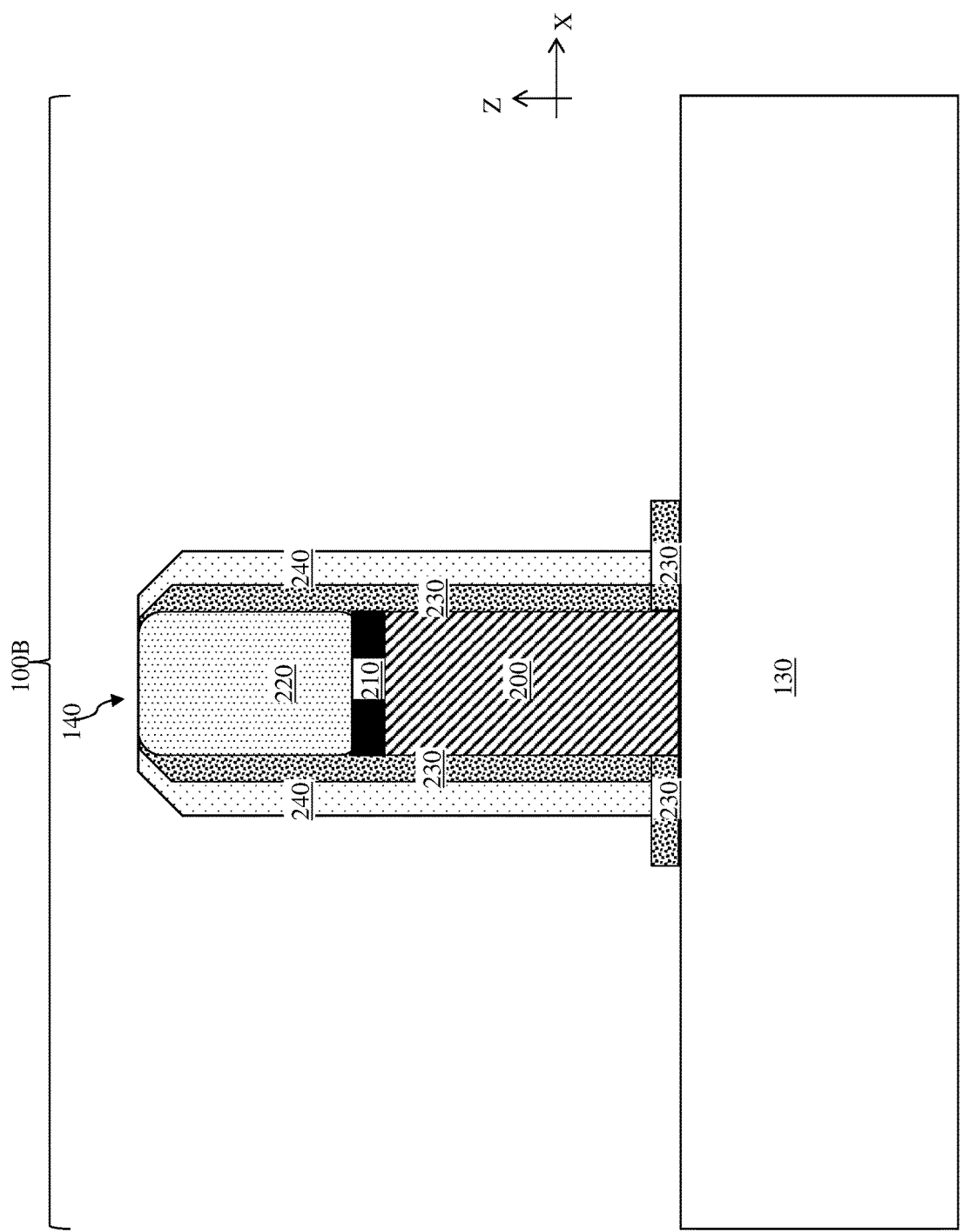

The top views of the semiconductor structure at this stage of fabrication are also illustrated in FIGS. 22A and 22B. The top views in FIGS. 22A-22B are substantially similar to the top views illustrated in FIGS. 15A-15B, except that the air spacers 570 shown in FIG. 22A may be narrower than the air spacers 470 shown in FIG. 15A.

FIGS. 23A-23B through 22A-22B illustrate yet another alternative embodiment of the present disclosure. For reasons of consistency and clarity, similar elements appearing in all embodiments are labeled the same. In this alternative embodiment, the processing steps are similar to the embodiment corresponding to FIGS. 16A-16B through 22A-22B, except that a doping process is applied to treat the gate spacers 240 in the device region 100B, rather than to treat the gate spacers 240 in the device region 100A. In more detail, the semiconductor structure show in FIGS. 23A and 23B corresponds to the semiconductor structure shown in FIGS. 16A and 16B (or FIGS. 4A and 4B). For example, the gate spacers 230 and 240 have been formed on sidewalls of the gate structures 140 in both the device region 100A and the device region 100B.

Figure 24A:
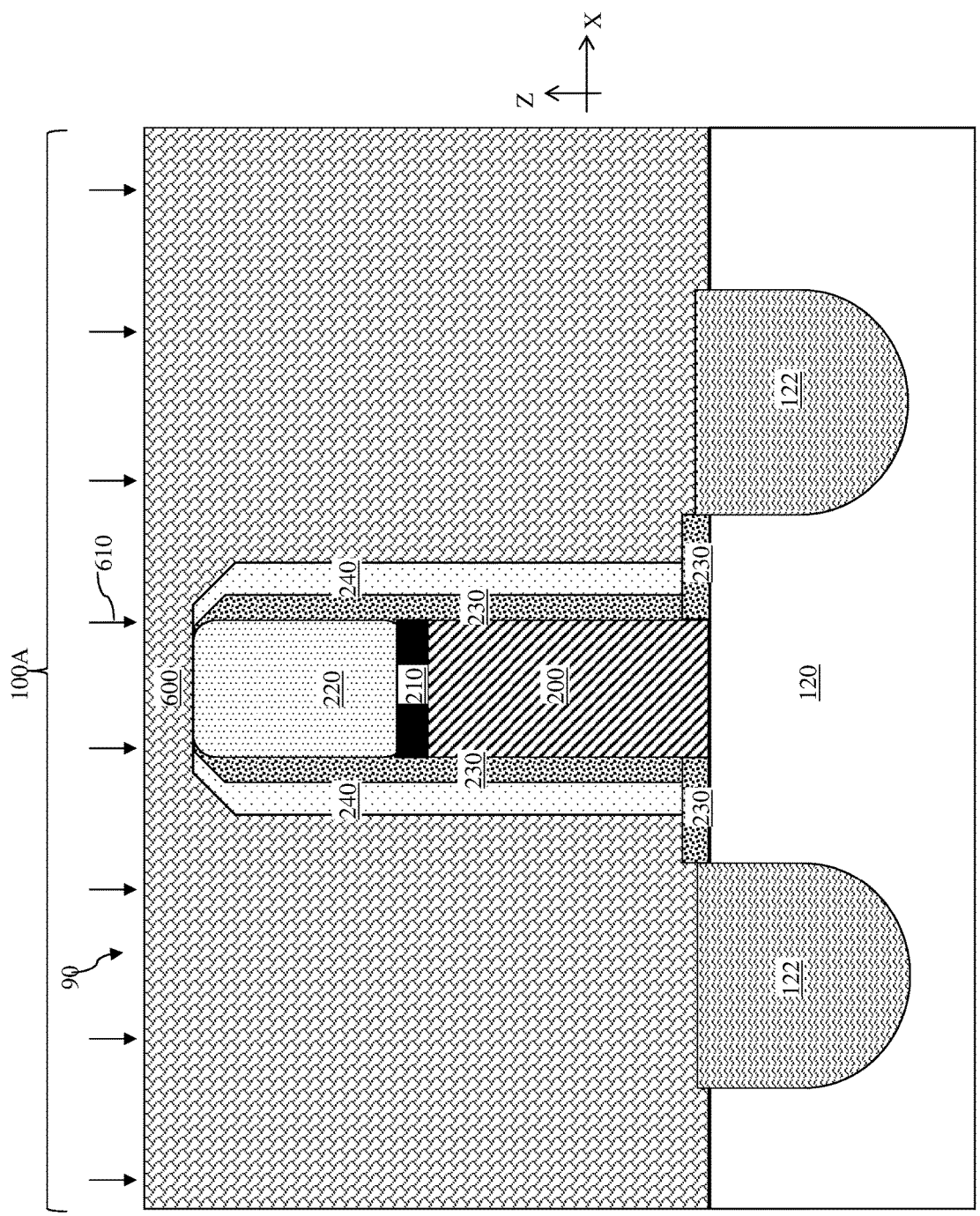
Figure 24B:
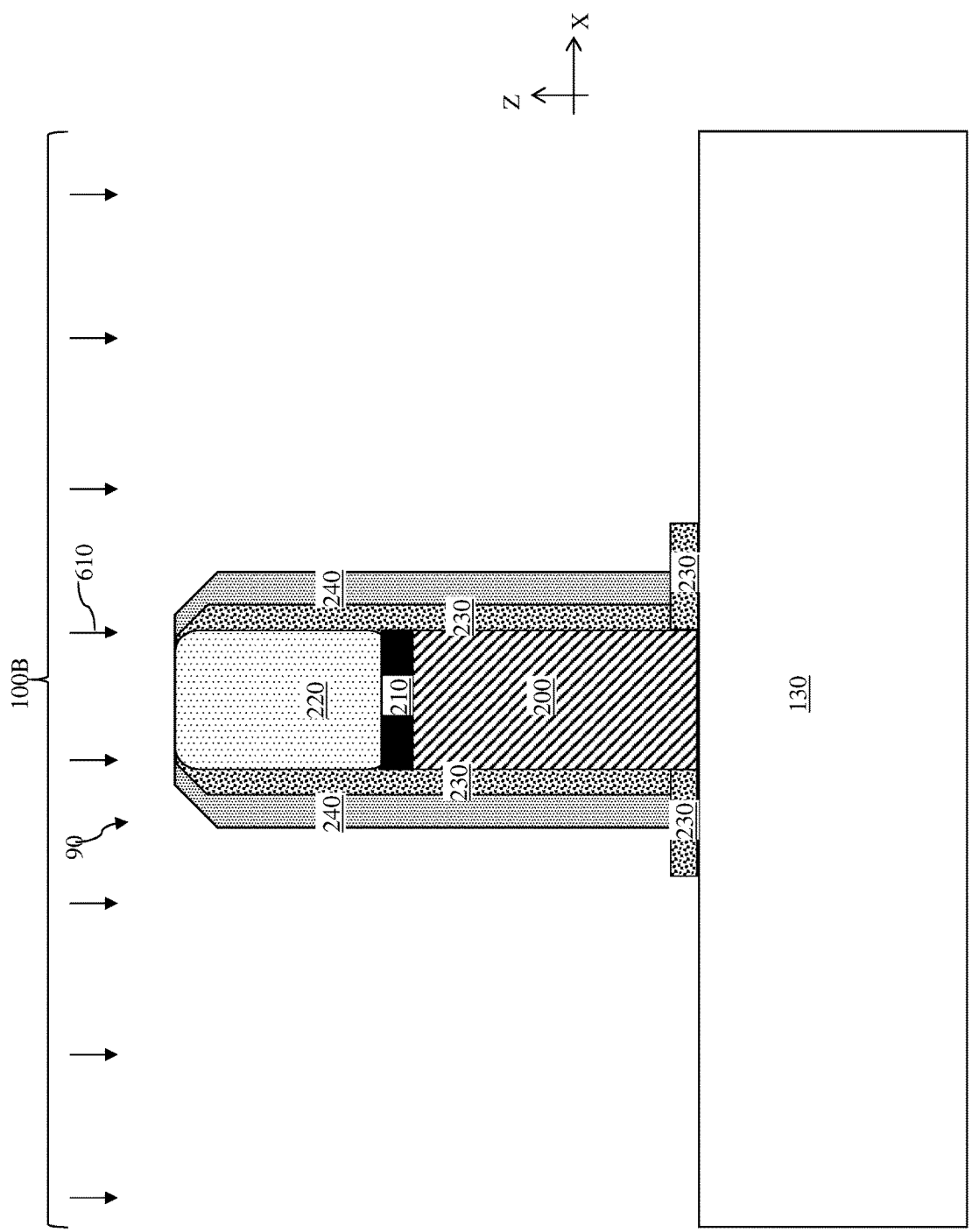

Referring now to FIGS. 24A and 24B, a patterned photoresist mask 600 is formed to cover up the device region 100A but not the device region 100B. A doping process 610 is then applied to the semiconductor structure 90 exposed in the device region 100B. The doping process 610 implants dopants into the gate spacers 240 to transform the gate spacers 240 in the device region 100B into a material that is difficult to etch in a later etching process. In other words, the doping process 610 retards the etching rate of the treated gate spacers 240 in the device region 100B.

In some embodiments, the doping process 610 implants carbon, nitrogen, boron, or fluorine as the dopants into the gate spacers 240. In some embodiments, 20%-100% of the total thickness of the gate spacers 240 in the device region 100B is transformed. Meanwhile, since the gate spacers 240 in the device region 100A is protected by the patterned photoresist mask 600, they are not implanted with the dopants. Hence, the gate spacers 240 in the device region 100A have a lower etching rate than the gate spacers 240 in the device region 100B.

Figure 25A:
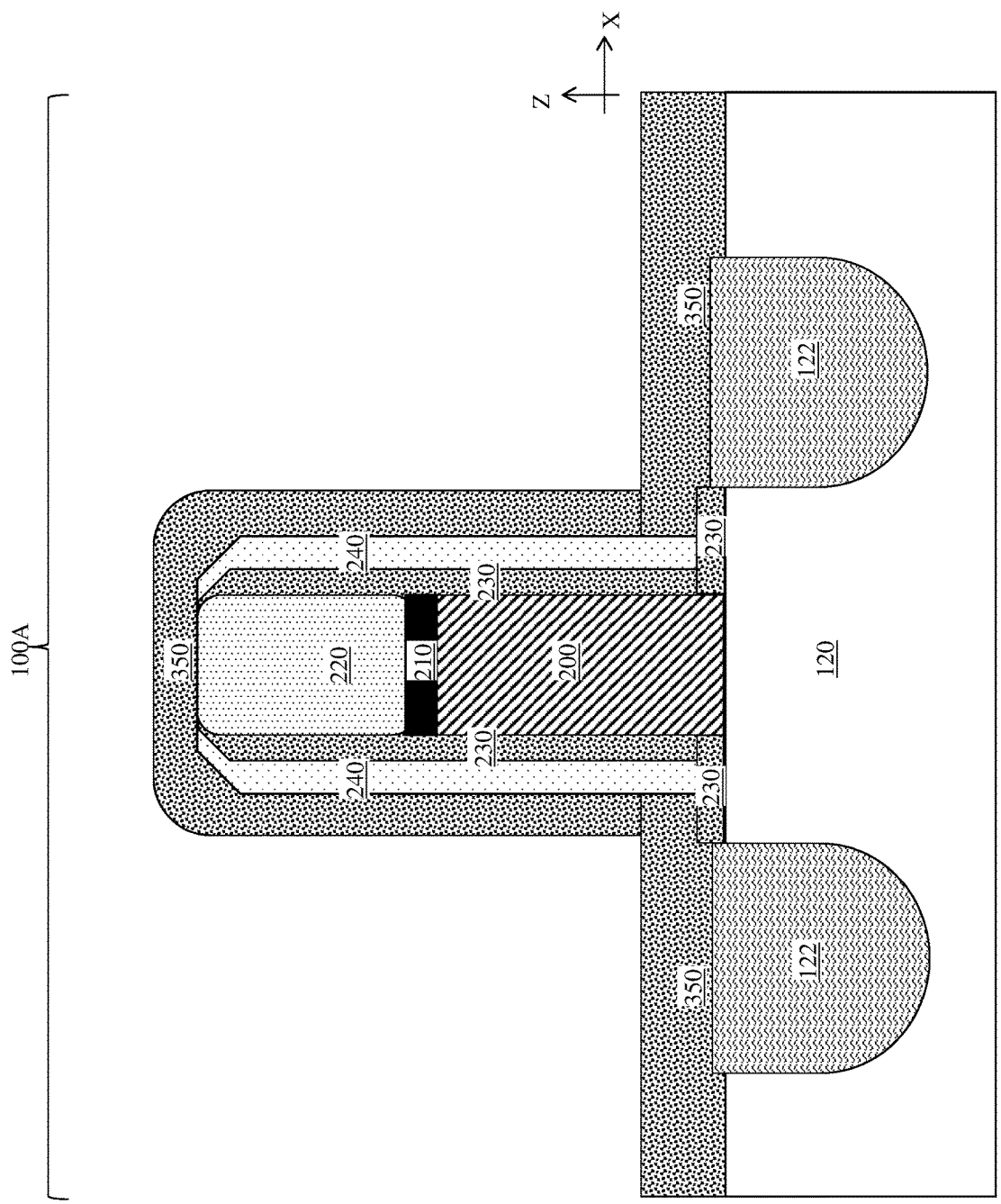
Figure 25B:
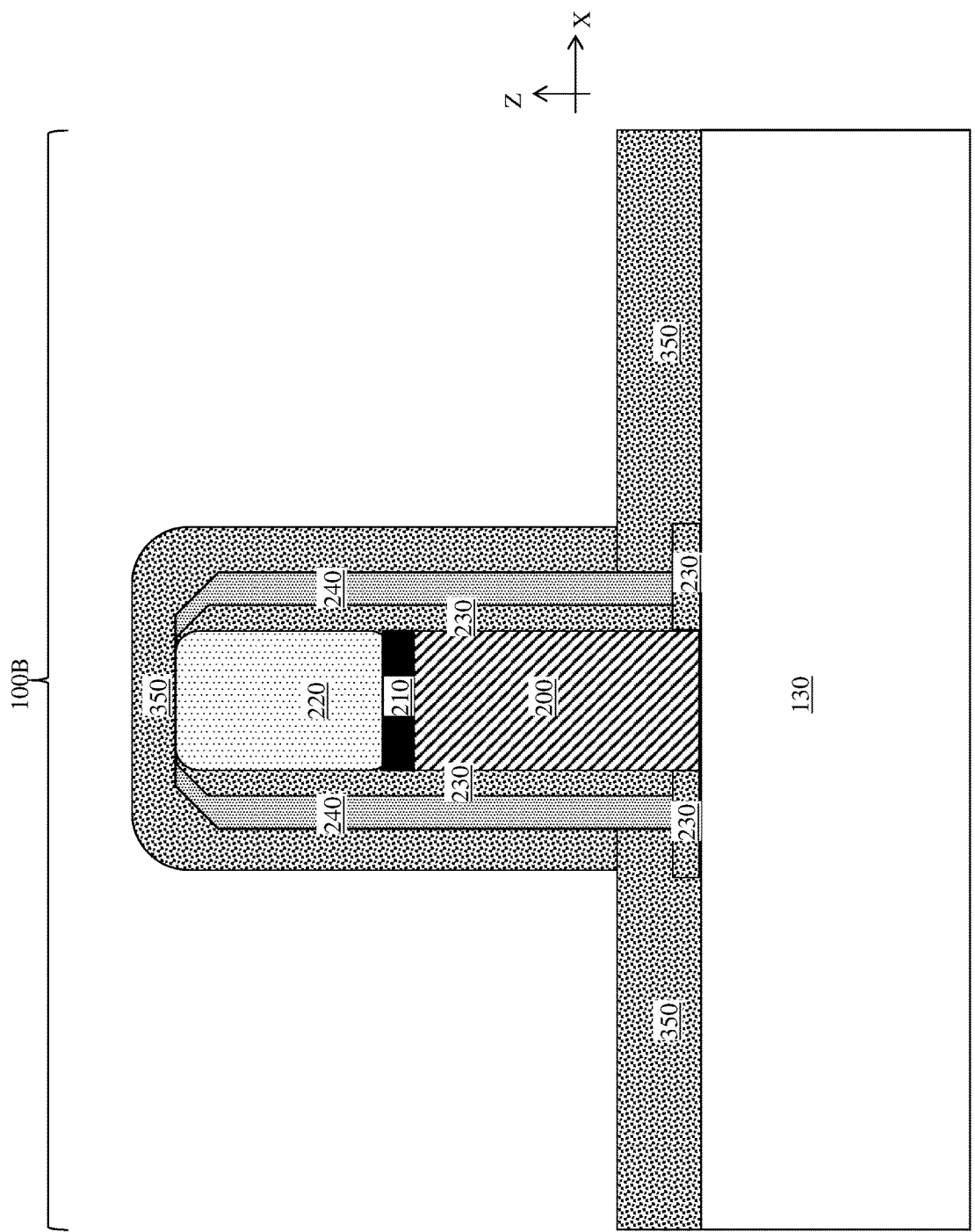

Referring now to FIGS. 25A and 25B, the patterned photoresist mask 600 is removed, for example via an ashing or stripping process. Thereafter, the spacer layer 350 (discussed above with reference to FIGS. 8A-8B) is formed in both the device region 100A and the device region 100B. Since no liner 270 was formed in the device region 100A, the spacer layer 350 is formed on the spacer layer 240 instead.

Figure 26A:
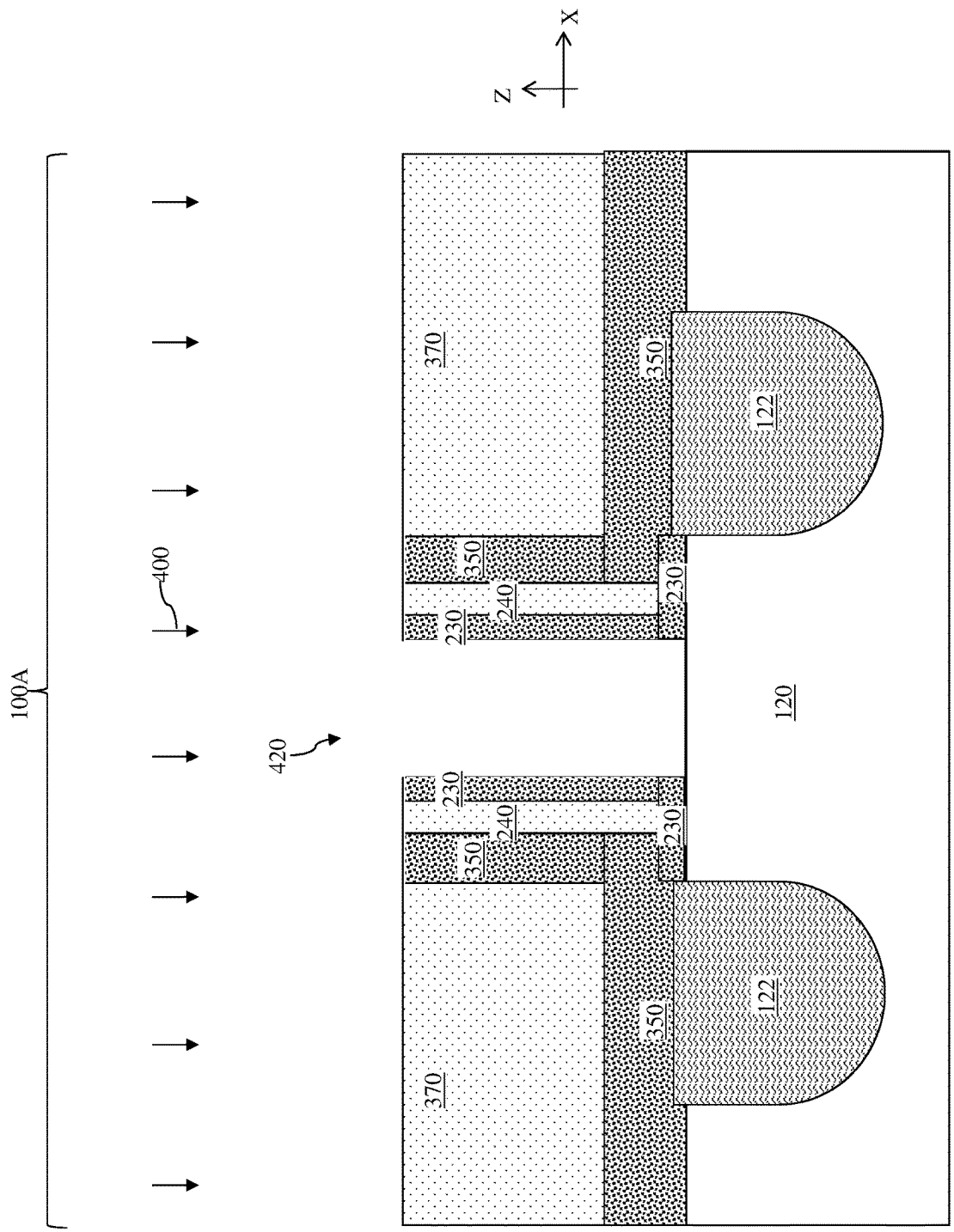
Figure 26B:
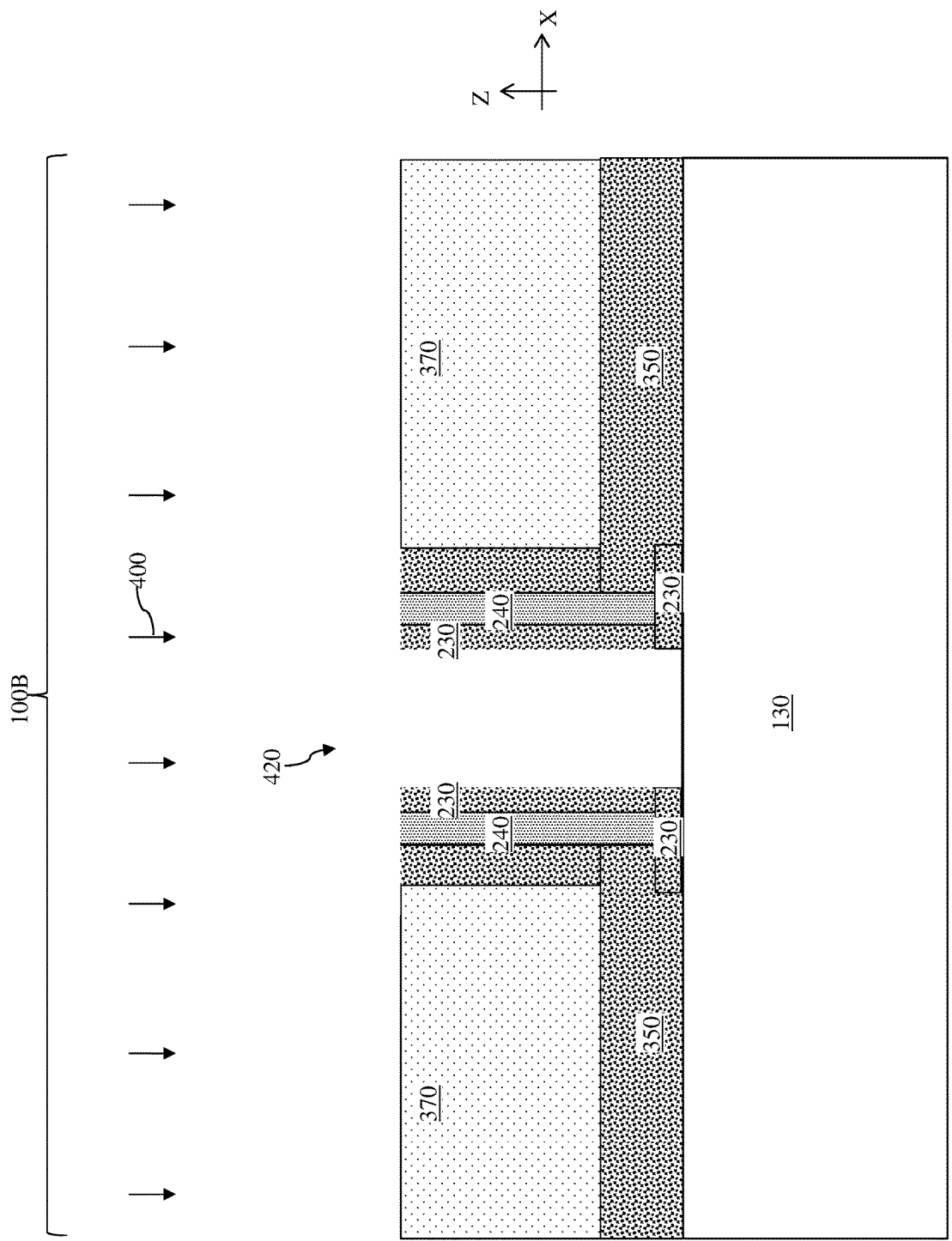

Referring now to FIGS. 26A and 26B, the dielectric layer 370 is formed over the spacer layer 350 in both the device region 100A and the device region 100B. A CMP process is performed to planarize the upper surfaces of the various layers in the device region 100A and in the device region 100B. The spacer layer 350 is now broken up into gate spacers 350, which have substantially co-planar upper surfaces with the gate spacers 230-240 and the dielectric layer 370. Thereafter, the one or more etching processes 400 are performed to remove the gate electrode 200 in both the device region 100A and the device region 100B, which forms openings 420 in both the device region 100A and the device region 100B.

Figure 27A:
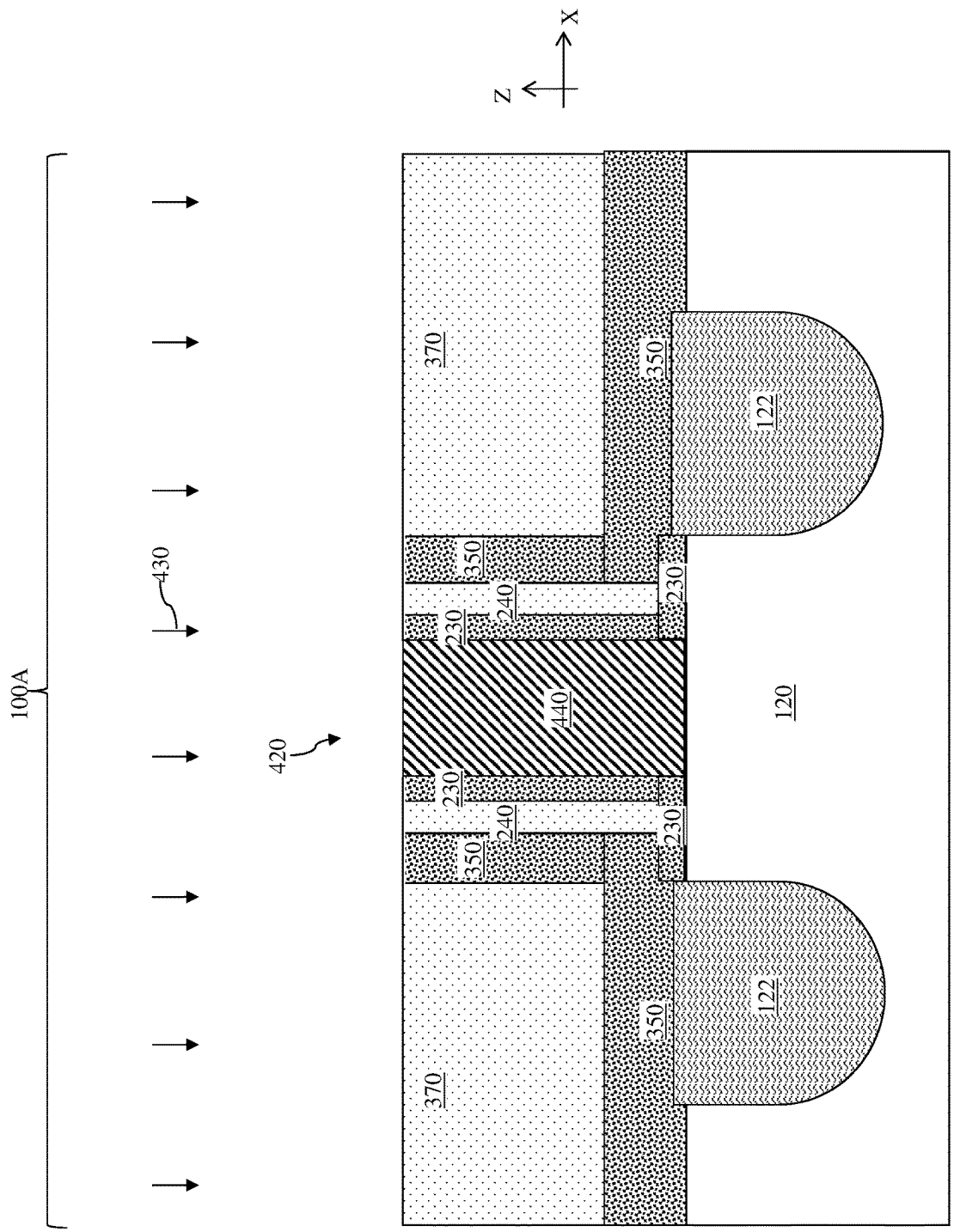
Figure 27B:
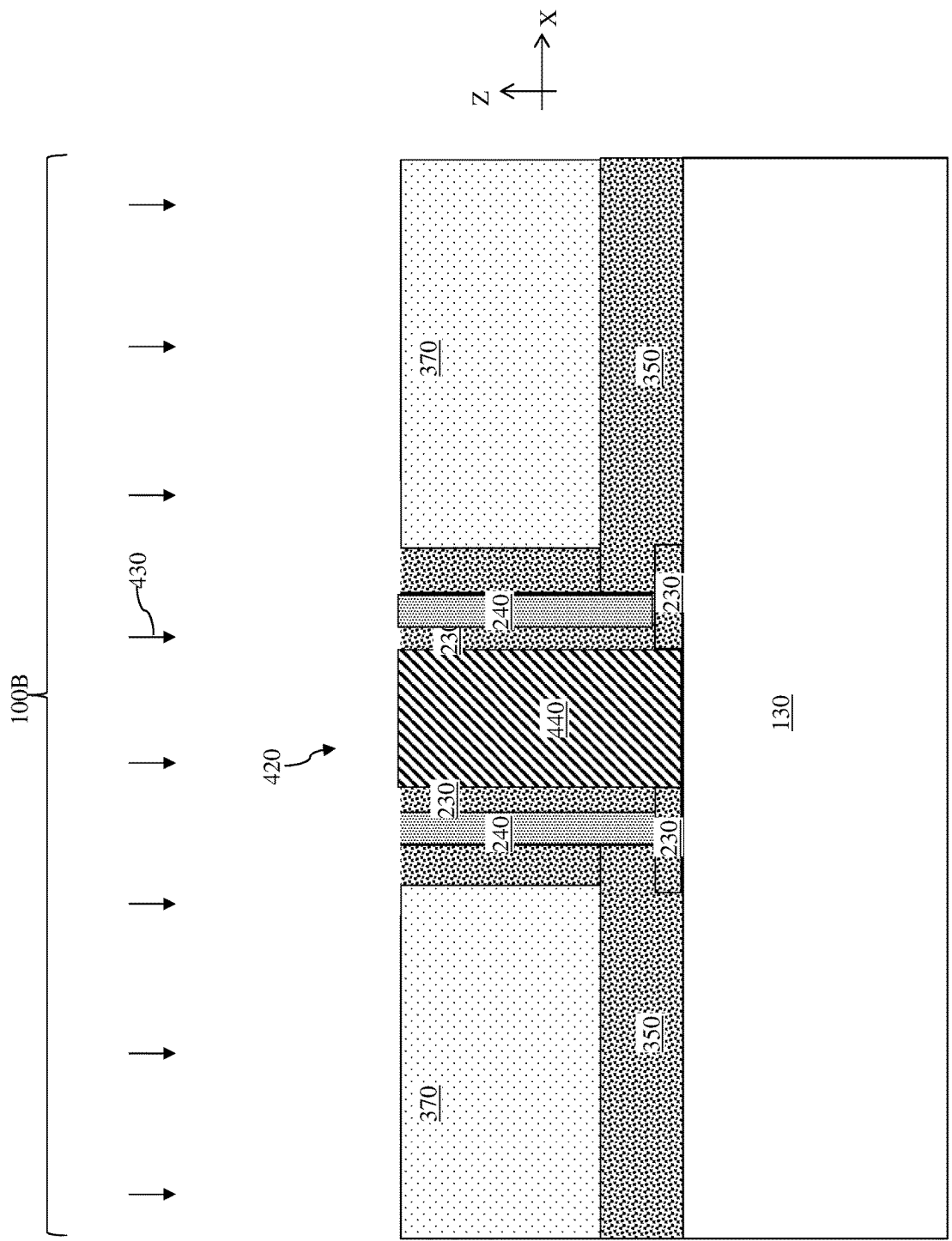

Referring now to FIGS. 27A and 27B, the gate replacement process 430 is performed to form the metal gate electrode 440 in each of the openings 420. The metal gate electrode 440 may include a work function metal layer and a bulk conductive layer (also referred to as a fill metal).

Figure 28A:
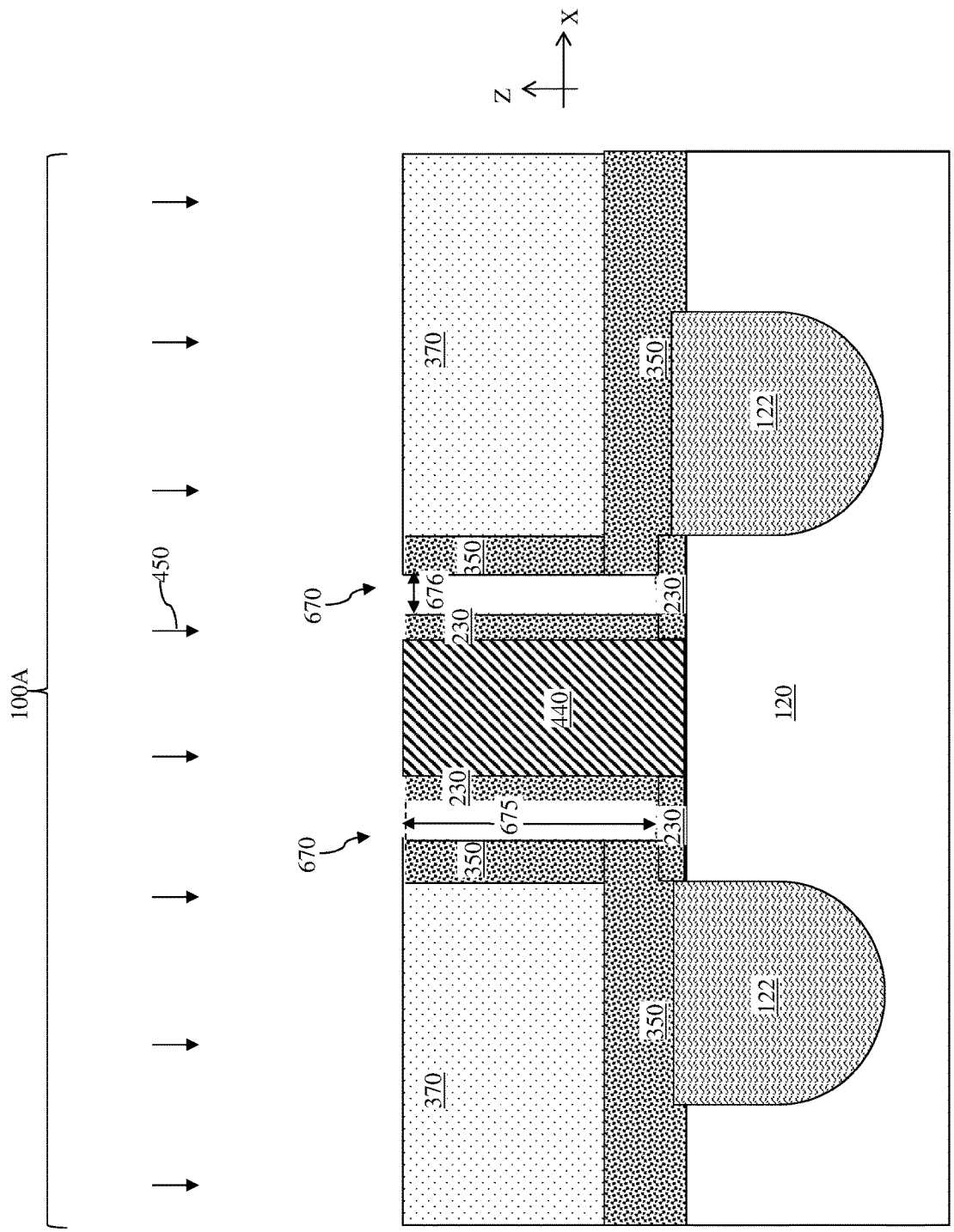
Figure 28B:
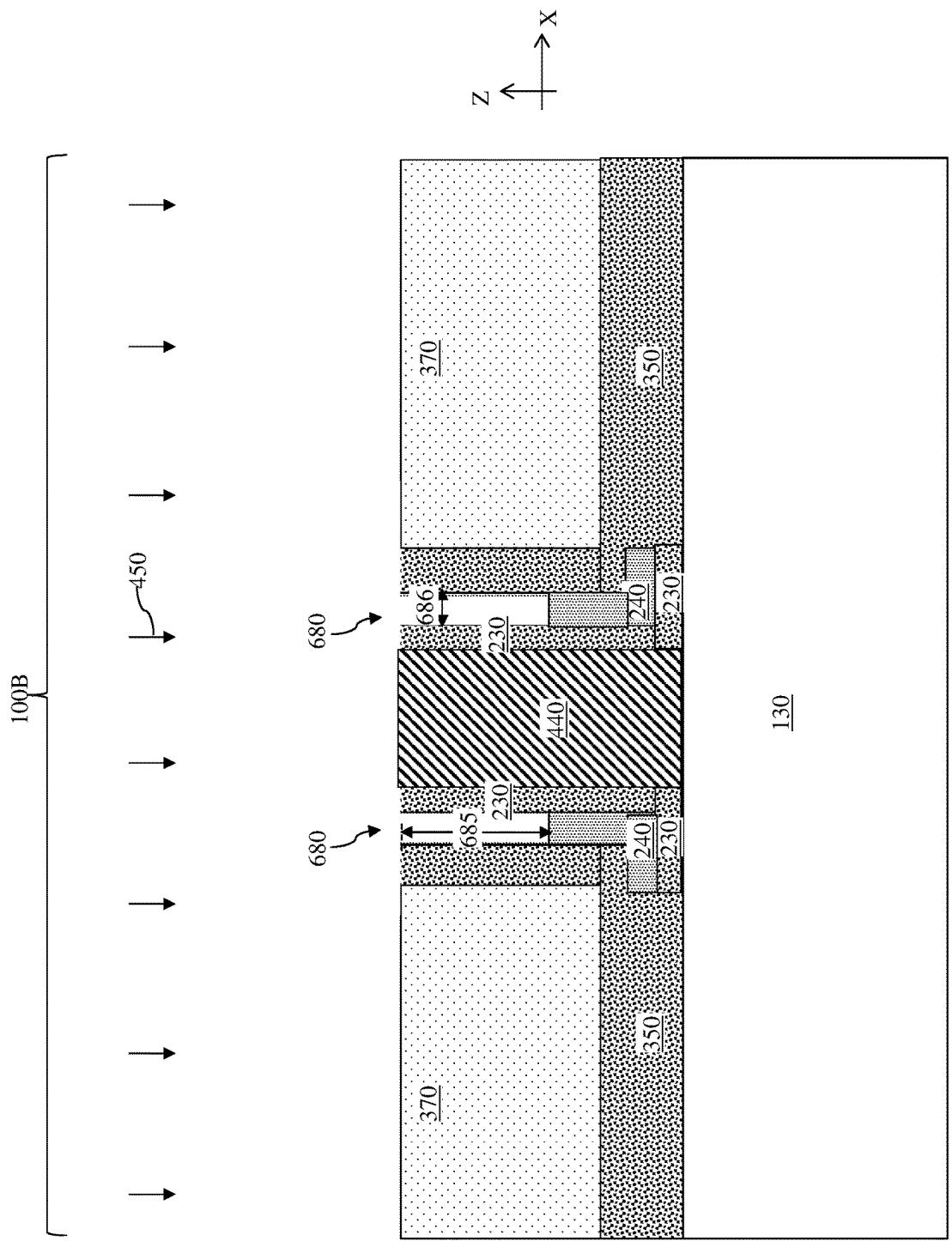

Referring now to FIGS. 28A and 28B, the one or more etching processes 450 may be performed. The etching processes may use HF, $H_2O$, He, and/or $N_2$ as etchants. As discussed above, after being treated with the dopants, the gate spacers 240 in the device region 100B have a slower etching rate in the etching processes 450, for example an etching rate less than that of the gate spacers in the device region 100A, the dielectric layer 370, the gate spacers 230, and the metal gate electrode 440. As such, the gate spacers 240 in the device region 100A may be completely removed while portions of the gate spacers 240 may still remain in the device region 100B even after the performance of the etching processes 450.

The removal of the gate spacers 240 forms air spacers (air gaps) 670 in the device region 100A, and the partial removal of the gate spacers 240 forms air gaps 680 in the device region 100B. Due to the greater etching resistance of the gate spacers 240 in the device region 100B, the air spacers 680 formed in the device region 100B may have a smaller depth than the air spacers 670 formed in the device region 100A. In other words, whereas the embodiment corresponding to FIGS. 16A-16B through 22A-22B treats the gate spacers 240 in the device region 100A to enhance their etching rates, the embodiment described in the FIGS. 23A-23B through 28A-28B does the opposite by treating the gate spacers 240 in the device region 100B to make them more etching resistant. However, the end result achieved by both embodiments may still be similar—a bigger air spacer in the device region 100A than in the device region 100B.

For example, as shown in FIGS. 28A-28B, the air spacers 670 in the device region 100A may each have a vertical dimension 675 and a lateral dimension 676, while the air spacers 680 in the device region 100B may each have a vertical dimension 685 and a lateral dimension 686. Similar to the embodiment discussed previously, the vertical dimension 675 is greater than the vertical dimension 685, and the lateral dimension 676 may be similar to the lateral dimension 686. Also as discussed above, the values of these dimensions are tunable, and the different (and tunable) depths and widths of the air spacers 670 and 680 allow the dielectric values of the air spacers 670 and 680 to be configured differently for the different types of devices in the device regions 100A and 100B, respectively, in order to optimize device performance in the different device regions 100A and 100B. Furthermore, the gate structure 140 in the device region 100B is less likely to collapse for reasons similar to those discussed above in association with the previous embodiments.

Figure 29A:
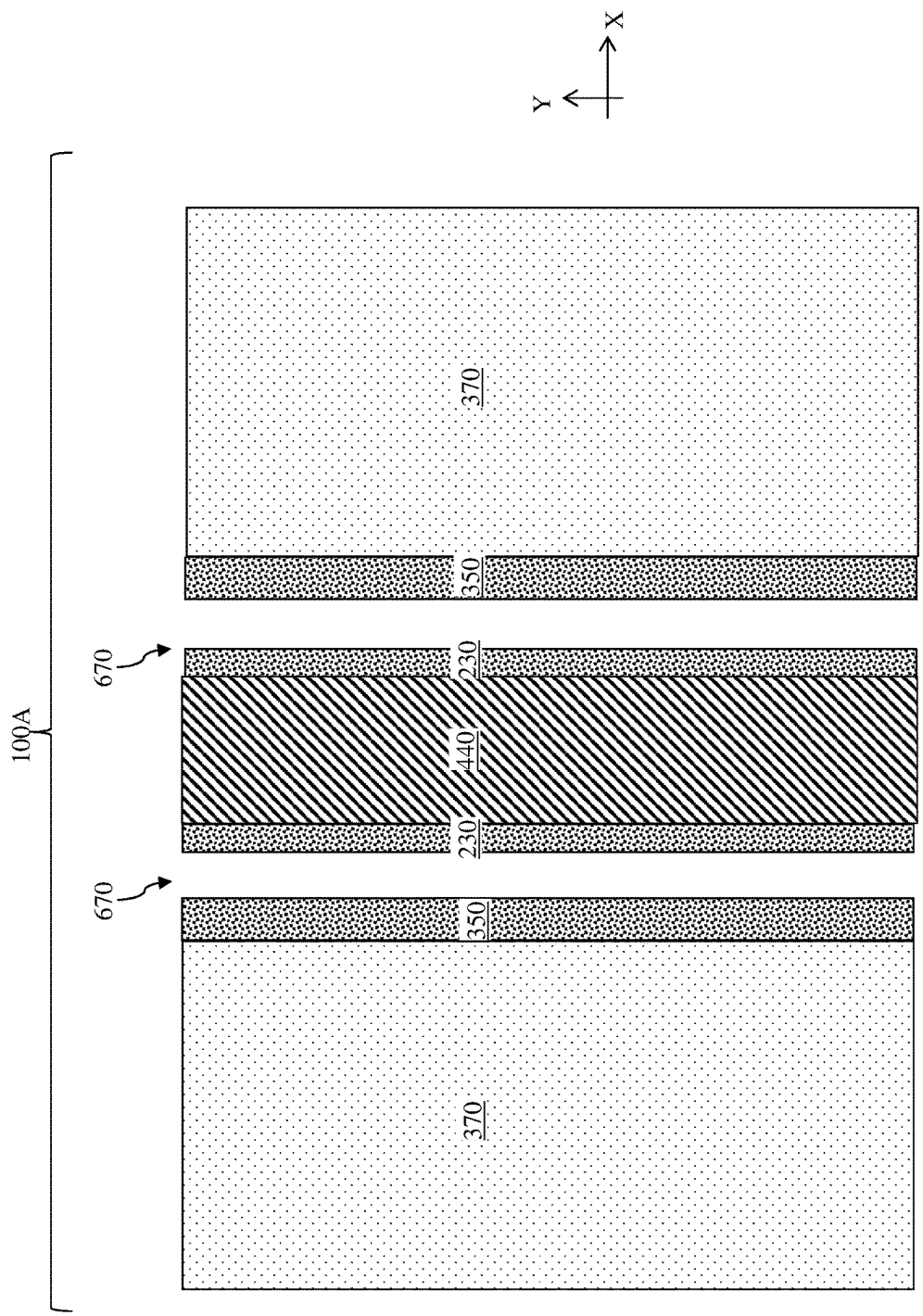
Figure 29B:
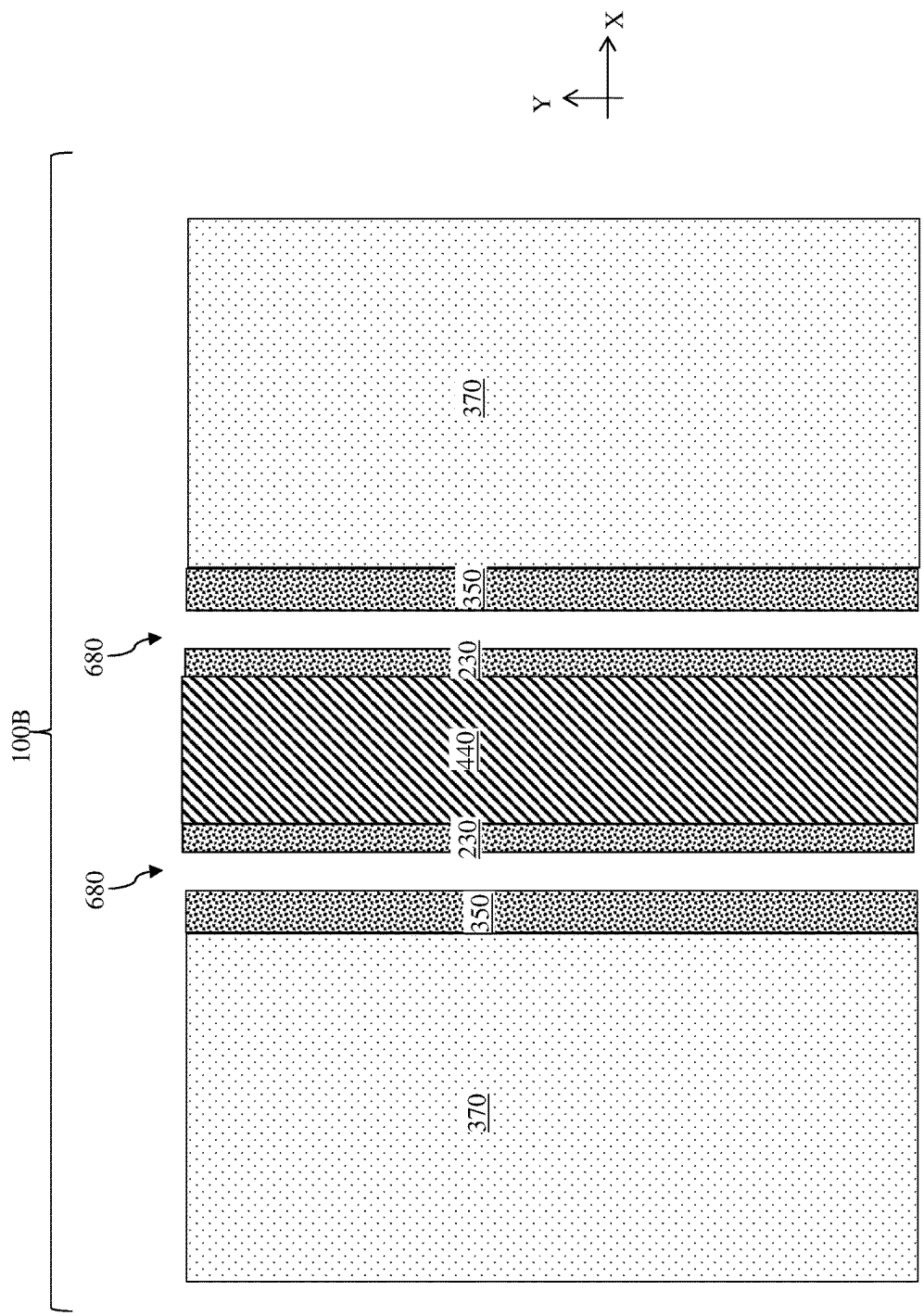
Figure 30A:
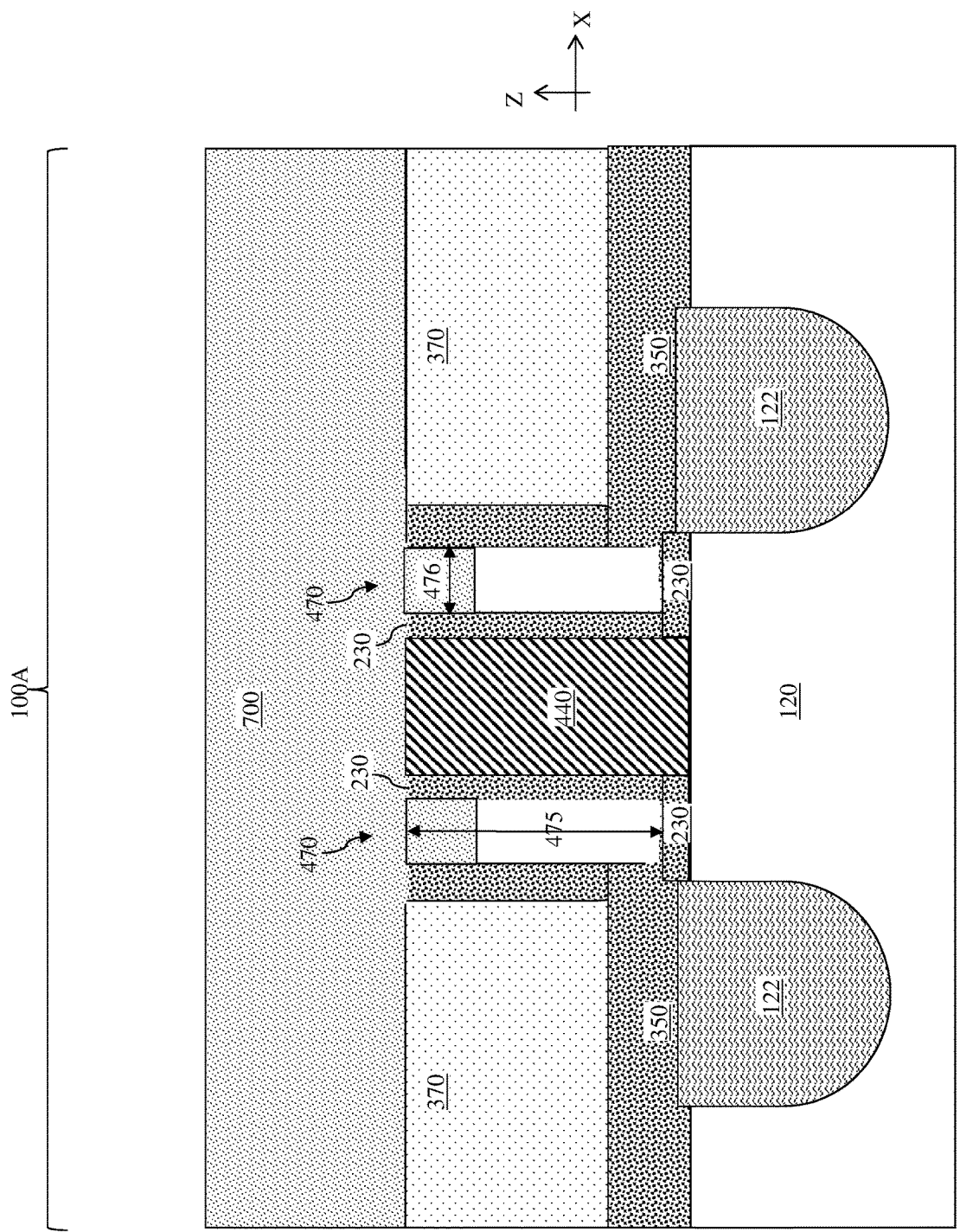

The top views of the semiconductor structure at this stage of fabrication are also illustrated in FIGS. 29A and 29B. The top views in FIGS. 29A-29B are substantially similar to the top views illustrated in FIGS. 22A-22B, except that the gate spacers 240 in the device region 100B are doped, whereas the gate spacers 240 in the device region 100A are doped in the embodiment shown in FIGS. 22A-22B.

Regardless of what embodiment is performed to form the air spacers, it is understood that additional processing steps may be performed to complete the fabrication of the semiconductor structure 90. For example, referring now to FIGS. 30A and 30B, a capping layer 700 may be formed over the dielectric layer 370, the gate spacers 230 and 350, and the metal gate electrode 440. The capping layer 700 also partially fills in the air spacers 470 and 480 (and similarly for the air spacers 570-580 and 670-680). In some embodiments, the portion of the capping layer 700 partially filling the air spacers 470-480 may constitute about 5%-50% of the total depth (e.g., vertical dimensions 475 or 485) of the air spacers 470 or 480. The capping layer 700 may include a dielectric material, for example a nitride material in some embodiments.

Figure 31A:
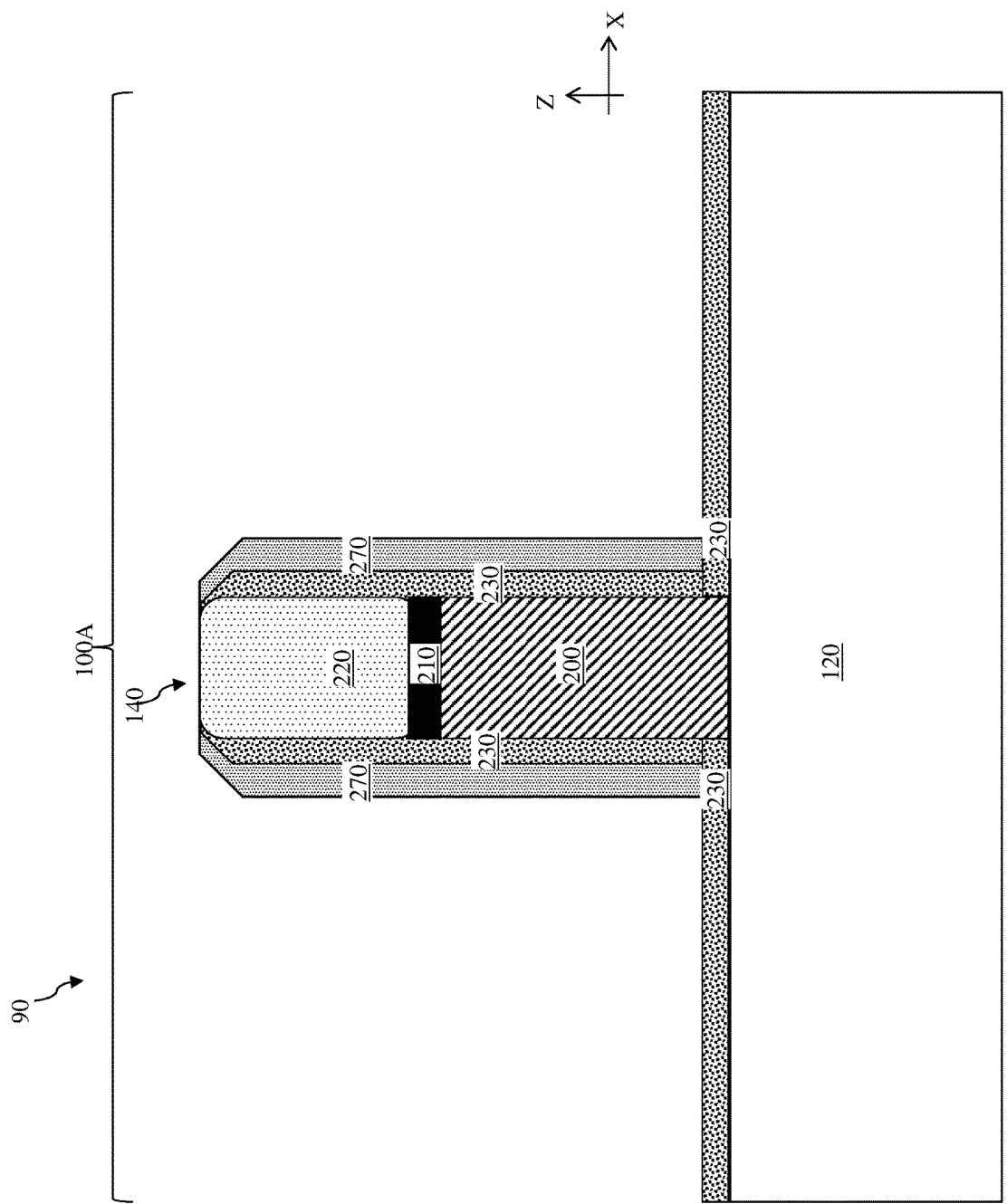
Figure 31B:
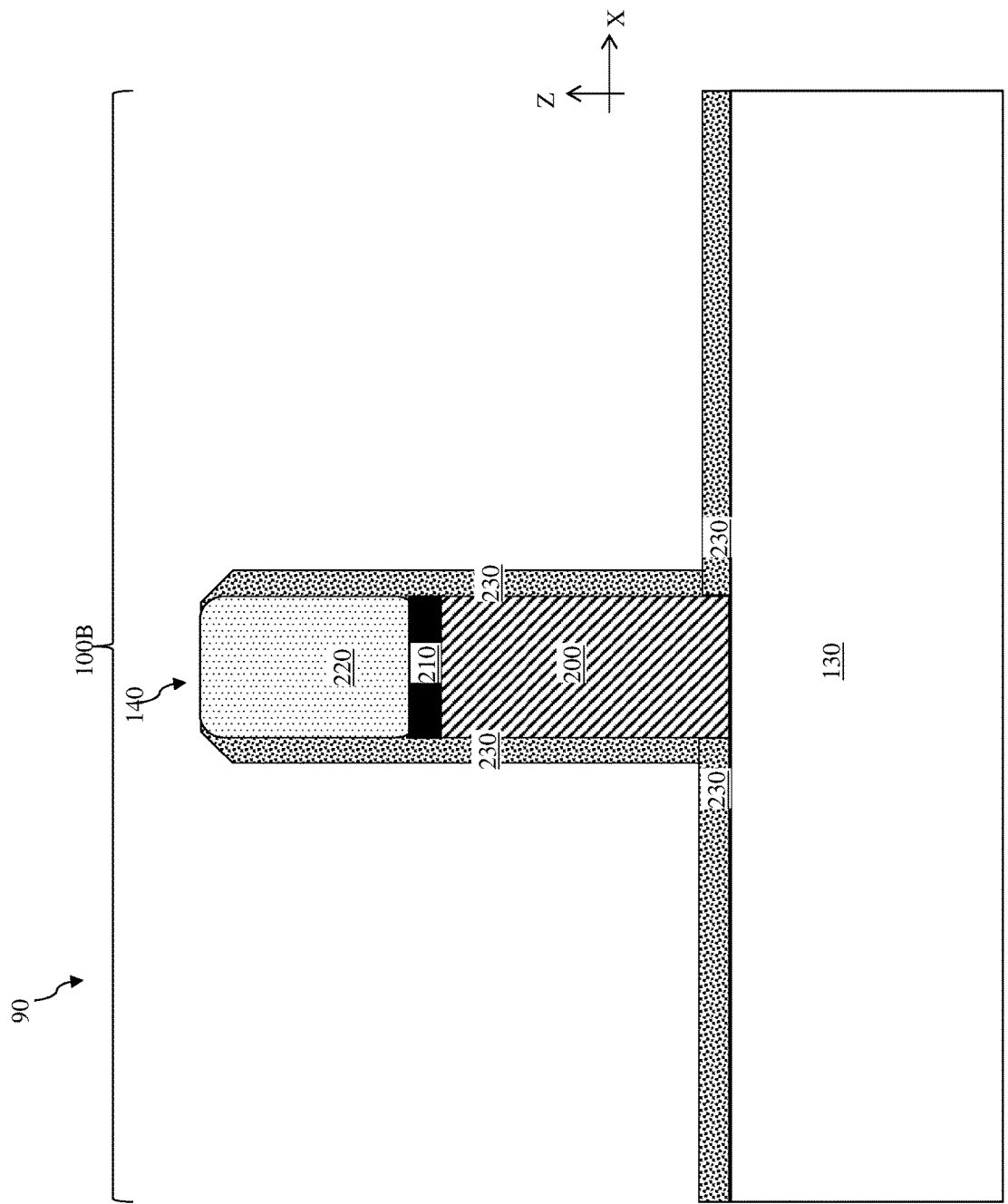

FIGS. 31A-35A and 31B-35B illustrate cross-sectional side views of another alternative embodiment of the present disclosure. In this alternative embodiment, the processing steps are substantially similar to the embodiment discussed above in association with FIGS. 2-3 and 4A-4B through 15A-15B, except that the liner 270 is formed between the spacer layer 230 and the spacer layer 240, for example it is formed on the spacer layer 230 before the spacer layer 240 is formed. In more detail, the stage of fabrication in FIGS. 31A-31B is similar to the stage of fabrication shown in FIGS. 4A-4B, except that the liner 270 (and not the spacer layer 240) is formed on the spacer layer 230 in the device region 100A. The selective formation of the liner 270 (in the device region 100A but not in the device region 100B) may be achieved by first depositing the liner 270 on the spacer layer 230 in both the device region 100A and the device region 100B, and then using a photoresist mask to protect the portion of the liner 270 in the device region 100A while the portion of the liner 270 in the device region 100B is etched away. It is also understood that the source/drain features 122 have not been formed at this stage of fabrication yet.

Figure 32A:
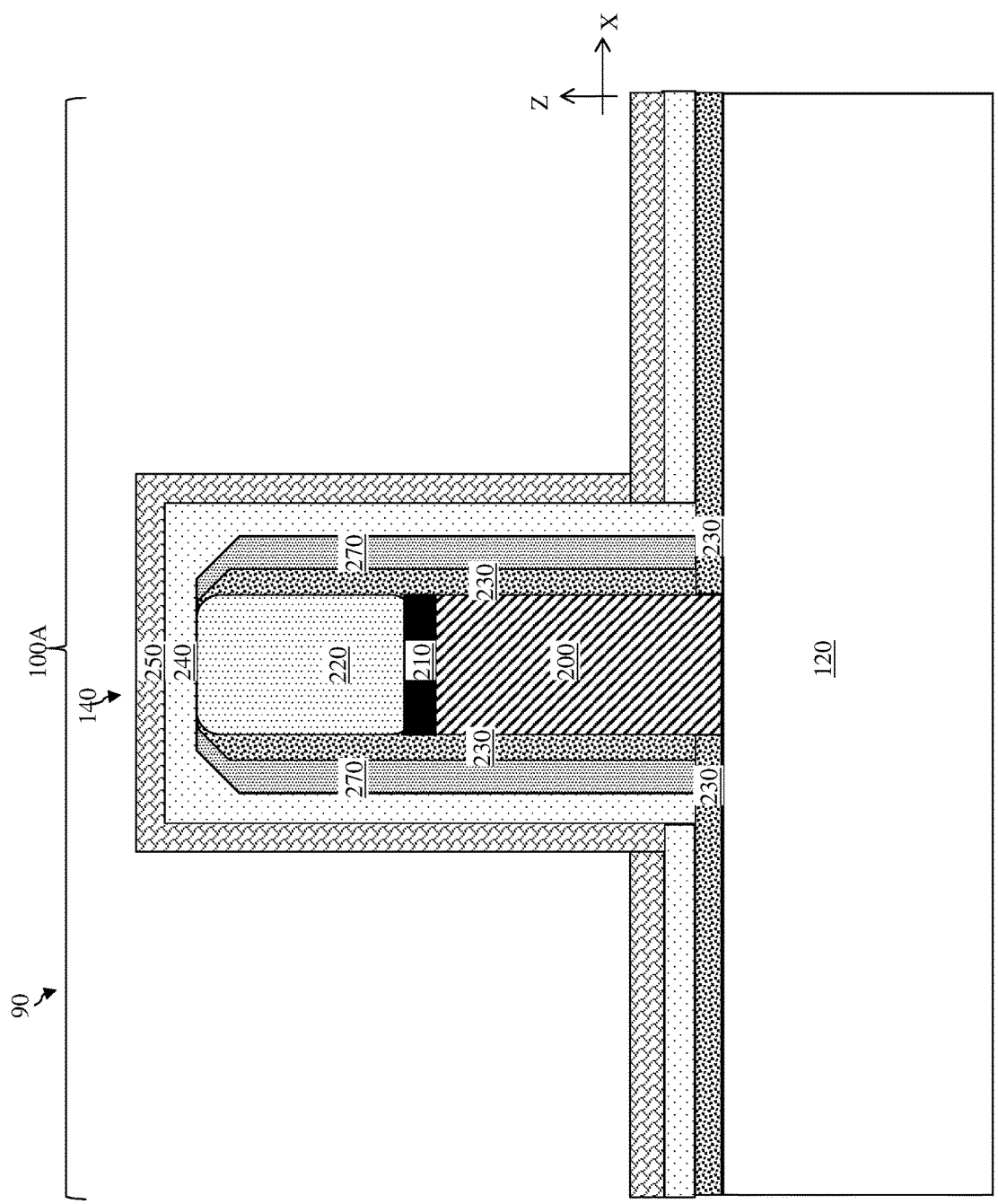

Referring now to FIGS. 32A-32B, the spacer layer 240 is deposited on the liner 270 in the device region 100A and on the spacer layer 230 in the device region 100B. Thereafter, the dummy layer 250 is formed on the spacer layer 240. As discussed above, the dummy layer 250 may include a dielectric material such as silicon nitride and may be used to define N epi-layer and P epi-layers.

Figure 33A:
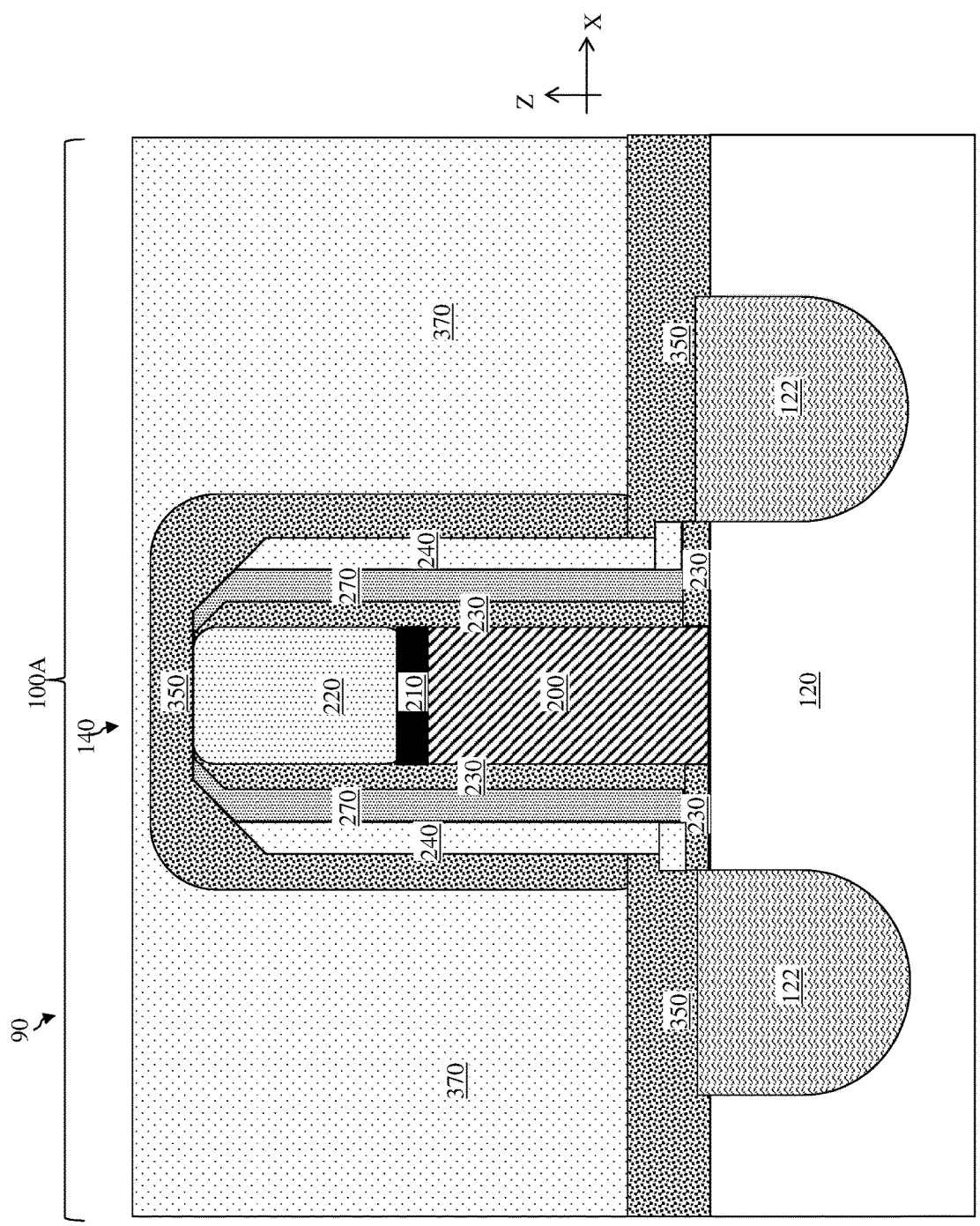
Figure 33B:
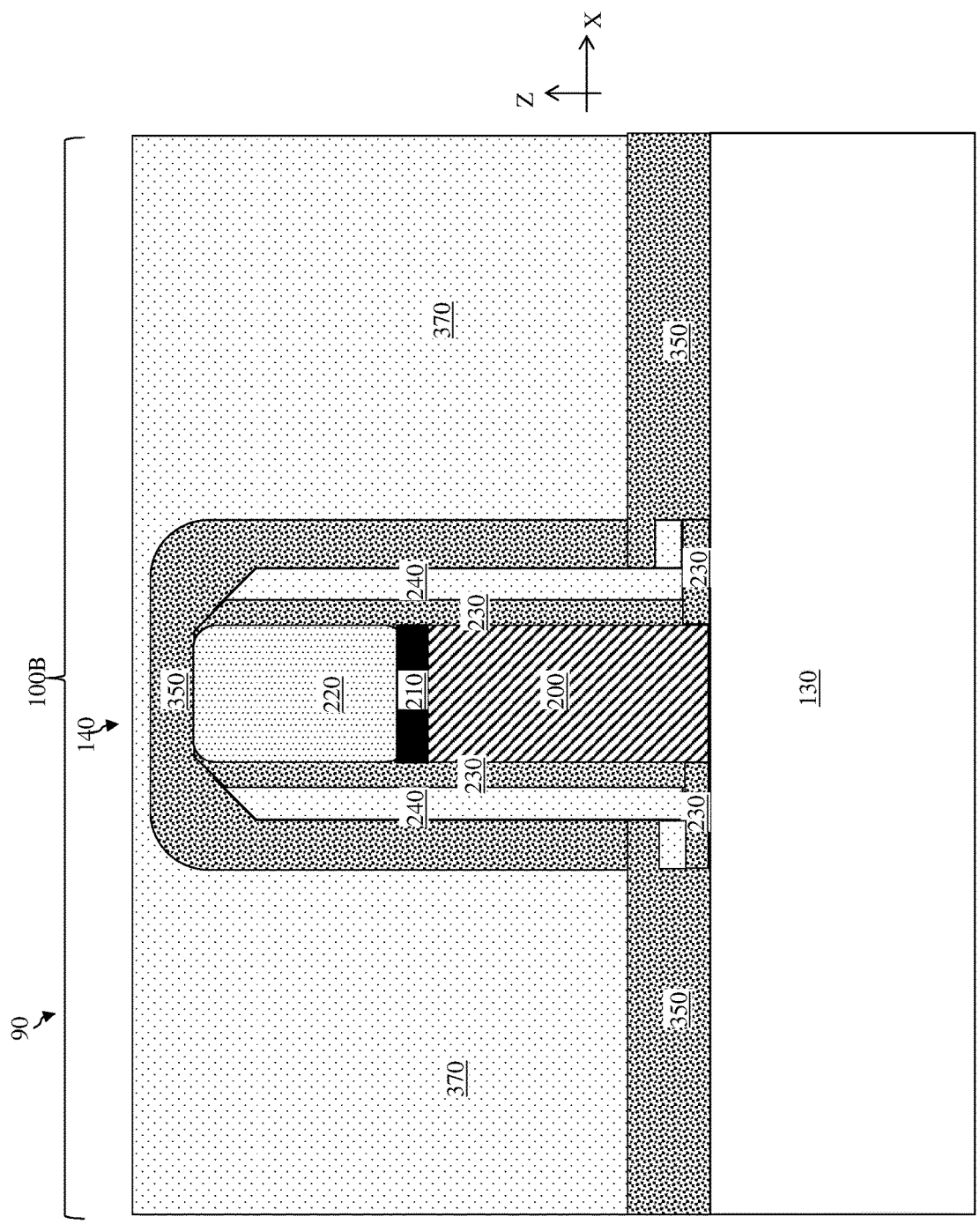

Referring now to FIGS. 33A-33B, the dummy layer 250 is removed after the P and N epi-layer definition, and the source/drain features 122 are formed in the device region 100A. The spacer layer 350 is then formed over the spacer layer 240, and then the dielectric layer 370 is formed over the spacer layer 350.

Figure 34A:
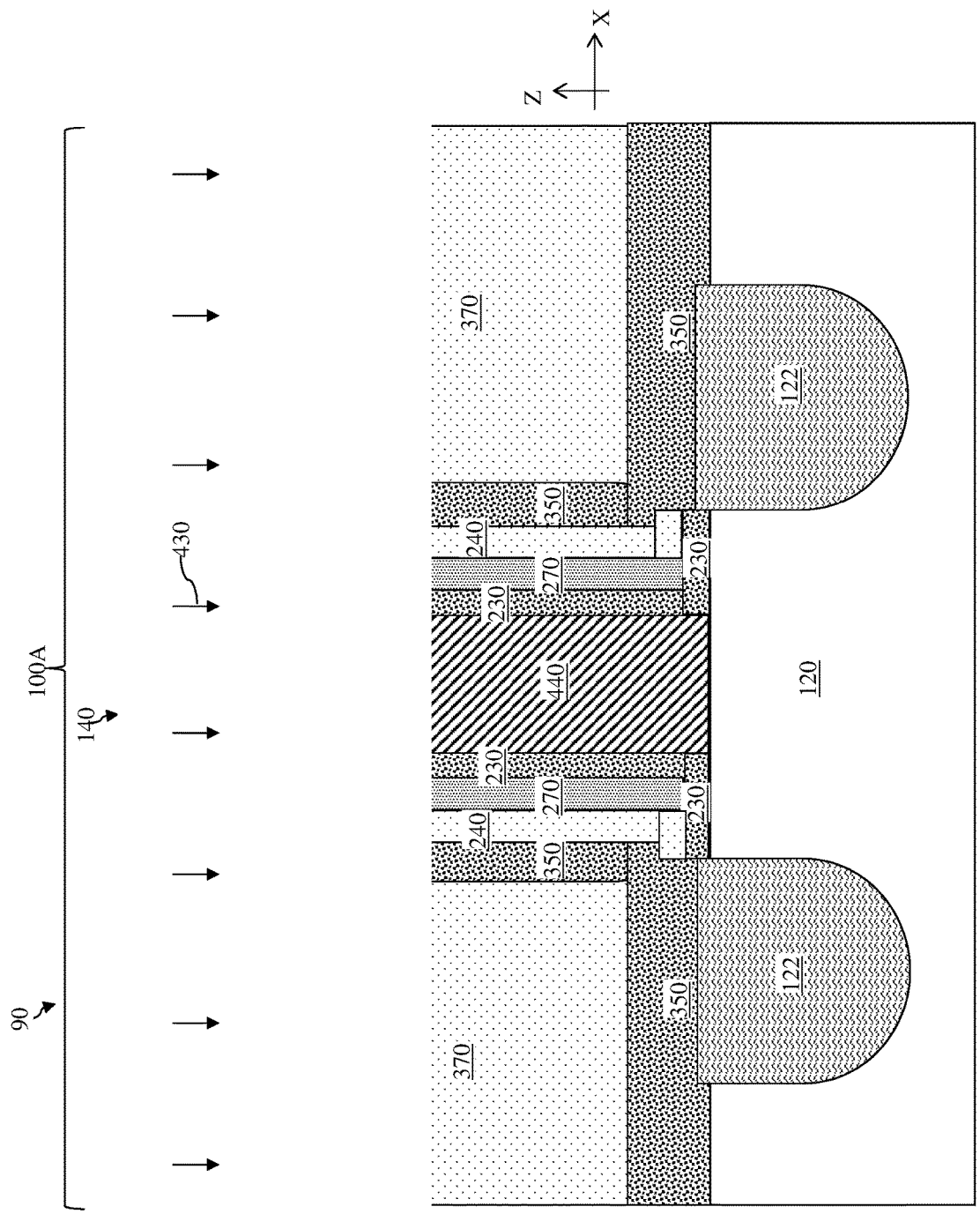
Figure 34B:
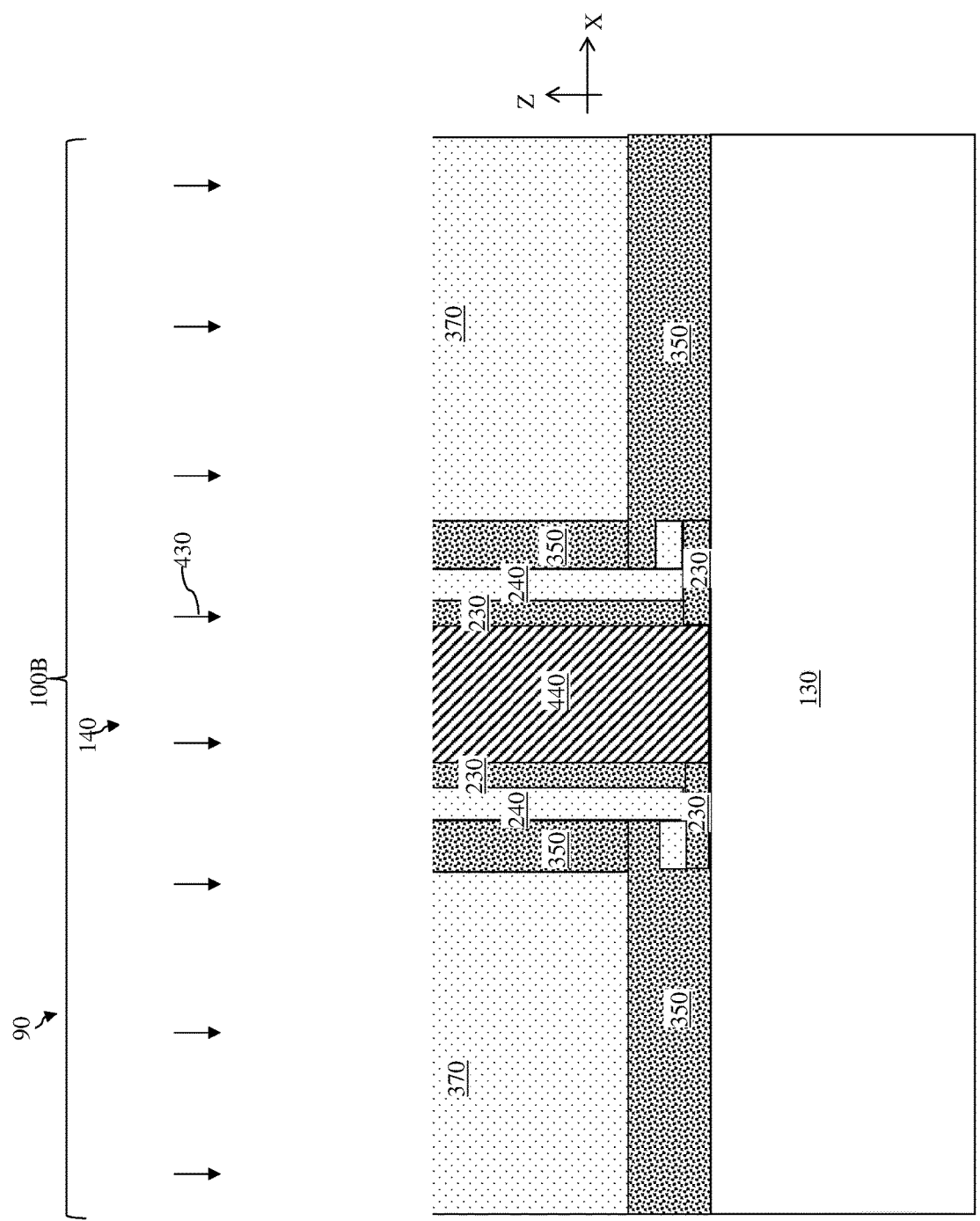

Referring now to FIGS. 34A-34B, a CMP process similar to the CMP process 390 discussed above is performed to planarize the upper surfaces of the layers 230, 240, 270, 350, and 370. The gate replacement process 430 is then performed to replace the dummy gate electrode 200 with a metal gate electrode 440 in both the device region 100A and the device region 100B.

Figure 35A:
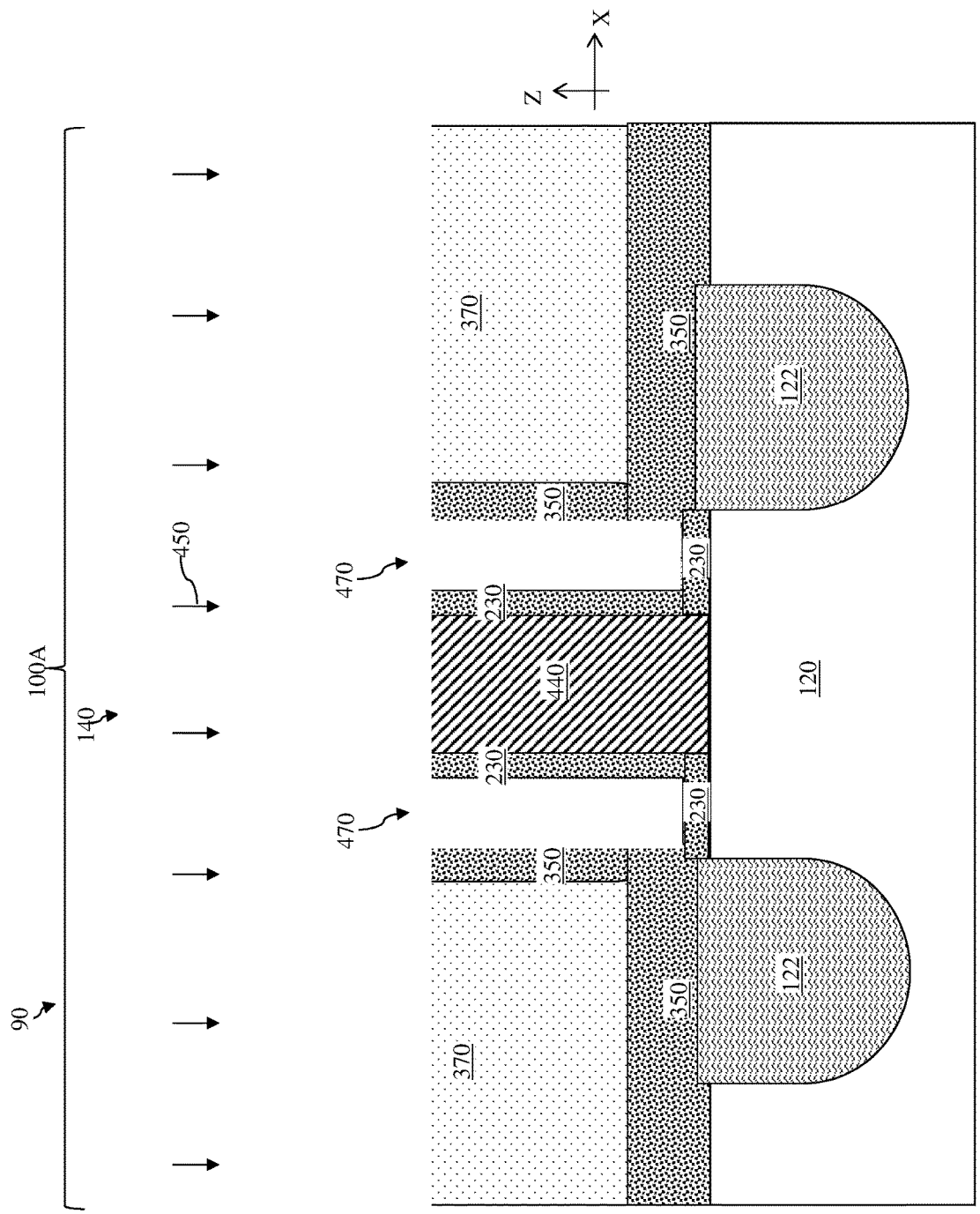
Figure 35B:
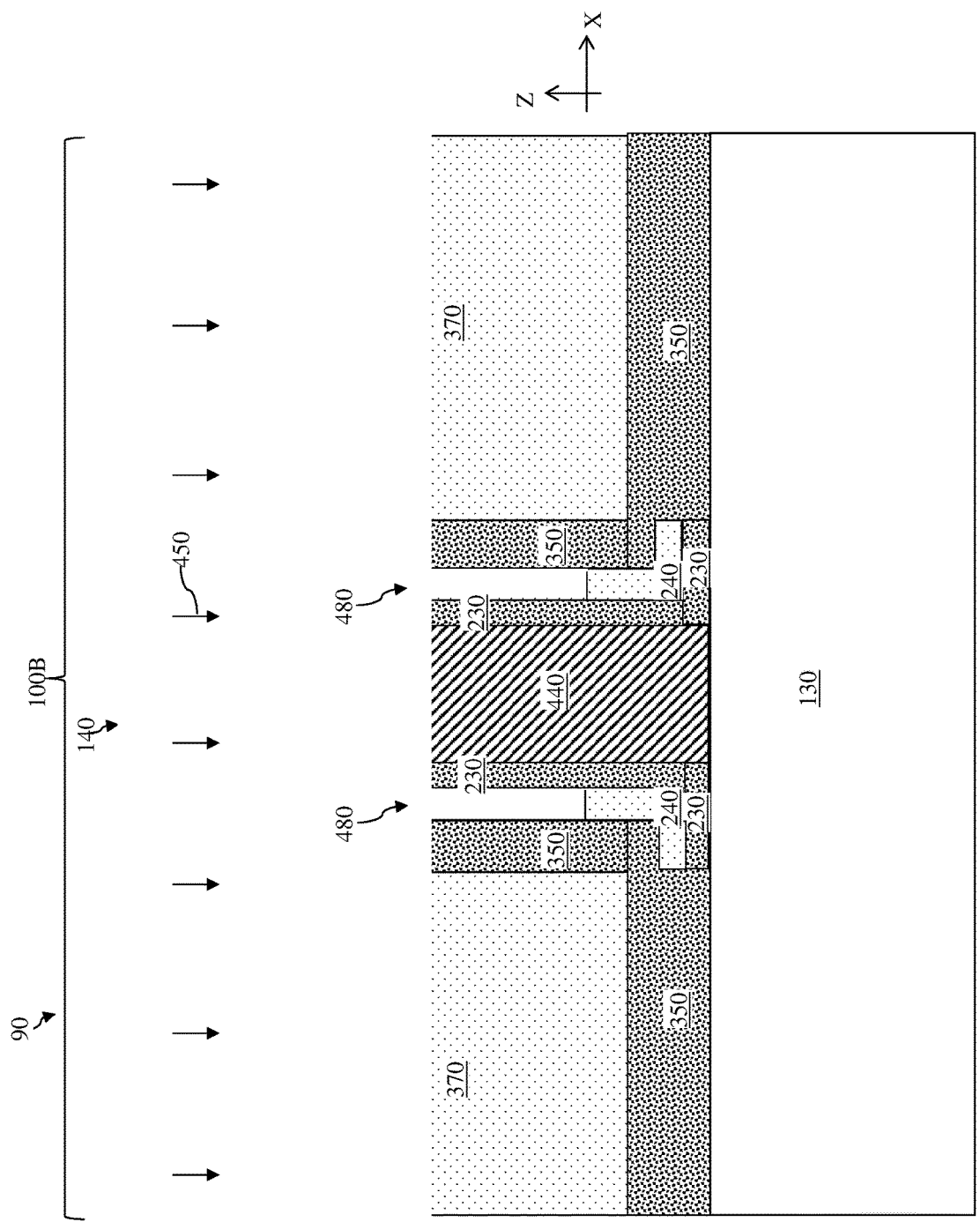

Referring now to FIGS. 35A-35B, the one or more etching processes 450 are performed to etch away the liner 270 and the spacer layer 240 in the device region 100A as well as to partially etch away the spacer layer 240 in the device region 100B. Air spacers 470 and 480 are formed in the device region 100A and 100B, respectively. At this stage of fabrication, the semiconductor structure 90 is substantially similar to the semiconductor structure 90 formed in FIGS. 13A-13B. Again, the difference between the embodiment shown in FIGS. 13A-13B and the embodiment shown in FIGS. 35A-35B is that the location of the liner 270 is switched. However, since the liner 270 is removed eventually by the etching processes 450, the semiconductor structure 90 in both embodiments have substantially identical device structures, in terms of not only the cross-sectional views but also the top views shown in FIGS. 15A-15B.

Figure 36:
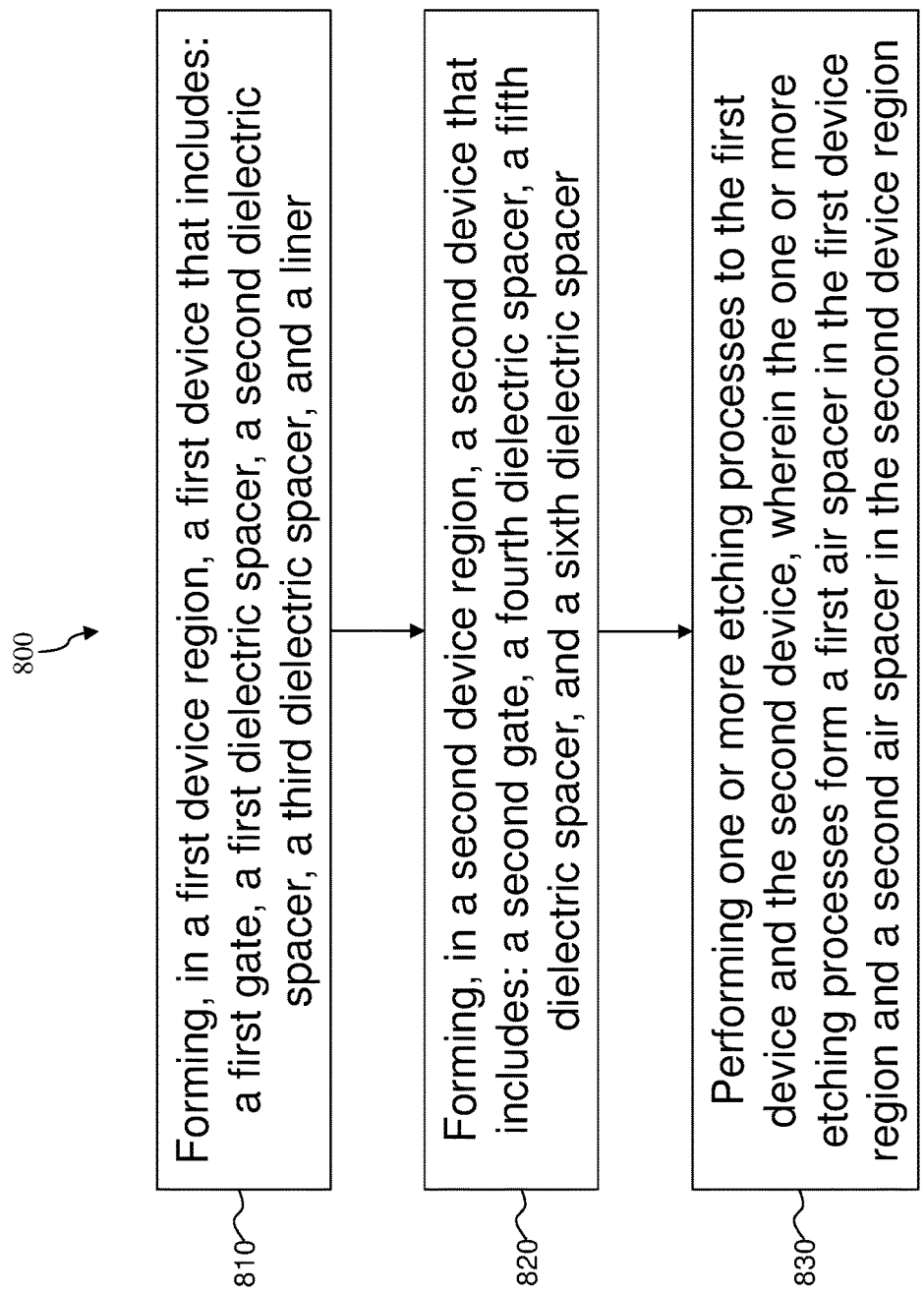
FIG. 36 is a flowchart of a method of fabricating a semiconductor device according to various aspects of the present disclosure.

FIG. 36 is a flowchart illustrating a method 800 of fabricating a semiconductor device according to an embodiment of the present disclosure. The method 800 includes a step 810 of forming, in a first device region, a first device that includes: a first gate, a first dielectric spacer, a second dielectric spacer, a third dielectric spacer, and a liner disposed between the first dielectric spacer and the second dielectric spacer or between the second dielectric spacer and the third dielectric spacer. In some embodiments, the first device is a functional device, and the second device is a dummy device. In some embodiments, the first device is formed over an active region, and the second device is formed over an electrical isolation region.

The method 800 includes a step 820 of forming, in a second device region, a second device that includes: a second gate, a fourth dielectric spacer, a fifth dielectric spacer, and a sixth dielectric spacer.

The method 800 includes a step 830 of performing one or more etching processes to the first device and the second device. The one or more etching processes form a first air spacer in the first device region by removing the liner and the second dielectric spacer. The one or more etching processes also form a second air spacer in the second device region by partially removing the fifth dielectric spacer in the second device region. In some embodiments, the one or more etching processes form the first air spacer and the second air spacer to have different vertical dimensions or different lateral dimensions.

In some embodiments, the forming the first device comprises forming the liner that has a greater etching rate than the first dielectric spacer, the second dielectric spacer, and the third dielectric spacer in the one or more etching processes.

In some embodiments, the liner is formed by: depositing a liner layer in both the first device region and the second device region; and removing portions of the liner disposed in the second device region but not portions of the liner disposed in the first device region.

Figure 37:
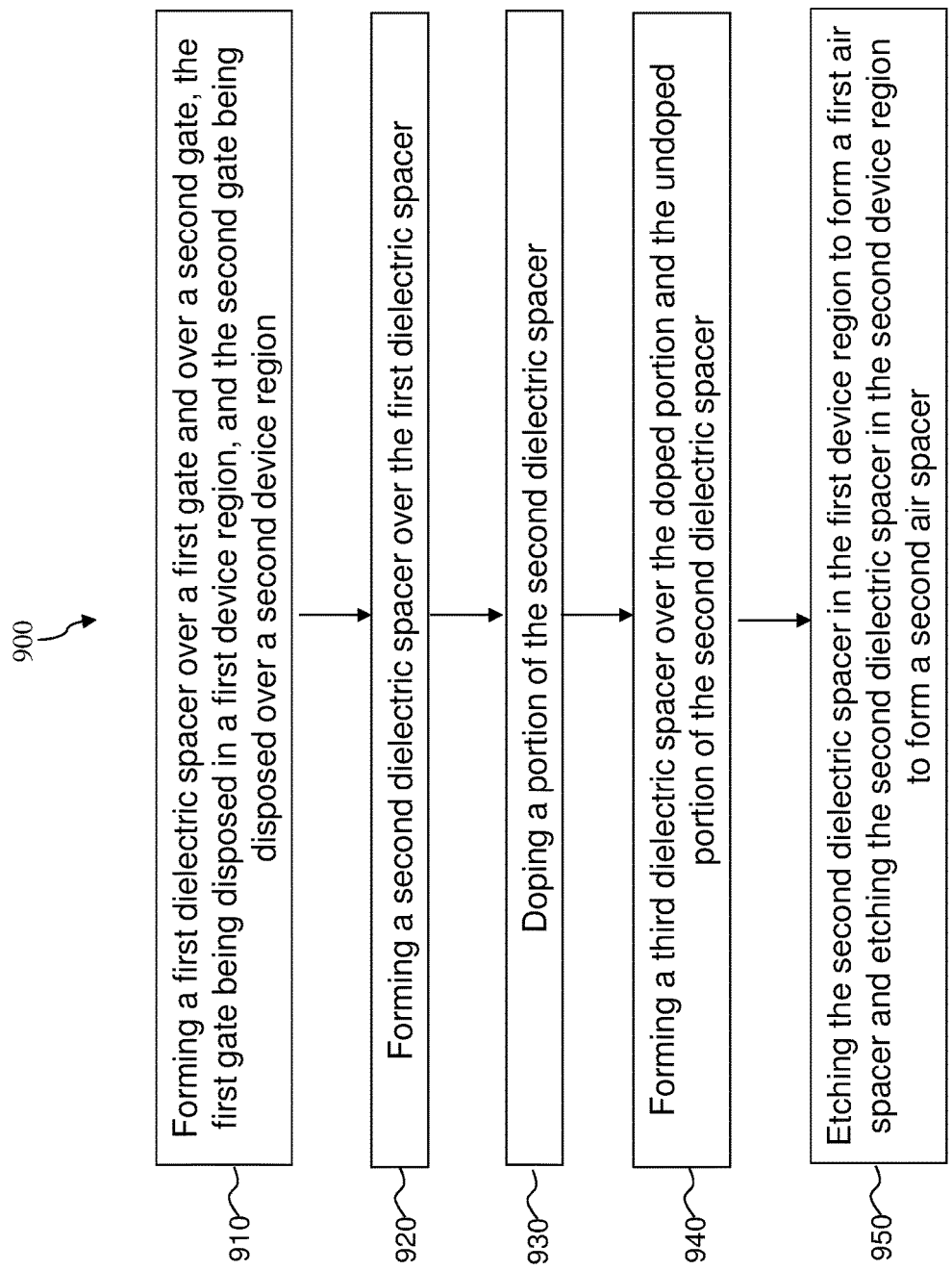
FIG. 37 is a flowchart of another method of fabricating a semiconductor device according to various aspects of the present disclosure.

FIG. 37 is a flowchart illustrating a method 900 of fabricating a semiconductor device according to another embodiment of the present disclosure. The method 900 includes a step 910 of forming a first dielectric spacer over a first gate and over a second gate. The first gate is disposed in a first device region, and the second gate is disposed over a second device region.

The method 900 includes a step 920 of forming a second dielectric spacer over the first dielectric spacer.

The method 900 includes a step 930 of doping a portion of the second dielectric spacer. The doped portion and an undoped portion of the second dielectric spacer have different etching rates.

The method 900 includes a step 940 of forming a third dielectric spacer over the doped portion and the undoped portion of the second dielectric spacer.

The method 900 includes a step 950 of etching the second dielectric spacer in the first device region to form a first air spacer and etching the second dielectric spacer in the second device region to form a second air spacer. The first air spacer and the second air spacer are etched to have different sizes due to the different etching rates between the doped and undoped portion of the second dielectric spacer. In some embodiments, the first air spacer and the second air spacer are formed to have different vertical dimensions.

In some embodiments, the doping the portion of the second dielectric spacer comprises doping a portion of the second dielectric spacer in the first device region. The doped portion of the second dielectric spacer has a greater etching rate than the undoped portion of the second dielectric spacer. In some embodiments, the doping comprises doping the portion of the second dielectric spacer with oxygen or phosphorous as a dopant.

In some other embodiments, the doping the portion of the second dielectric spacer comprises doping a portion of the second dielectric spacer in the second device region. The doped portion of the second dielectric spacer has a lower etching rate than the undoped portion of the second dielectric spacer. In some embodiments, the doping comprises doping the portion of the second dielectric spacer with carbon, nitrogen, boron, or fluorine as a dopant.

In summary, the present disclosure employs various techniques to facilitate the formation of air spacers. For example, in a first embodiment, the present disclosure forms a liner between dielectric gate spacers in a selected first region of a semiconductor structure. The material composition of the liner is configured to have a high etching rate. As such, the liner can be easily removed in an etching process to form air spacers. The removal of the liner also exposes the sidewalls of one of the gate spacers, which allows said gate spacers to be etched away more efficiently in the first region of the semiconductor structure. In a second embodiment, a doping process is performed to selectively treat dielectric gate spacers in a first region (but not a second region) of the semiconductor structure, where the treated dielectric gate spacers need to be removed in order to form air spacers. The doping process accelerates the etching rate of the treated dielectric gate spacer. As such, when etching processes are performed to form air spacers, bigger air spacers can be formed in the first region than in the second region. In a third embodiment, a doping process is performed to selectively treat dielectric gate spacers in a second region (but not a first region) of the semiconductor structure, where the treated dielectric gate spacers need to be removed in order to form air spacers. The doping process retards the etching rate of the treated dielectric gate spacer. As such, when etching processes are performed to form air spacers, bigger air spacers can be formed in the first region than in the second region.

Based on the above discussions, it can be seen that the present disclosure offers advantages over conventional air spacers. However, it is understood that not all advantages are discussed herein, different embodiments may offer different advantages, and that no particular advantage is required for any embodiment. One advantage is that the present disclosure forms air spacers more easily, particularly when a high aspect ratio is desired for the air spacer. Whereas conventional methods of air spacer formation may struggle with respect to the etching needed to form the air spacers, embodiments of the present disclosure facilitates the air spacer etching process by implementing a liner that is easily removable, and the removal of the liner allows the dielectric spacer to be etched not just from the top but also from the side (where the liner used to be). Hence, the air spacer etching process can be performed more effectively and more efficiently. Another advantage is that the present disclosure allows the depth and/or width of the air spacers to be flexibly tuned for different device regions. For example, in embodiments where the liner is implemented, the device region having the liner may end up with an air spacer that is deeper and wider than the device region without the liner. As another example, in embodiments where the doping process is performed to treat the dielectric spacer to be removed, the device region where the dielectric spacer is treated may end up with an air spacer that is deeper or shallower than the other device region where the dielectric spacer is untreated, depending on whether the doping process accelerates or retards the etching rate of the treated dielectric spacer. Regardless, having different and configurable air spacer sizes allows the dielectric values to be optimized for spacers in their respective device regions. Yet another advantage is that the gate structures—particularly ones that are tall and narrow—have reduced risks of collapsing. This may be attributed at least in part to the more efficient air spacer etching, and/or to the fact that even after the air spacers are etched into place, some portions of the dielectric spacer may remain in some regions, which may help hold the gate structure in place. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes a first device and a second device. The first device includes a first gate structure formed over an active region and a first air spacer disposed adjacent to the first gate structure. The second device includes a second gate structure formed over an isolation structure and a second air spacer disposed adjacent to the second gate structure. The first air spacer and the second air spacer have different sizes.

Another aspect of the present disclosure pertains to a method. The method includes forming, in a first device region, a first device that includes: a first gate, a first dielectric spacer, a second dielectric spacer, a third dielectric spacer, and a liner disposed between the first dielectric spacer and the second dielectric spacer or between the second dielectric spacer and the third dielectric spacer. The method also includes forming, in a second device region, a second device that includes: a second gate, a fourth dielectric spacer, a fifth dielectric spacer, and a sixth dielectric spacer. The method further includes performing one or more etching processes to the first device and the second device. The one or more etching processes form a first air spacer in the first device region by removing the liner and the second dielectric spacer. The one or more etching processes form a second air spacer in the second device region by partially removing the fifth dielectric spacer in the second device region.

Yet another aspect of the present disclosure pertains to a method. The method includes forming a first dielectric spacer over a first gate and over a second gate, the first gate being disposed in a first device region, and the second gate being disposed over a second device region. The method includes forming a second dielectric spacer over the first dielectric spacer. The method includes doping a portion of the second dielectric spacer. The doped portion and an undoped portion of the second dielectric spacer have different etching rates. The method includes forming a third dielectric spacer over the doped portion and the undoped portion of the second dielectric spacer. The method includes etching the second dielectric spacer in the first device region to form a first air spacer and etching the second dielectric spacer in the second device region to form a second air spacer. The first air spacer and the second air spacer are etched to have different sizes due to the different etching rates between the doped and undoped portion of the second dielectric spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a first dummy gate structure over a semiconductor region and a second dummy gate structure over a non-semiconductor region, wherein the first dummy gate structure is laterally surrounded by a first set of dielectric spacers and one or more first materials between the first set of dielectric spacers, and wherein the second dummy gate structure is laterally surrounded by a second set of dielectric spacers and one or more second materials between the second set of dielectric spacers;
   replacing the first dummy gate structure with a first metal-containing gate structure and replacing the second dummy gate structure with a second metal-containing gate structure; and
   at least partially removing the one or more first materials and the one or more second materials, thereby forming a first opening between the first set of dielectric spacers and a second opening between the second set of dielectric spacers, wherein the one or more first materials are removed at a faster rate than the one or more second materials.

2. The method of claim 1, wherein the providing the second dummy gate structure comprises forming the second dummy gate structure over a dielectric isolation structure as the non-semiconductor region.

3. The method of claim 1, wherein the first dummy gate structure is a part of a memory device, and wherein the second dummy gate structure is a part of a non-memory device.

4. The method of claim 1, wherein the providing is performed such that:
   the one or more first materials include a first dielectric material and a second dielectric material different from the first dielectric material; and
   the one or more second materials include the first dielectric material but not the second dielectric material.

5. The method of claim 1, wherein:
   the providing is performed such that a first lateral dimension of the one or more first materials is greater than a second lateral dimension of the one or more second materials;
   the first opening substantially inherits the first lateral dimension; and
   the second opening substantially inherits the second lateral dimension.

6. The method of claim 1, wherein the at least partially removing is performed such that a portion of the one or more second materials remain unremoved, such that the second opening has a smaller vertical dimension than the first opening.

7. The method of claim 1, further comprising: forming a capping layer over the first metal-containing gate structure, over the first set of dielectric spacers, over the second metal-containing gate structure, and over the second set of dielectric spacers, wherein portions of the capping layer protrude downwardly into the first opening and into the second opening.

8. The method of claim 1, further comprising: implanting one or more dopant materials into at least a portion of the one or more first materials before the at least partially removing is performed.

9. A method, comprising:
   forming, in a first device region, a first device that includes: a first gate, a first dielectric spacer, a second dielectric spacer, a third dielectric spacer, and a liner disposed between the first dielectric spacer and the second dielectric spacer or between the second dielectric spacer and the third dielectric spacer;
   forming, in a second device region, a second device that includes: a second gate, a fourth dielectric spacer, a fifth dielectric spacer, and a sixth dielectric spacer; and
   performing one or more etching processes to the first device and the second device, wherein the one or more etching processes form a first air spacer in the first device region by removing the liner and the second dielectric spacer, and wherein the one or more etching processes form a second air spacer in the second device region by partially removing the fifth dielectric spacer in the second device region.

10. The method of claim 9, wherein the first device is a functional device, and the second device is a dummy device.

11. The method of claim 10, wherein:
   the first device is formed over an active region; and
   the second device is formed over an electrical isolation region.

12. The method of claim 9, wherein the forming the first device comprises forming the liner that has a greater etching rate than the first dielectric spacer, the second dielectric spacer, and the third dielectric spacer in the one or more etching processes.

13. The method of claim 9, wherein the liner is formed by:
   depositing a liner layer in both the first device region and the second device region; and
   removing portions of the liner layer disposed in the second device region but not portions of the liner layer disposed in the first device region.

14. The method of claim 9, wherein the one or more etching processes form the first air spacer and the second air spacer to have different vertical dimensions or different lateral dimensions.

15. A method, comprising:
   forming a first dielectric spacer along a sidewall of a first gate and along a sidewall of a second gate, the first gate being disposed in a first device region, and the second gate being disposed in a second device region;

forming a second dielectric spacer along a sidewall of the first dielectric spacer;

doping a portion of the second dielectric spacer, wherein the doped portion and an undoped portion of the second dielectric spacer have different etching rates;

forming a third dielectric spacer along sidewalls of the doped portion and the undoped portion of the second dielectric spacer; and etching the second dielectric spacer in the first device region to form a first air spacer and etching the second dielectric spacer in the second device region to form a second air spacer, wherein the first air spacer and the second air spacer are etched to have different sizes due to the different etching rates between the doped portion and the undoped portion of the second dielectric spacer.

16. The method of claim 15, wherein the doping the portion of the second dielectric spacer comprises doping a portion of the second dielectric spacer in the first device region, and wherein the doped portion of the second dielectric spacer has a greater etching rate than the undoped portion of the second dielectric spacer.

17. The method of claim 16, wherein the doping comprises doping the portion of the second dielectric spacer with oxygen or phosphorous as a dopant.

18. The method of claim 15, wherein the doping the portion of the second dielectric spacer comprises doping a portion of the second dielectric spacer in the second device region, and wherein the doped portion of the second dielectric spacer has a lower etching rate than the undoped portion of the second dielectric spacer.

19. The method of claim 18, wherein the doping comprises doping the portion of the second dielectric spacer with carbon, nitrogen, boron, or fluorine as a dopant.

20. The method of claim 15, wherein the first air spacer and the second air spacer are formed to have different vertical dimensions.

* * * * *